US008039896B2

(12) United States Patent
Seo et al.

(10) Patent No.: US 8,039,896 B2
(45) Date of Patent: Oct. 18, 2011

(54) SEMICONDUCTOR MEMORY DEVICE WITH VERTICAL CHANNEL FORMED ON SEMICONDUCTOR PILLARS

(75) Inventors: Hyeoung-won Seo, Yongin-si (KR); Jae-man Yoon, Seoul (KR); Kang-yoon Lee, Seongnam-si (KR); Dong-gun Park, Seongnam-si (KR); Bong-soo Kim, Seongnam-si (KR); Seong-goo Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 280 days.

(21) Appl. No.: 12/118,268

(22) Filed: May 9, 2008

(65) Prior Publication Data

US 2008/0211013 A1 Sep. 4, 2008

Related U.S. Application Data

(62) Division of application No. 11/546,581, filed on Oct. 11, 2006, now Pat. No. 7,387,931.

(30) Foreign Application Priority Data

Oct. 14, 2005 (KR) .................. 10-2005-0096956

(51) Int. Cl.
*H01L 29/66* (2006.01)
(52) U.S. Cl. ......... 257/331; 257/E21.655; 257/E21.657; 257/E21.659
(58) Field of Classification Search .................. 257/331
See application file for complete search history.

(56) References Cited

U.S. PATENT DOCUMENTS 5,828,094 A * 10/1998 Lee ........................ 257/296
(Continued)

FOREIGN PATENT DOCUMENTS

KR 100147584 B1 5/1998
(Continued)

*Primary Examiner* — Wael Fahmy
*Assistant Examiner* — Abul Kalam
(74) *Attorney, Agent, or Firm* — Onello & Mello LLP

(57) ABSTRACT

In a semiconductor memory device having a vertical channel transistor a body of which is connected to a substrate and a method of fabricating the same, the semiconductor memory device includes a semiconductor substrate including a plurality of pillars arranged spaced apart from one another, and each of the pillars includes a body portion and a pair of pillar portions extending from the body portion and spaced apart from each other. A gate electrode is formed to surround each of the pillar portions. A bitline is disposed on the body portion to penetrate a region between a pair of the pillar portions of each of the first pillars arranged to extend in a first direction. A wordline is disposed over the bitline, arranged to extend in a second direction intersecting the first direction, and configured to contact the side surface of the gate electrode. A first doped region is formed in the upper surface of each of the pillar portions of the pillar. A second doped region is formed on the body portion of the pillar and connected electrically to the bitline. Storage node electrodes are connected electrically to the first doped region and disposed on each of the pillar portions.

23 Claims, 52 Drawing Sheets

U.S. PATENT DOCUMENTS

| | | | |
|---|---|---|---|
| 5,885,864 A * | 3/1999 | Ma | 438/253 |
| 5,929,477 A | 7/1999 | McAllister Burns, Jr. et al. | |
| 5,990,509 A * | 11/1999 | Burns et al. | 257/296 |
| 6,034,389 A | 3/2000 | Burns, Jr. et al. | |
| 6,077,745 A | 6/2000 | Burns, Jr. et al. | |
| 6,114,725 A | 9/2000 | Furukawa et al. | |
| 6,137,128 A | 10/2000 | Holmes et al. | |
| 6,204,112 B1 | 3/2001 | Chakravarti et al. | |
| 6,218,236 B1 | 4/2001 | Economikos et al. | |
| 6,440,801 B1 | 8/2002 | Furukawa et al. | |
| 7,368,352 B2 * | 5/2008 | Kim et al. | 438/268 |
| 7,482,229 B2 * | 1/2009 | Juengling | 438/268 |
| 7,531,412 B2 * | 5/2009 | Yoon et al. | 438/270 |
| 2004/0041188 A1 * | 3/2004 | Bissey et al. | 257/297 |
| 2007/0145450 A1 * | 6/2007 | Wang et al. | 257/296 |

FOREIGN PATENT DOCUMENTS

| | | |
|---|---|---|
| KR | 10-2004-0008423 A | 1/2004 |

* cited by examiner

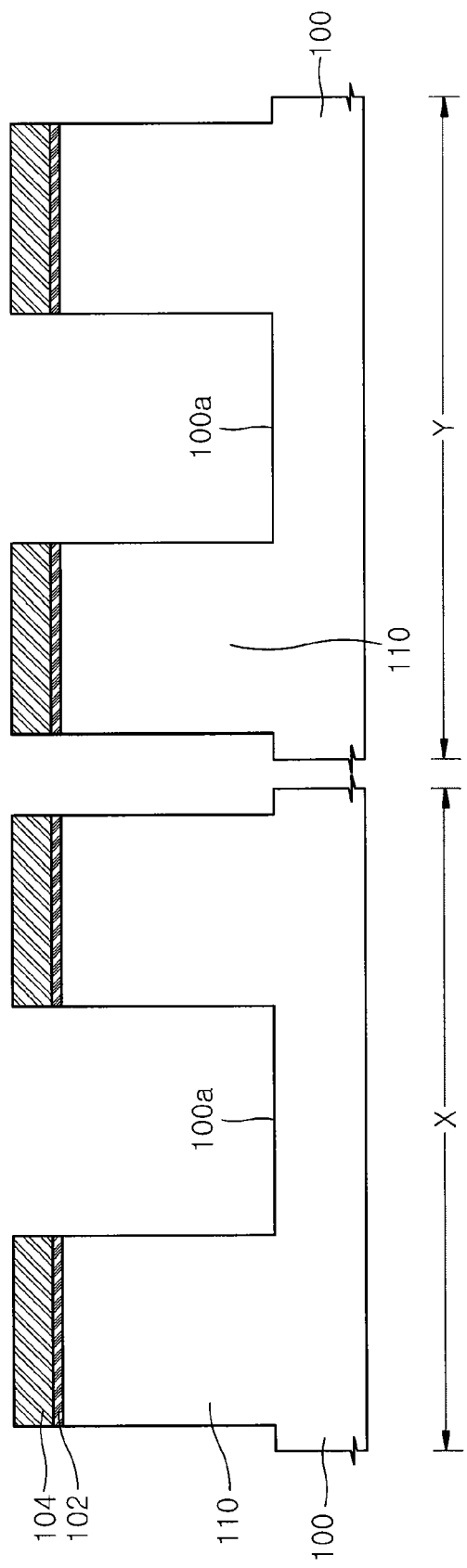

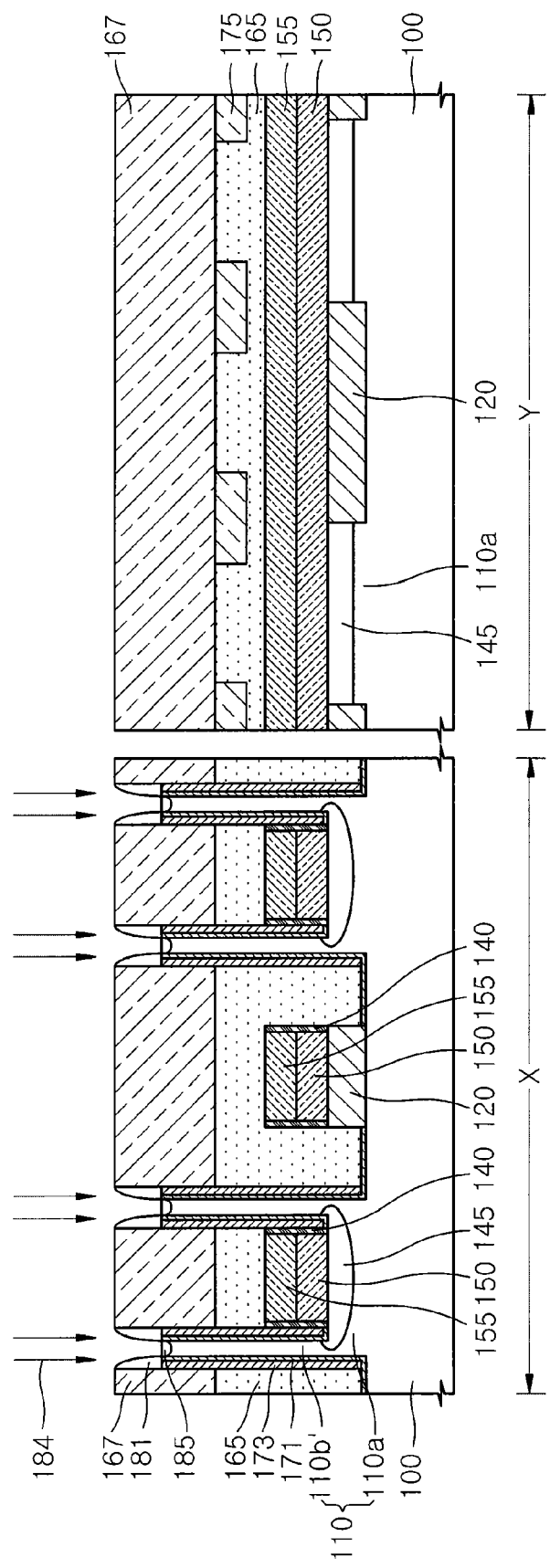

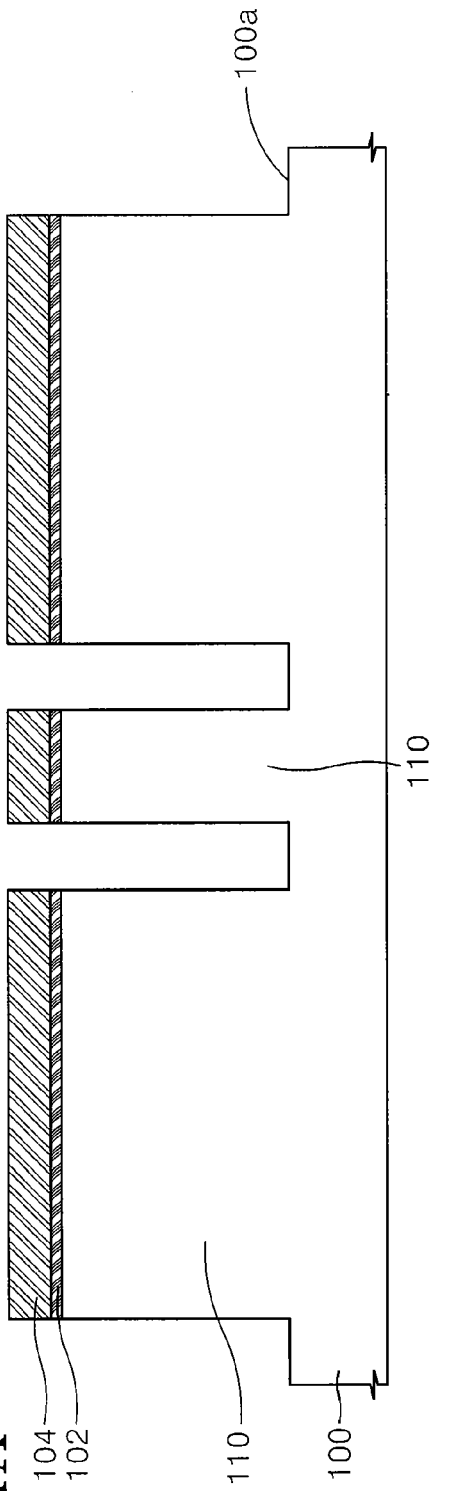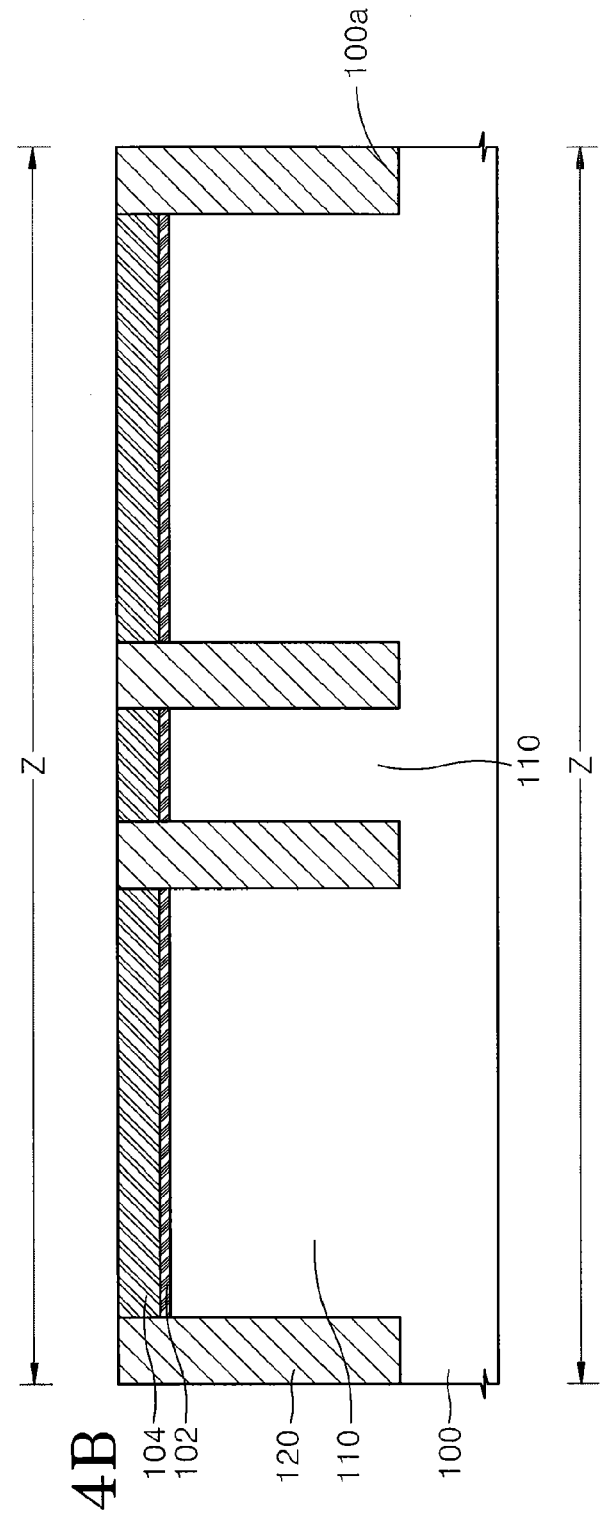

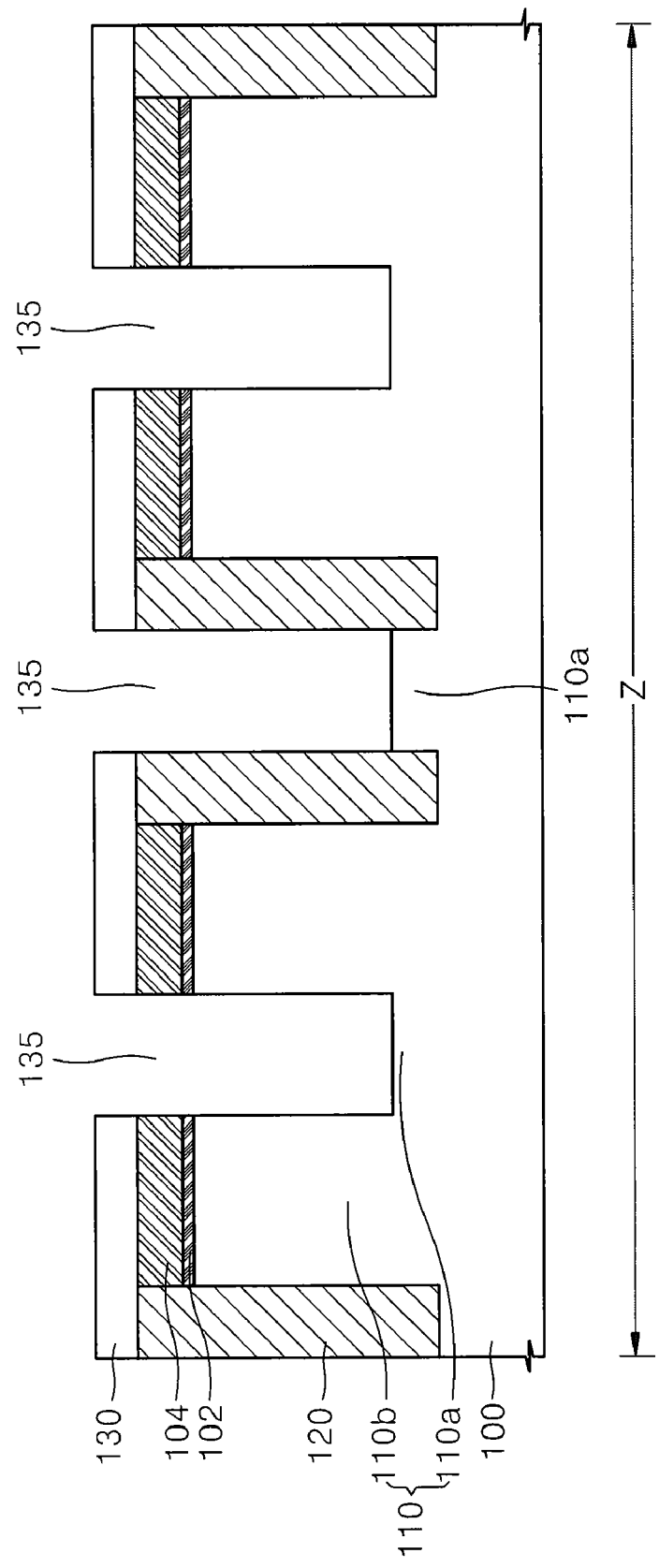

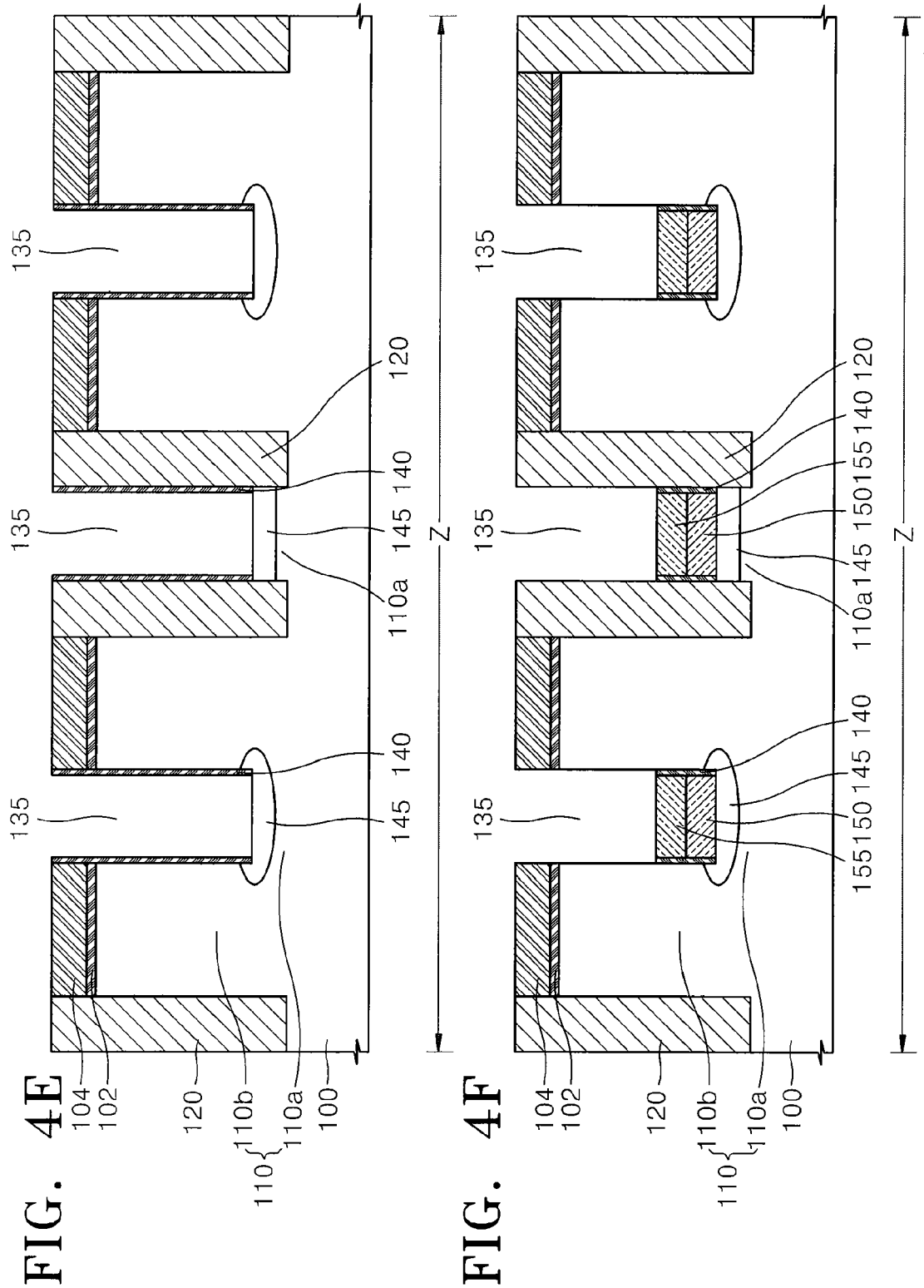

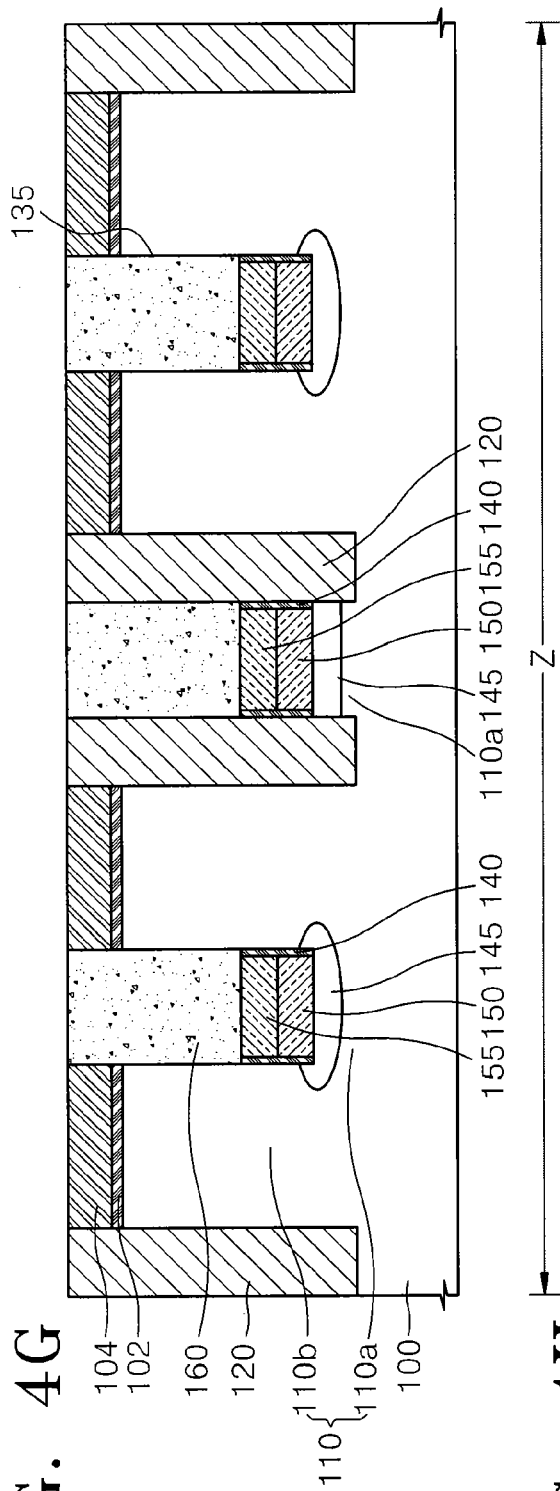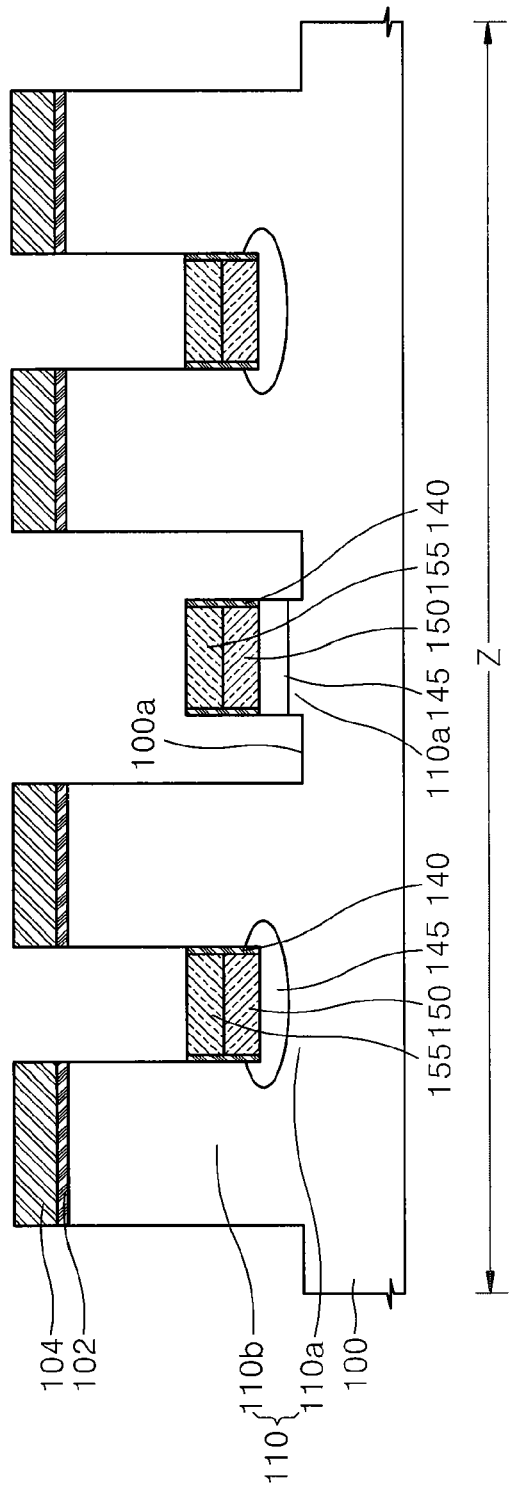

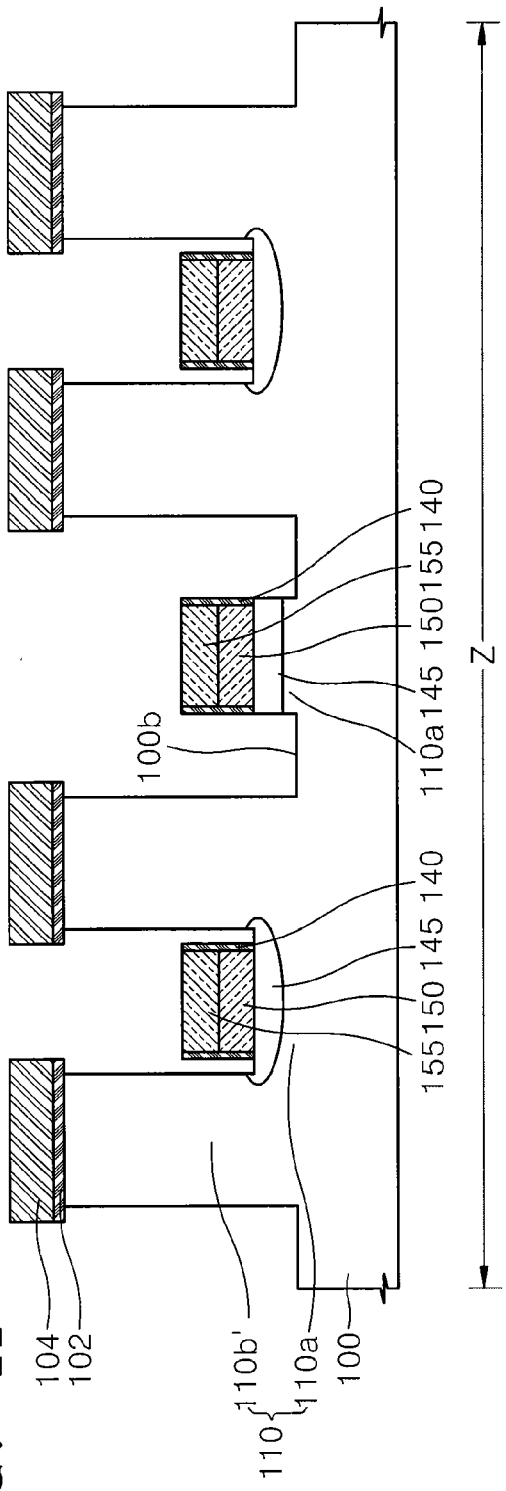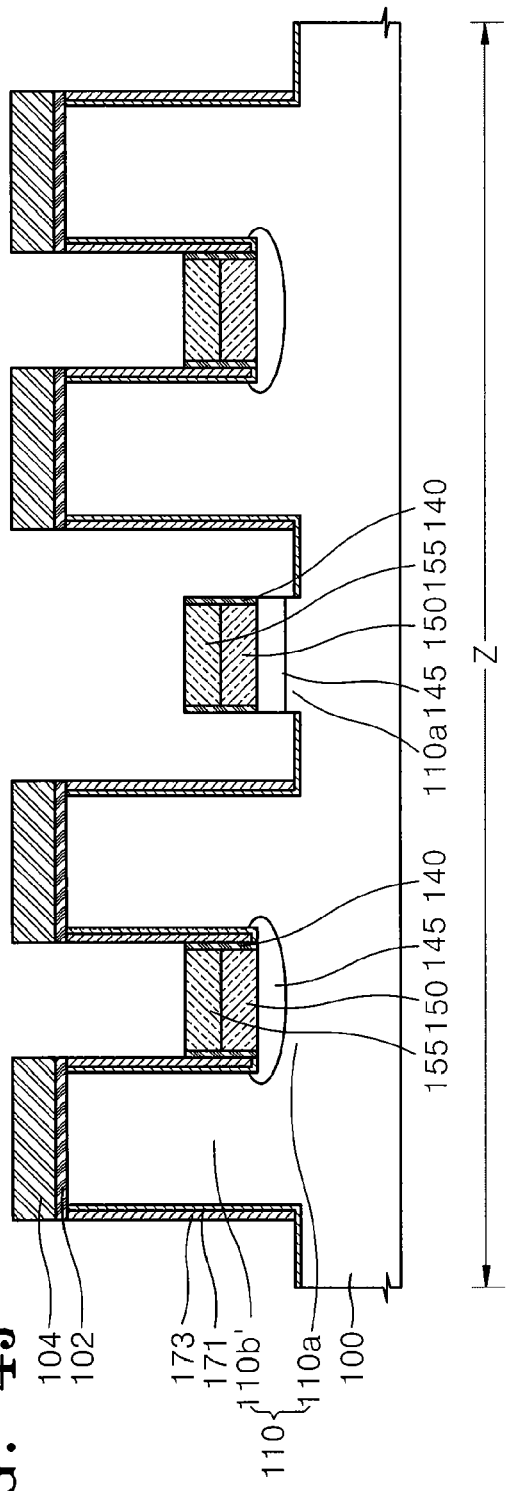

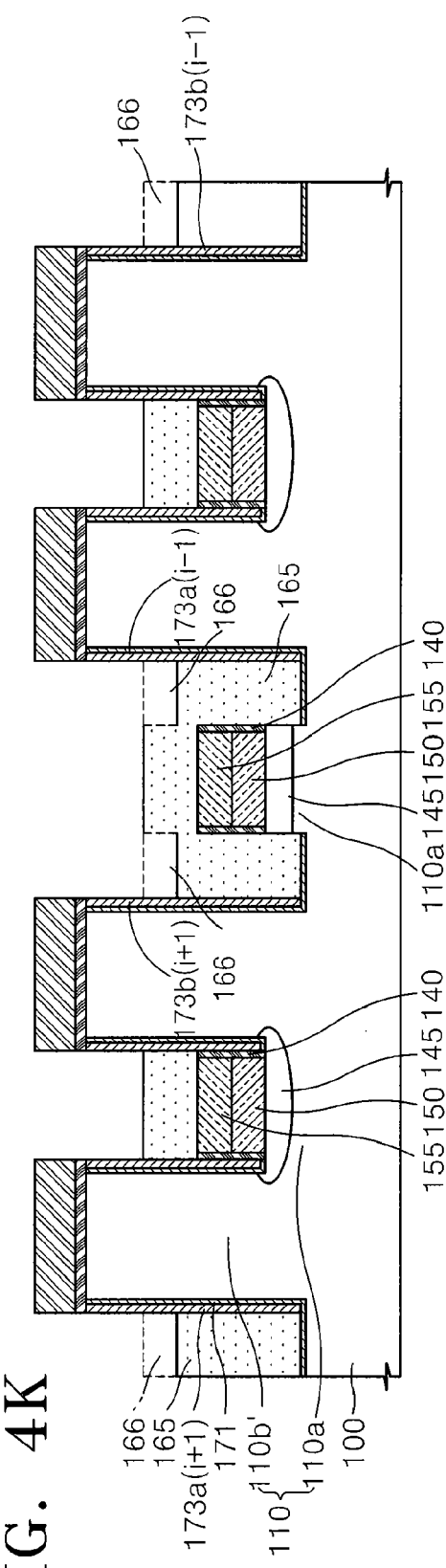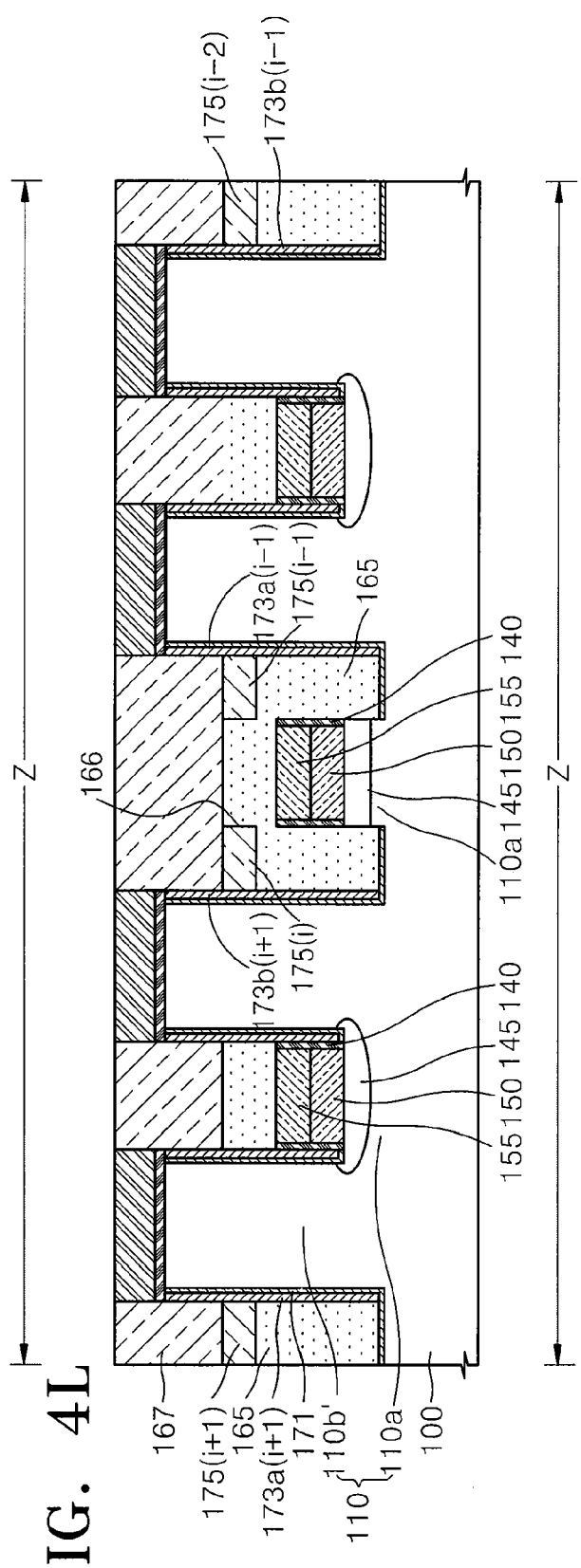

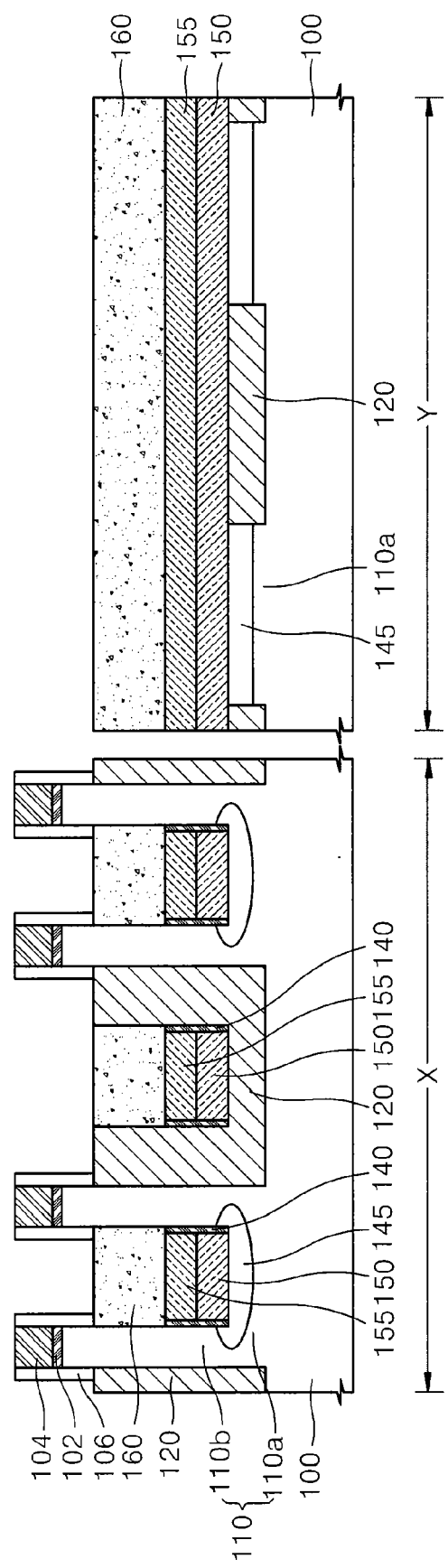

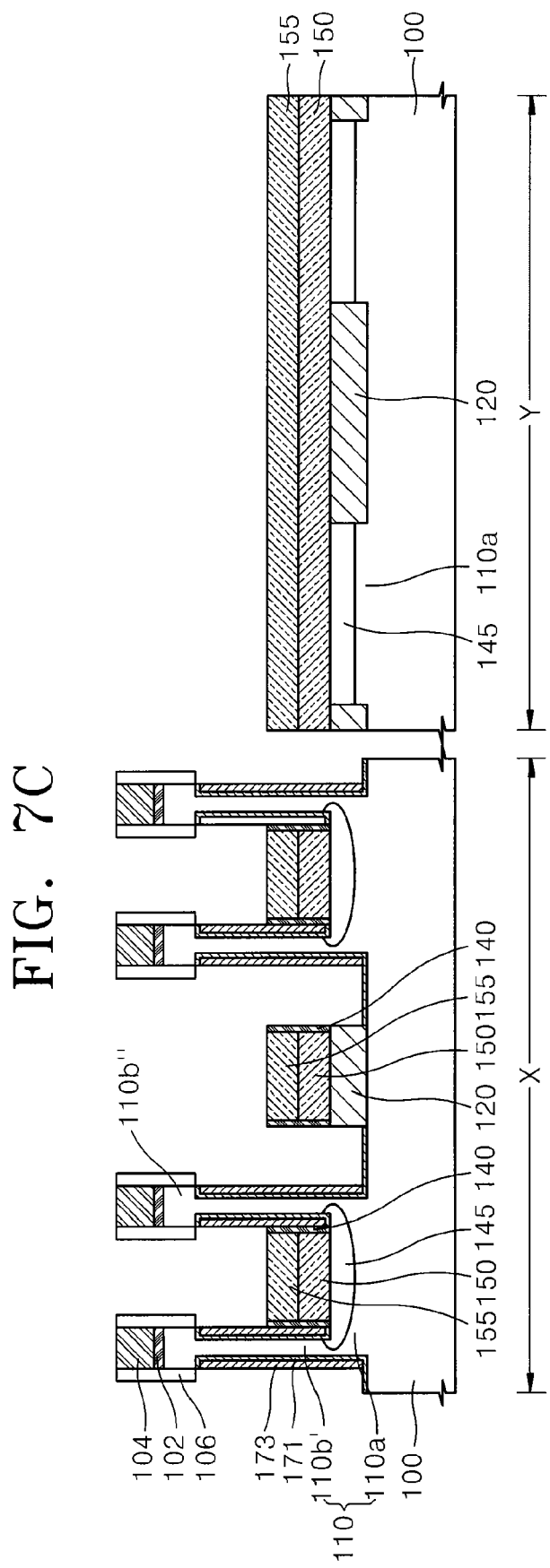

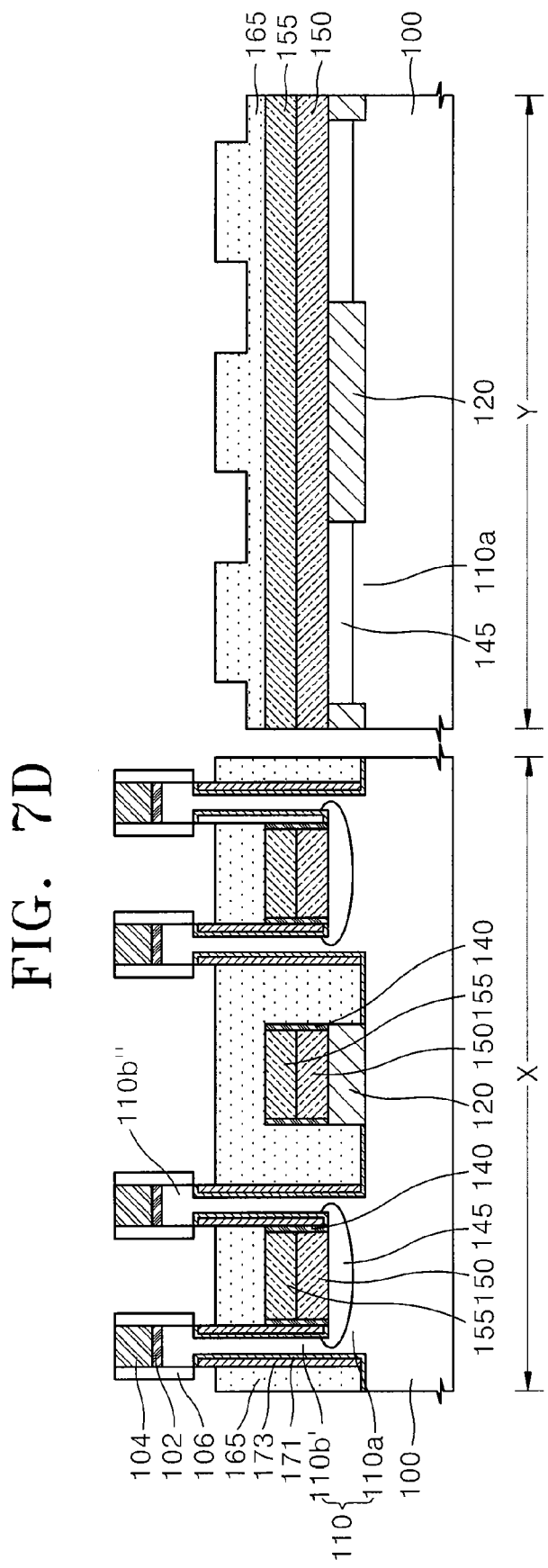

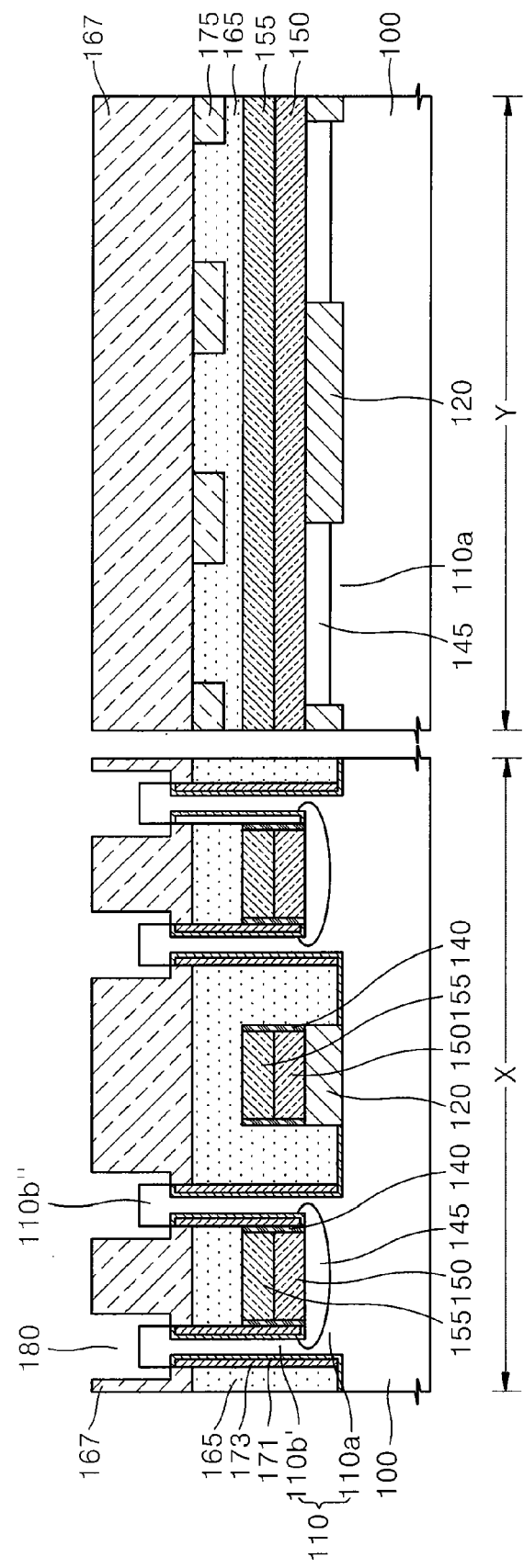

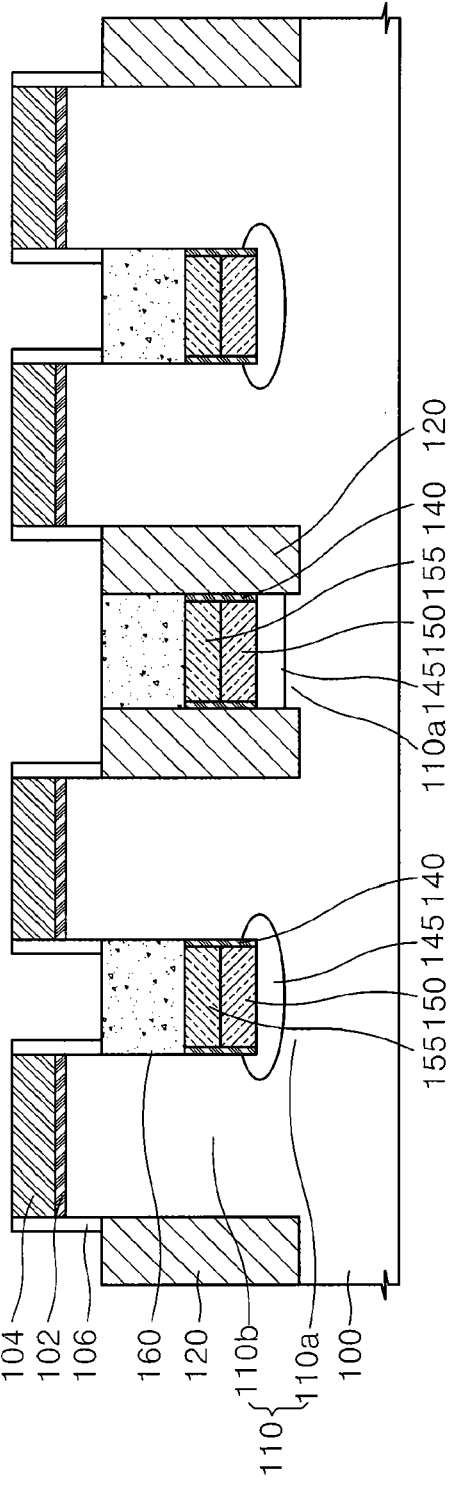
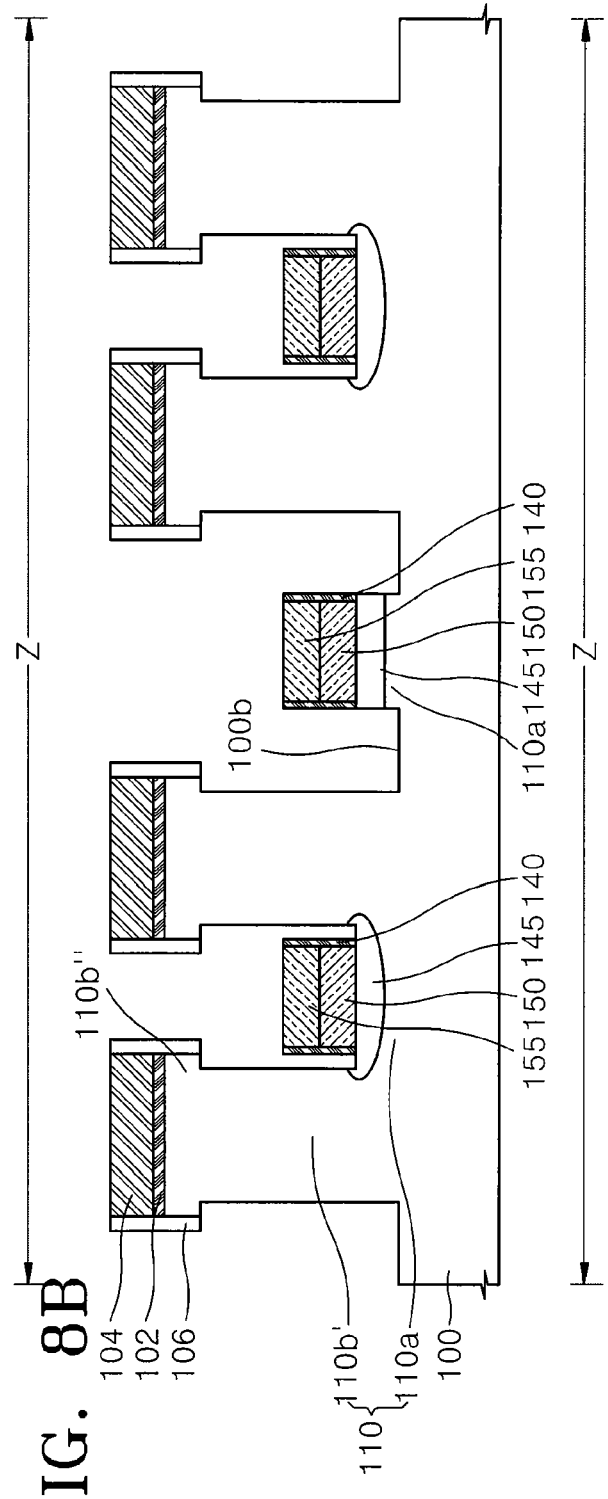

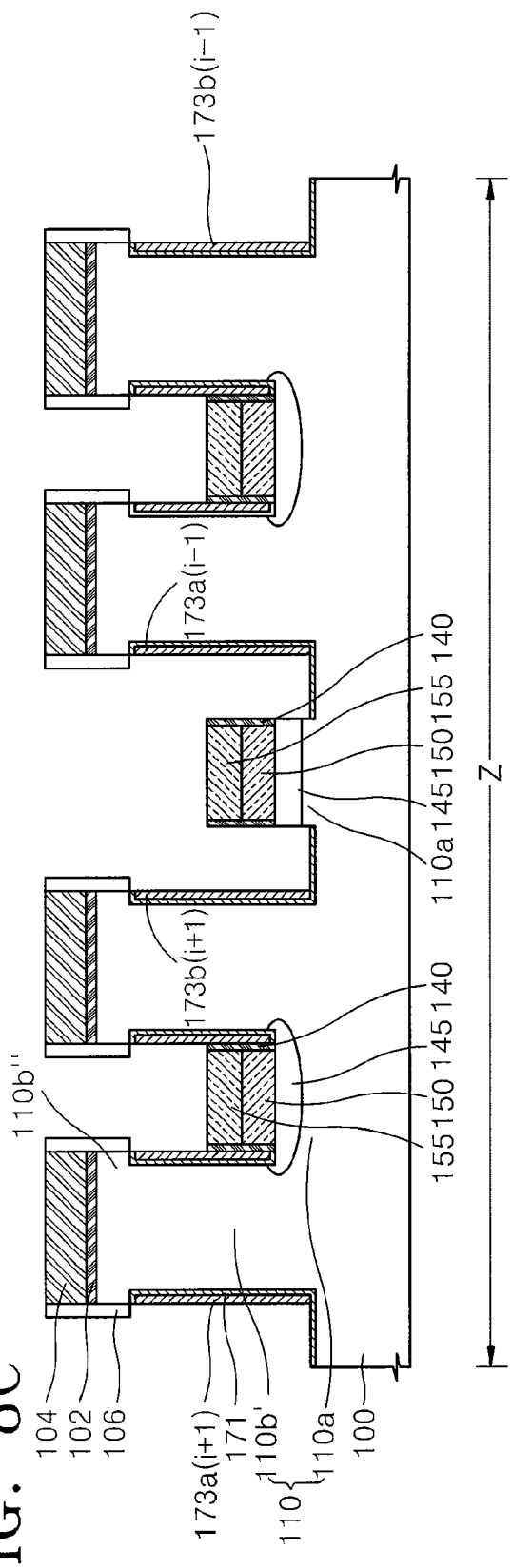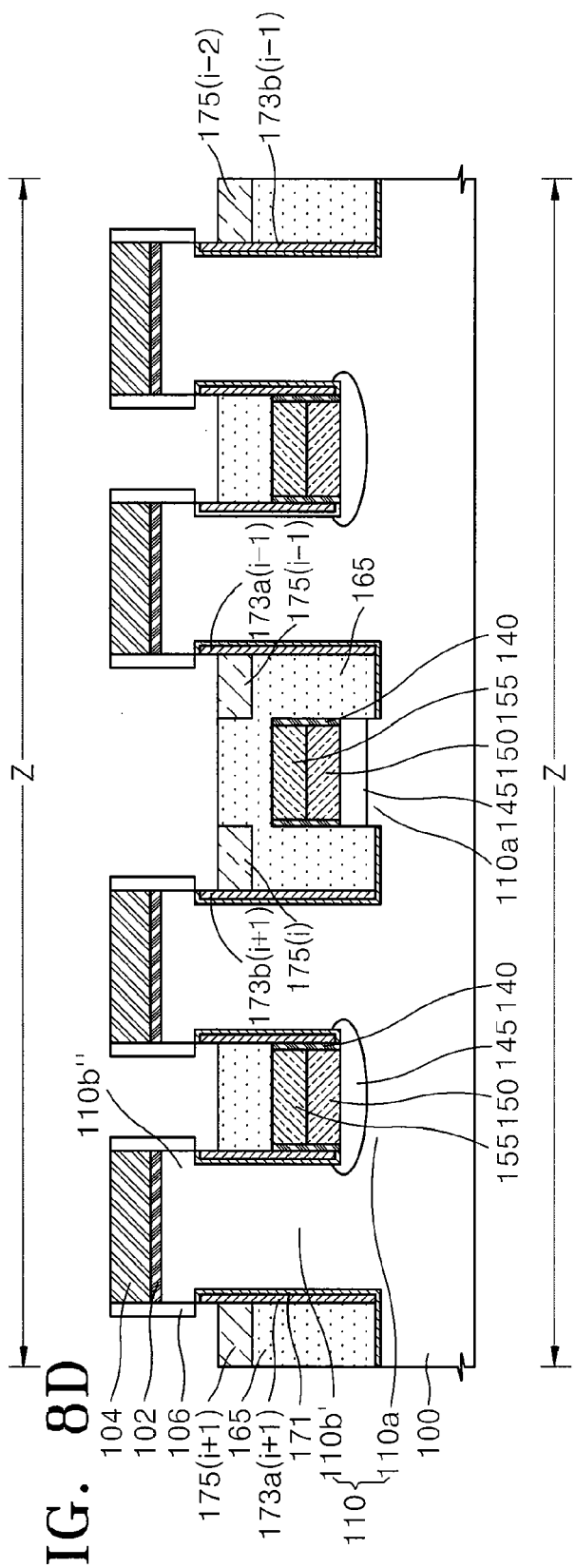

SEMICONDUCTOR MEMORY DEVICE WITH VERTICAL CHANNEL FORMED ON SEMICONDUCTOR PILLARS

CROSS-REFERENCE TO RELATED PATENT APPLICATION

This application is a divisional of U.S. application Ser. No. 11/546,581, filed on Oct. 11, 2006, which relies for priority upon Korean Patent Application No. 10-2005-0096956, filed on Oct. 14, 2005, in the Korean Intellectual Property Office, the contents of which are incorporated herein by reference in their entirety.

BACKGROUND OF THE INVENTION

1. Field of the Invention

The present invention relates to a semiconductor memory device, and more particularly, to a semiconductor memory device with a vertical channel transistor, a body of which is connected to a substrate, and a method of fabricating the same.

2. Description of the Related Art

With the constant demand for ever-higher integration in semiconductor devices, the design rule must be continually decreased. When the design rule decreases, the length and width of the channel region of semiconductor devices also necessarily decrease. As a result, the current driving capability of a device degrades and the active switching characteristic of a device degenerates due to the short channel effect. There has been proposed a vertical channel transistor that has high current driving capability and relatively small leakage current caused by drain induced barrier lowering (DIBL) and punch-through effects. Such a vertical channel transistor has a floating-body type structure. Therefore, in the case of DRAMs based on vertical channel transistor technology, holes created by a gate-induced-drain-leakage (GIDL) current are accumulated in the floating body. The accumulated holes increase the electric potential in the floating body. This causes the abnormal operation of the device, resulting in degradation of the data retention capability of the device.

SUMMARY OF THE INVENTION

The present invention provides a semiconductor memory device with a vertical channel transistor, the body of which is connected to a substrate and a method of fabricating the same.

In one aspect, the present invention is directed to a semiconductor memory device comprising: a semiconductor substrate including a plurality of pillars arranged to be spaced apart from one another, each of the pillars including a body portion and a pair of pillar portions extending from the body portion and spaced apart from each other; a gate electrode surrounding each of the pillar portions; a bitline disposed on the body portion to penetrate a region between a pair of the pillar portions of each of the first pillars arranged to extend in a first direction; a wordline disposed over the bitline, arranged to extend in a second direction intersecting the first direction, and configured to contact the side surface of the gate electrode; a first doped region in the upper surface of each of the pillar portions of the pillar; a second doped region in the body portion of the pillar and connected electrically to the bitline; and storage node electrodes connected electrically to the first doped region and disposed on each of the pillar portions.

In one embodiment, the bitline is connected electrically to the second doped region.

In another embodiment, the semiconductor memory device further comprises a gate dielectric layer between the gate electrode and the pillars.

In another embodiment, the first pillars arranged along a first line of the first or second direction are elongated in an upward-diagonal direction, second pillars arranged along a second line neighboring the first line are elongated in a downward-diagonal direction, and the second pillars are perpendicular to the first pillars.

In another embodiment, the gate electrode comprises: a first portion adjacent to the bitline penetrating a pair of the pillar portions; and a second portion opposite the first portion. The second portion is longer than the first portion in a direction of extension of the pillar.

In another embodiment, the second portion is longer than the first portion by up to a height of the body portion.

In another embodiment, the semiconductor memory device further comprises a contact plug disposed between the storage node electrode and the first doped region.

In another embodiment, the gate electrode formed at one of a pair of the pillar portions of the first pillars arranged along the first line of the first direction and the gate electrode formed at one of a pair of the pillar portions of the second pillars arranged along the second line of the first direction are alternately connected to the wordline.

In another embodiment, the wordline is spaced apart from the upper surface of the pillar portion by a predetermined distance to prevent an electrical short with the storage node electrode.

In another embodiment, the semiconductor memory device further comprises: a first insulating layer on the semiconductor substrate to fill a space between the pillars; a second insulating layer on the first insulating layer to insulate the wordline from the bitline, the second insulating layer including a trench extending in the first direction; and a third insulating layer on the wordline and the second insulating layer. The wordline is formed in the trench of the second insulating layer.

In another embodiment, the semiconductor memory device further comprises: a bitline capping layer on the bitline; and a bitline spacer on the sidewalls of the bitline and the bitline capping layer to electrically separate the gate electrode from the bitline.

In another embodiment, a portion of the pillar portion where the first doped region is formed, protrudes in a horizontal direction and thus each of the pillar portions of the pillar has a T-shaped cross-section.

In another aspect, the present invention is directed to a semiconductor memory device comprising: a semiconductor substrate including a plurality of pillars arranged to be spaced apart from one another, each of the pillars including a body portion and a pair of pillar portions extending from the body portion and spaced apart from each other; a pair of memory cells formed at the pillar portions of each of the pillars, each of memory cells including: a gate electrode surrounding each of the pillar portions; a first doped region in the upper surface of each of the pillar portions of the pillar; a second doped region in the body portion of the pillar; and a storage node electrode connected electrically to the first doped region and disposed on each of the pillar portions; a plurality of bitlines arranged on the body portion to penetrate a region between a pair of the pillar portions of each of pillars arranged to extend in a first direction; and a plurality of wordlines arranged to extend over the bitlines in a second direction intersecting the first direction, and configured to contact the side surface of the gate electrode.

In one embodiment, the bitline is connected electrically to the second doped region.

In another embodiment, the semiconductor memory device further comprises a gate dielectric layer between the gate electrode and the pillars.

In another embodiment, the first pillars arranged along a first line of the first or second direction are elongated in an upward-diagonal direction, second pillars arranged along a second line neighboring the first line are elongated in a downward-diagonal direction, and the second pillars are perpendicular to the first pillars.

In another embodiment, the gate electrode comprises: a first portion adjacent to the bitline penetrating a pair of the pillar portions; and a second portion opposite the first portion. The second portion is longer than the first portion in a direction of extension of the pillar.

In another embodiment, the second portion is longer than the first portion by up to a height of the body portion.

In another embodiment, the wordline is spaced apart from the upper surface of the pillar portion by a predetermined distance to prevent an electrical short with the storage node electrode.

In another embodiment, the semiconductor memory device further comprises a contact plug disposed between the storage node electrode and the first doped region.

In another embodiment, the gate electrodes of a pair of the memory cells are connected to different wordlines.

In another embodiment, the gate electrode formed at one of a pair of the pillar portions of the first pillars arranged in the first line of the first direction and the gate electrode formed at one of a pair of the pillar portions of the second pillars arranged in the second line of the first direction are alternately connected to the wordline.

In another embodiment, the second doped region functions as a common drain region or a common source region of a pair of the memory cells, and the bitline electrically contacts the second doped region to function as a common bitline of a pair of the memory cells.

In another embodiment, the portion of the pillar portion where the first doped region is formed, protrudes in a horizontal direction and thus each of the pillar portions of the pillar has a T-shaped cross-section.

In another aspect, the present invention is directed to a method of fabricating a semiconductor memory device comprising: forming a pad oxide layer and hard mask patterns arranged to be spaced apart from each other on a semiconductor substrate; forming a plurality of pillars arranged to be spaced apart from one another by etching the pad oxide layer and the semiconductor substrate to a first etching depth using the hard mask patterns; forming a first insulating layer on the semiconductor substrate to fill a space between the pillars; etching the pillars and the first insulating layer to a second etching depth that is less than the first etching depth, to form trenches extending in a first direction such that each of the pillars has a body portion and a pair of pillar portions spaced apart from each other by the trench; forming a first doped region in the body portion; forming a bitline disposed on the body portion in the trench, the bitline electrically contacting the first doped region and penetrating a space between a pair of the pillar portions of the pillars arranged along the same line of the first direction; exposing the side surface of the pillar portion; forming a gate dielectric layer surrounding the exposed side surface of the pillar portion and forming a gate electrode surrounding the gate dielectric layer; forming a second insulating layer covering the bitline on the semiconductor between the pillars; forming a wordline electrically contacting the side surface of the gate electrode and extending in a second direction intersecting the first direction; forming a third insulating layer on the wordline and the second insulating layer; removing the hard mask patterns and the pad oxide layer to expose the upper surface of the pillar portion of the pillar; forming a second doped region on the exposed upper surface of the pillar portion; and forming a storage node electrode electrically contacting the second doped region.

In one embodiment, the etching of the pillars and the first insulating layer comprises: forming, on the hard mask patterns and the first insulating layer, mask patterns exposing a portion where the bitline is to be formed; and etching the first insulating layer, the pillars and the hard mask patterns of the exposed portion to form the trenches.

In another embodiment, the mask patterns include photoresist patterns or stacked patterns of a photoresist layer and a hard mask layer.

In another embodiment, the forming of the bitline comprises: forming a bitline spacer on the sidewalls of the trench; forming the bitline in the trench; and forming a bitline capping layer on the bitline in the trench.

In another embodiment, the exposing of the side surface of the pillar portion comprises: fill the trench with a fourth insulating layer; removing the first insulating layer and the fourth insulating layer; and etching the side surface of the pillar portion such that the upper surface of the pillar portion is spaced apart from an edge of the hard mask pattern by a predetermined distance.

In another embodiment, the method further comprises performing a cleaning process for improving interface characteristics between the gate electrode and the wordline after the forming of the gate electrode.

In another embodiment, the forming of the second insulating layer comprises: depositing a second insulating layer filling a space between the pillars on the semiconductor substrate; performing a first etching process on the second insulating layer such that the upper surface of the second insulating layer is spaced apart from the upper surface of the pillar portion by a predetermined distance; and performing a second etching process on the second insulating layer to form a wordline trench at a portion where the wordline is to be formed.

In another embodiment, the forming of the wordline comprises: depositing a conductive layer filling the wordline trench on the second insulating layer; and etching the conductive layer to form the wordline in the wordline trench such that the wordline is spaced apart from the upper surface of the pillar portion.

In another embodiment, the forming of the storage node electrode comprises: forming a spacer on the side surface of the third insulating layer exposed by the removal of the hard mask pattern and the pad oxide layer; forming a contact plug electrically contacting the second doped region; and forming a storage node electrode electrically contacting the contact plug.

In another embodiment, the first pillars arranged in a first line of the first or second direction are elongated in an upward-diagonal direction, second pillars arranged in a second line neighboring the first line are elongated in a downward-diagonal direction, and the second pillars are perpendicular to the first pillars.

In another embodiment, the gate electrode comprises: a first portion adjacent to the bitline penetrating a pair of the pillar portions; and a second portion opposite to the first portion. The second portion is longer than the first portion in a direction of extension of the pillar.

In another embodiment, the second portion is longer than the first portion by up to a height of the body portion, and the height of the body portion corresponds to a difference between the first etching depth and the second etching depth.

In another embodiment, the gate electrode formed at one of a pair of the pillar portions of the first pillars arranged along the first line of the first direction and the gate electrode formed at one of a pair of the pillar portions of the second pillars arranged along the second line of the first direction are alternately connected to the wordline.

In another aspect, the present invention is directed to a method of fabricating a semiconductor memory device comprising: forming a pad oxide layer and hard mask patterns arranged to be spaced apart from each other on a semiconductor substrate; forming a plurality of pillars arranged to be spaced apart from one another by etching the pad oxide layer and the semiconductor substrate to a first etching depth using the hard mask patterns; forming a first insulating layer on the semiconductor substrate to fill a space between the pillars; etching the pillars and the first insulating layer to a second etching depth that is less than the first etching depth, to form trenches extending in a first direction such that each of the pillars has a body portion and a pair of pillar portions spaced apart from each other by the trench; forming a first doped region in the body portion; forming a bitline disposed on the body portion in the trench, the bitline electrically contacting the first doped region and penetrating a space between a pair of the pillar portions of the pillars arranged along the same line of the first direction; filling the trenches with a second insulating layer; etching the first insulating layer and the second insulating layer to a predetermined thickness to expose an upper portion of the side surface of the pillar portion and the hard mask pattern; forming a first spacer on the exposed side surface of the upper portion of the pillar portion and the hard mask pattern; removing the first insulating layer and the second insulating layer; etching the side surface of the pillar portion using the first spacer such that the pillar portion has a T shaped cross-section; forming a gate dielectric layer surrounding the etched side surface of the pillar portion and forming a gate electrode surrounding the gate dielectric layer; forming a third insulating layer covering the bitline on the semiconductor between the pillars; forming a wordline contacting the side surface of the gate electrode and extending in a second direction intersecting the first direction; forming a fourth insulating layer on the wordline and the third insulating layer; removing the hard mask patterns, the pad oxide layer and the first spacer to expose the upper surface of the pillar portion of the pillar; forming a second doped region on the exposed upper surface of the pillar portion; and forming a storage node electrode electrically contacting the second doped region.

In one embodiment, the etching of the pillars and the first insulating layer comprises: forming, on the hard mask patterns and the first insulating layer, mask patterns exposing a portion where the bitline is to be formed; and etching the first insulating layer, the pillars and the hard mask patterns of the exposed portion to form the trenches.

In another embodiment, the mask patterns include photoresist patterns or stacked patterns of a photoresist layer and a hard mask layer.

In another embodiment, the forming of the bitline comprises: forming a bitline spacer on the sidewalls of the trench; forming the bitline in the trench; and forming a bitline capping layer on the bitline in the trench.

In another embodiment, the method further comprises performing a cleaning process for improving interface characteristics between the gate electrode and the wordline after the forming of the gate electrode.

In another embodiment, the forming of the third insulating layer comprises: depositing the third insulating layer filling a space between the pillars on the semiconductor substrate; performing a first etching process on the third insulating layer such that the upper surface of the third insulating layer is spaced apart from the upper surface of the pillar portion by a predetermined distance; and performing a second etching process on the third insulating layer to form a wordline trench at a portion where the wordline is to be formed.

In another embodiment, the forming of the wordline comprises: depositing a conductive layer filling the wordline trench on the third insulating layer; and etching the conductive layer to form the wordline in the wordline trench such that the wordline is spaced apart from the upper surface of the pillar portion.

In another embodiment, the forming of the storage node electrode comprises: forming a second spacer on the side surface of the fourth insulating layer from which the first spacer is removed; forming a contact plug electrically contacting the second doped region; and forming a storage node electrode electrically contacting the contact plug.

In another embodiment, the first pillars arranged in a first line of the first or second direction are elongated in an upward-diagonal direction, second pillars arranged in a second line neighboring the first line are elongated in a downward-diagonal direction, and the second pillars are perpendicular to the first pillars.

In another embodiment, the forming the gate electrode comprises: a first portion adjacent to the bitline penetrating a pair of the pillar portions; and a second portion opposite to the first portion, wherein the second portion is longer than the first portion in a direction of extension of the pillar.

In another embodiment, the second portion is longer than the first portion by up to a height of the body portion, and the height of the body portion corresponds to a difference between the first etching depth and the second etching depth.

In another embodiment, the gate electrode formed at one of a pair of the pillar portions of the first pillars arranged along the first line of the first direction and the gate electrode formed at one of a pair of the pillar portions of second pillars arranged along a second line of the first direction are alternately connected to the wordline.

In another embodiment, the first spacer has no etch selectivity with respect to the hard mask pattern and has an etch selectivity with respect to the first insulating layer and the third insulating layer.

In another aspect, the present invention is directed to a method of fabricating a semiconductor memory device comprising: providing a semiconductor substrate including a plurality of pillars arranged to be spaced apart from one another, each of the pillars including a body portion and a pair of pillar portions extended from the body portion and spaced apart from each other; forming a gate electrode surrounding each of the pillar portions; forming a bitline on the body portion to penetrate a region between a pair of the pillar portions of each of the first pillars arranged to extend in a first direction; forming a wordline over the bitline, arranged to extend in a second direction intersecting the first direction, and configured to contact the side surface of the gate electrode; forming a first doped region in the upper surface of each of the pillar portions of the pillar; forming a second doped region in the body portion of the pillar and connected electrically to the bitline; and forming storage node electrodes connected electrically to the first doped region and disposed on each of the pillar portions.

In one embodiment, the bitline is connected electrically to the second doped region.

In another embodiment, the method further comprises forming a gate dielectric layer between the gate electrode and the pillars.

BRIEF DESCRIPTION OF THE DRAWINGS

The above and other features and advantages of the present invention will become more apparent by describing in detail exemplary embodiments thereof with reference to the attached drawings in which:

FIGS. 7A through 7G are sectional views taken along section lines X-X and Y-Y of FIGS. 6A through 6C;

FIGS. 8A through 8G are sectional views taken along a section line Z-Z of FIGS. 6A through 6C.

DETAILED DESCRIPTION OF EMBODIMENTS OF THE INVENTION

Figure 1A:
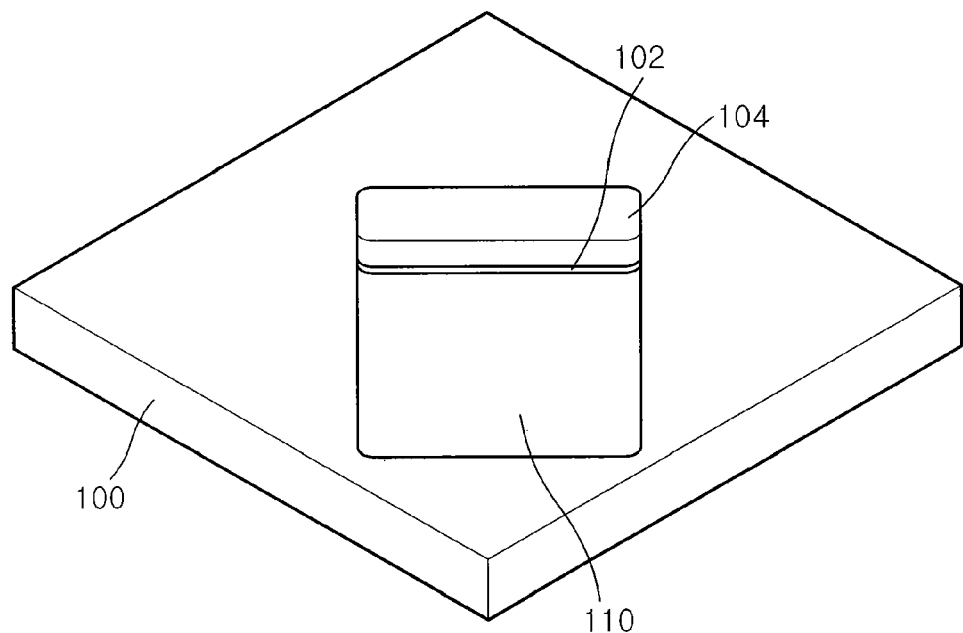
FIGS. 1A through 1G are perspective views illustrating a method of fabricating a semiconductor memory device with a vertical channel transistor according to an embodiment of the present invention.
Figure 1B:
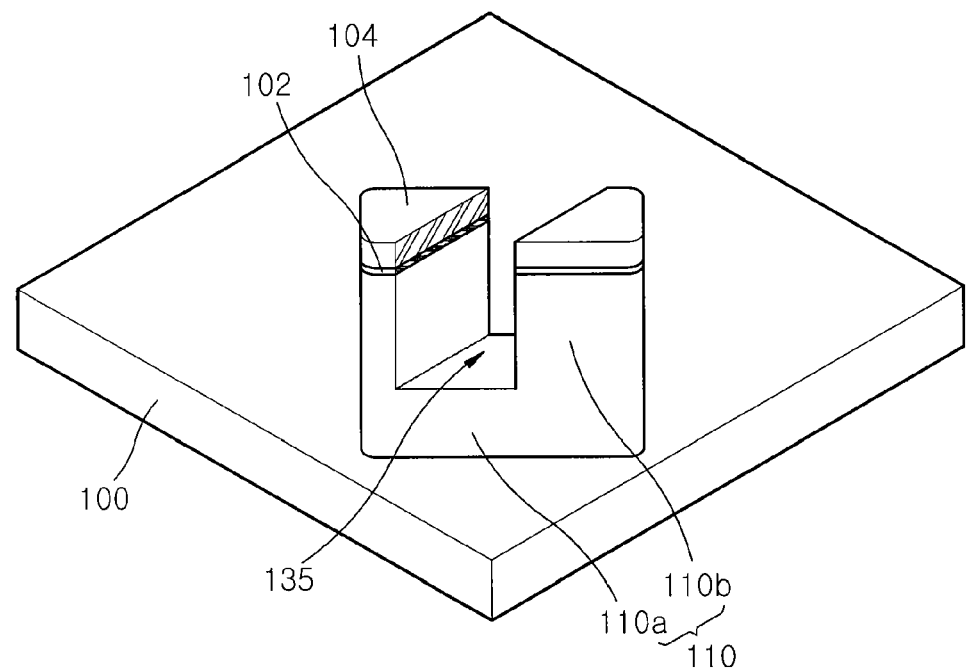
Figure 1C:
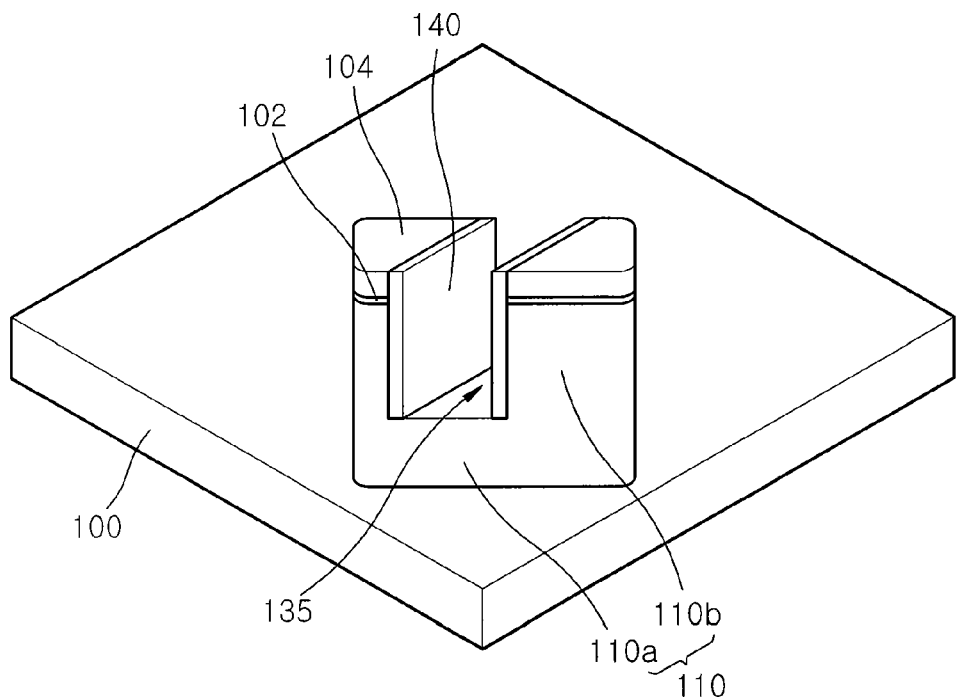
Figure 1D:
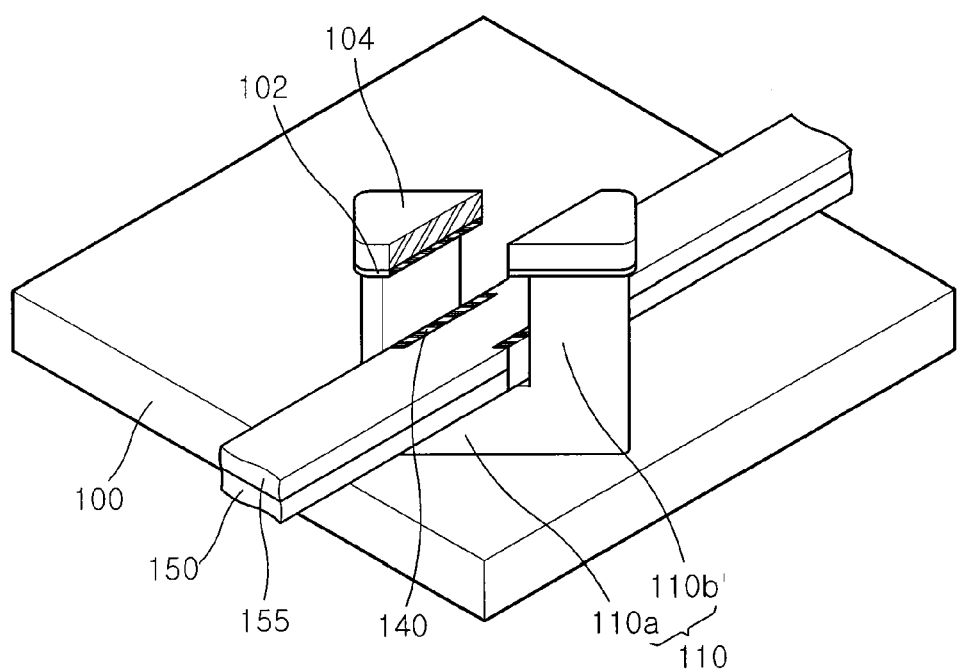
Figure 1E:
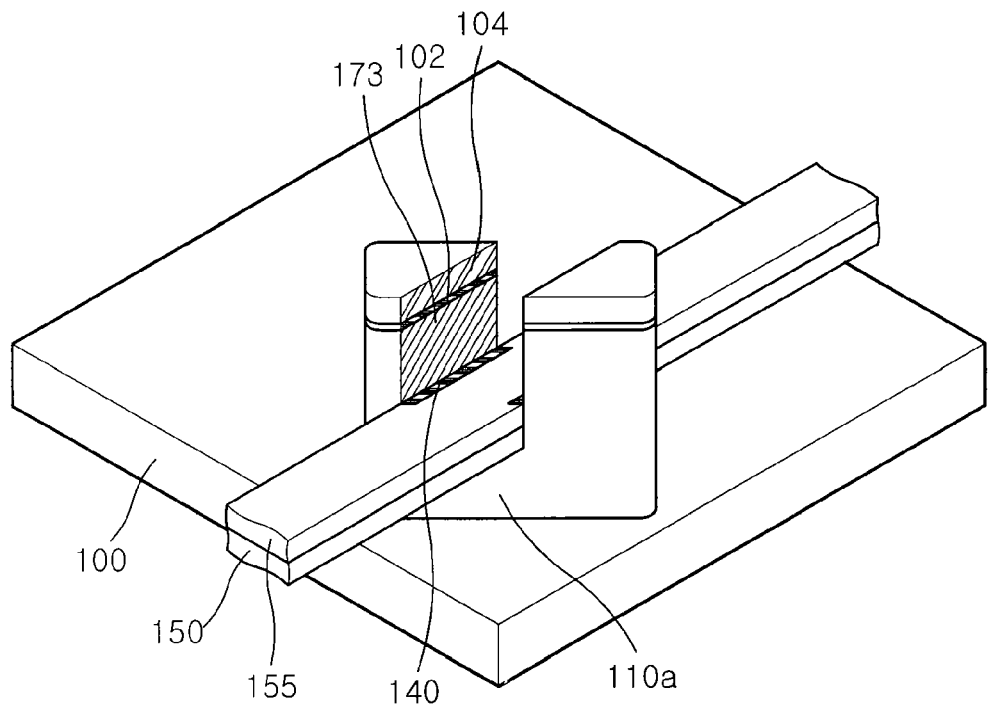
Figure 1F:
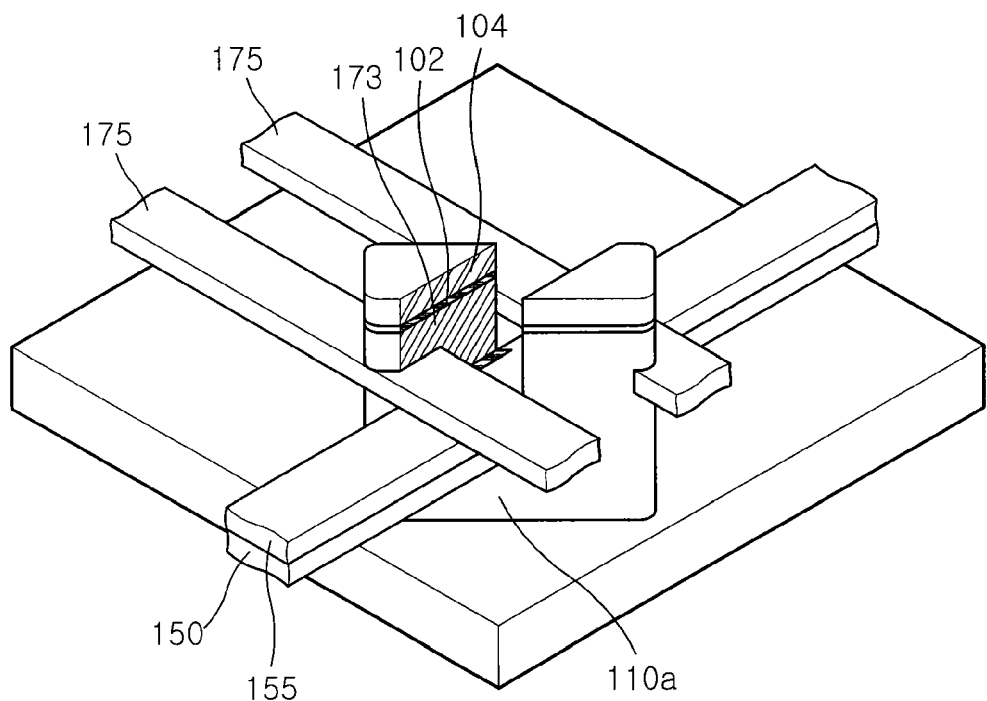

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

FIGS. 1A through 1G are perspective views illustrating a method of fabricating a semiconductor memory device with a vertical channel transistor according to an embodiment of the present invention. FIGS. 2A through 2G are plan views illustrating a method of fabricating a semiconductor memory device with a vertical channel transistor according to an embodiment of the present invention. FIGS. 3A through 3O are sectional views taken along section lines X-X and Y-Y of FIGS. 2A through 2G. Specifically, portions X and Y of FIGS. 3A through 3O are sectional views taken along section lines X-X and Y-Y of FIGS. 2A through 2G, respectively. FIG. 3P is a sectional view taken along section lines X'-X' and Y-Y of FIG. 2G. Specifically, portions X' and Y of FIG. 3P are sectional views taken along section lines X'-X' and Y-Y of FIG. 2G, respectively. In FIG. 3P, a bitline structure is omitted. FIGS. 4A through 4O are sectional views taken along section line Z-Z of FIGS. 2A through 2G.

Referring to FIGS. 1A, 2A, 3A and 4A, a pad oxide layer 102 and a hard mask layer are sequentially deposited on a semiconductor substrate 100. The pad oxide layer 102 may include a thermal oxide layer, and the hard mask layer may include a nitride layer or an oxynitride layer that has an etch selectivity with respect to the semiconductor substrate 100. The hard mask layer is patterned by photolithography to form hard mask patterns 104. Using the hard mask patterns 104, the pad oxide layer 102 and the semiconductor substrate 100 are etched to a first etching depth to form pillars 110.

Figure 2A:
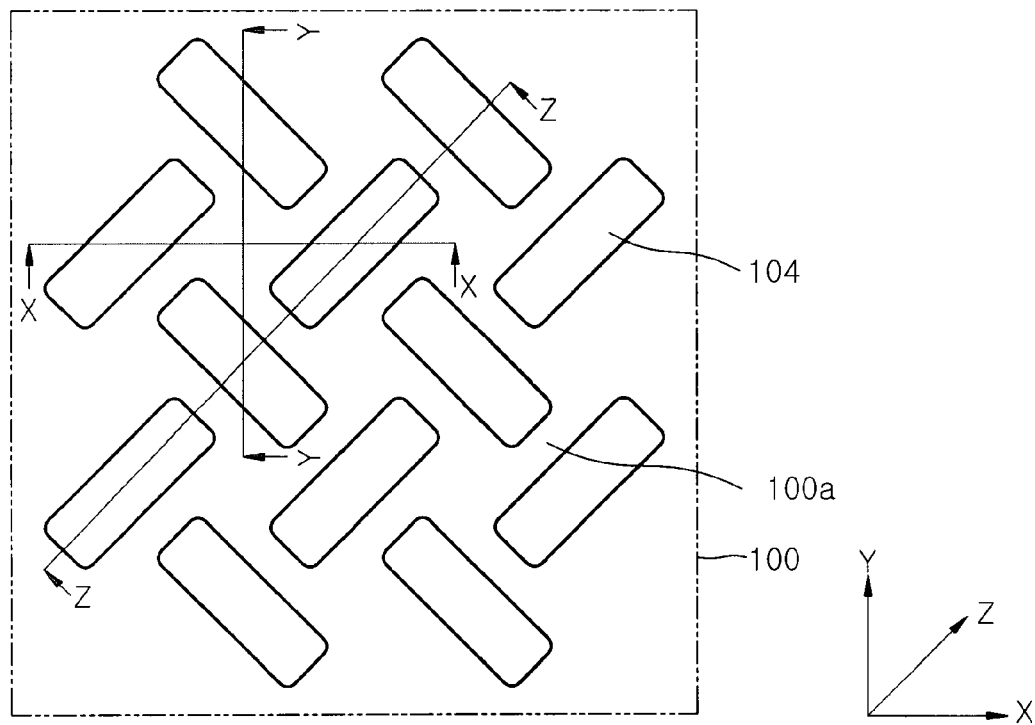
FIGS. 2A through 2G are plan views illustrating a method of fabricating a semiconductor memory device with a vertical channel transistor according to an embodiment of the present invention.
Figure 2B:
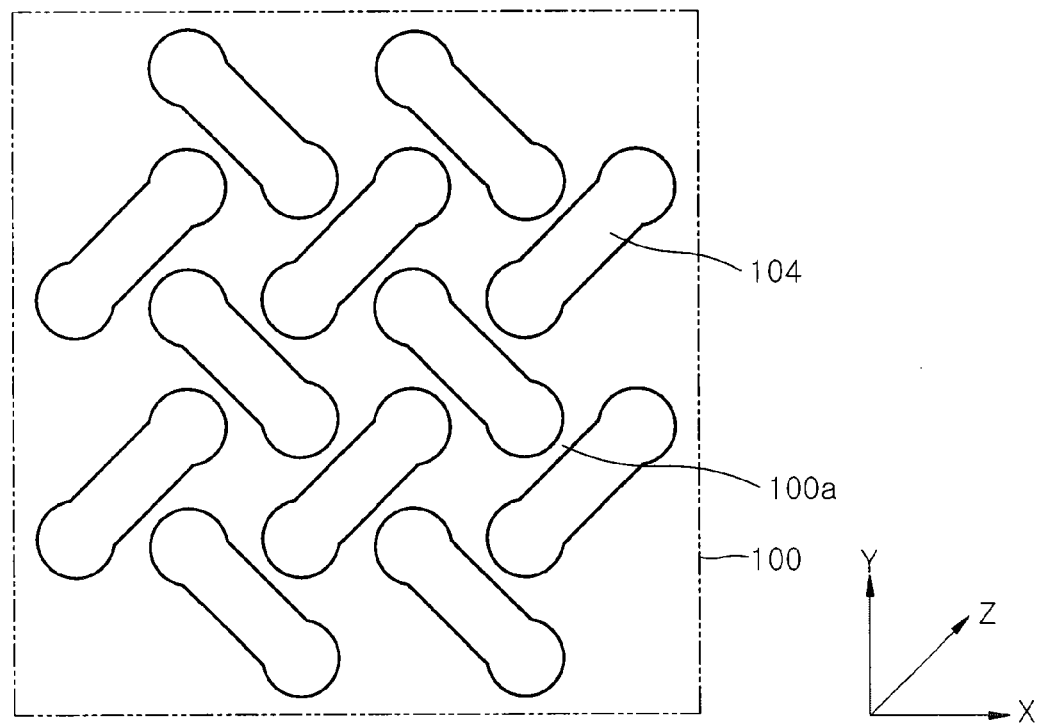

Referring particularly to FIG. 2A, the pillar 110 is a diagonal pillar that is elongated in the diagonal directions of the semiconductor substrate 100. The pillars 100 arranged in two adjacent lines in an X-direction are elongated in an opposite diagonal direction each other. Likewise, the pillars 100 arranged in two adjacent lines in a Y-direction are elongated in an opposite diagonal direction. The pillars 100 arranged in two adjacent lines in a z-direction are vertically arranged each other. For example, the pillars 100 arranged in a first X-direction line (X-X line of FIG. 2A) are elongated in the upward-diagonal direction, while the pillars 100 arranged in a second X-direction line neighboring the first X-direction line are elongated in the downward-diagonal direction. Similarly, the pillars 100 arranged in a first Y-direction line (Y-Y line of FIG. 2A) are elongated in the downward-diagonal direction, while the pillars 100 arranged in a second Y-direction line neighboring the first Y-direction line are elongated in the upward-diagonal direction. From the plan view, the pillar 100 has a rectangular shape elongated in the diagonal direction. According to the etching conditions, the pillar 100 may have various shapes. For example, as illustrated in FIG. 2B, the pillar 100 may have an elongated rectangular shape with rounded both ends.

Figure 2C:
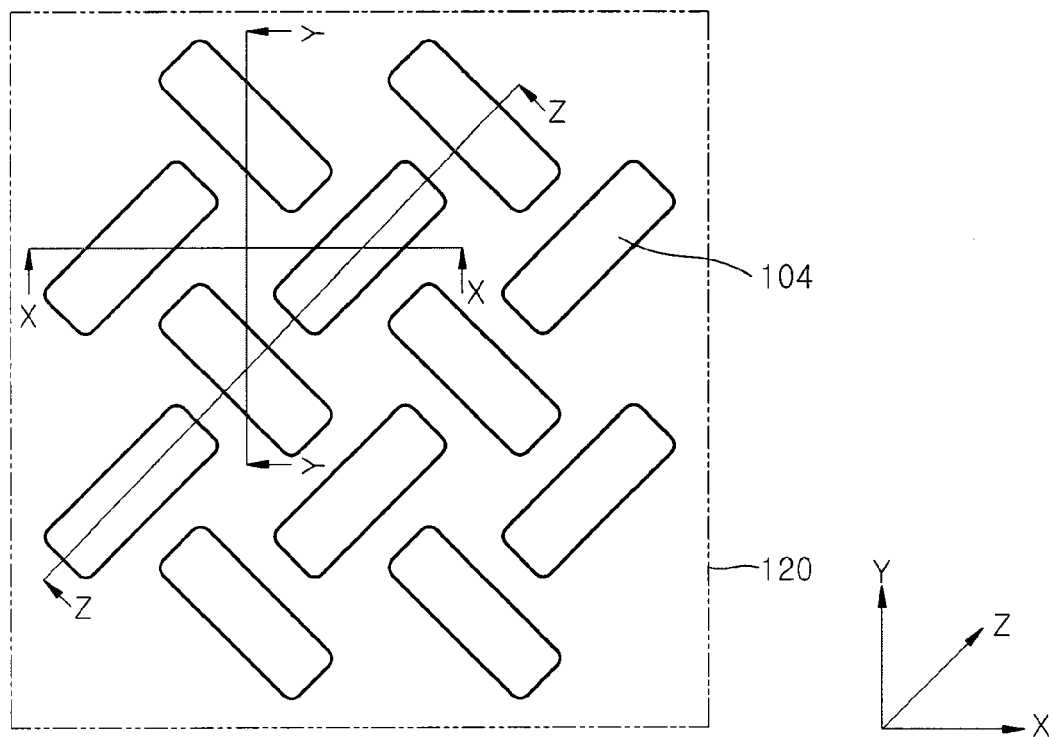
Figure 3B:
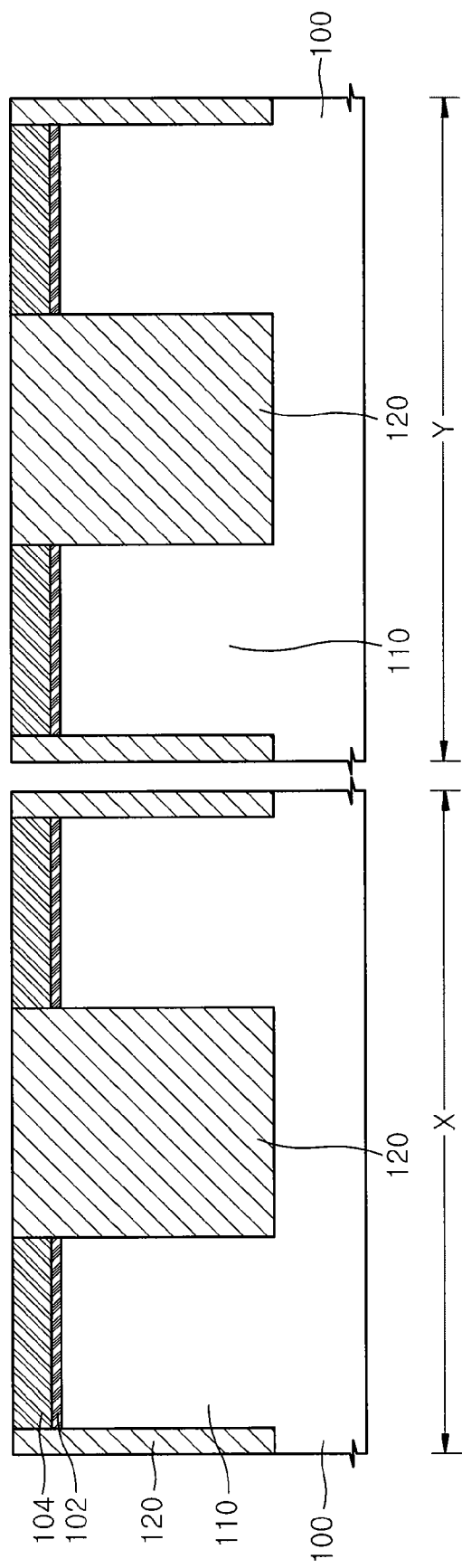
FIGS. 3A through 3O are sectional views taken along section lines X-X and Y-Y of FIGS. 2A through 2G.
FIG. 3P is a sectional view taken along section lines X'-X' and Y-Y of FIG. 2G.

Referring to FIGS. 2C, 3B and 4B, a first insulating layer 120 is deposited on the resulting structure of the semiconductor substrate 100 such that an etched region 100a (between the pillars 110) of the semiconductor substrate 100 is completely filled by the first insulating layer 120. The first insulating layer 120 is etched by a chemical mechanical polishing (CMP) process or an etch-back process until the hard mask pattern 104 is exposed. Consequently, the etched region 100a of the substrate 100 is filled with the first insulating layer 120. The first insulating layer 120 can comprise, for example, an oxide-based insulating material.

Figure 2D:
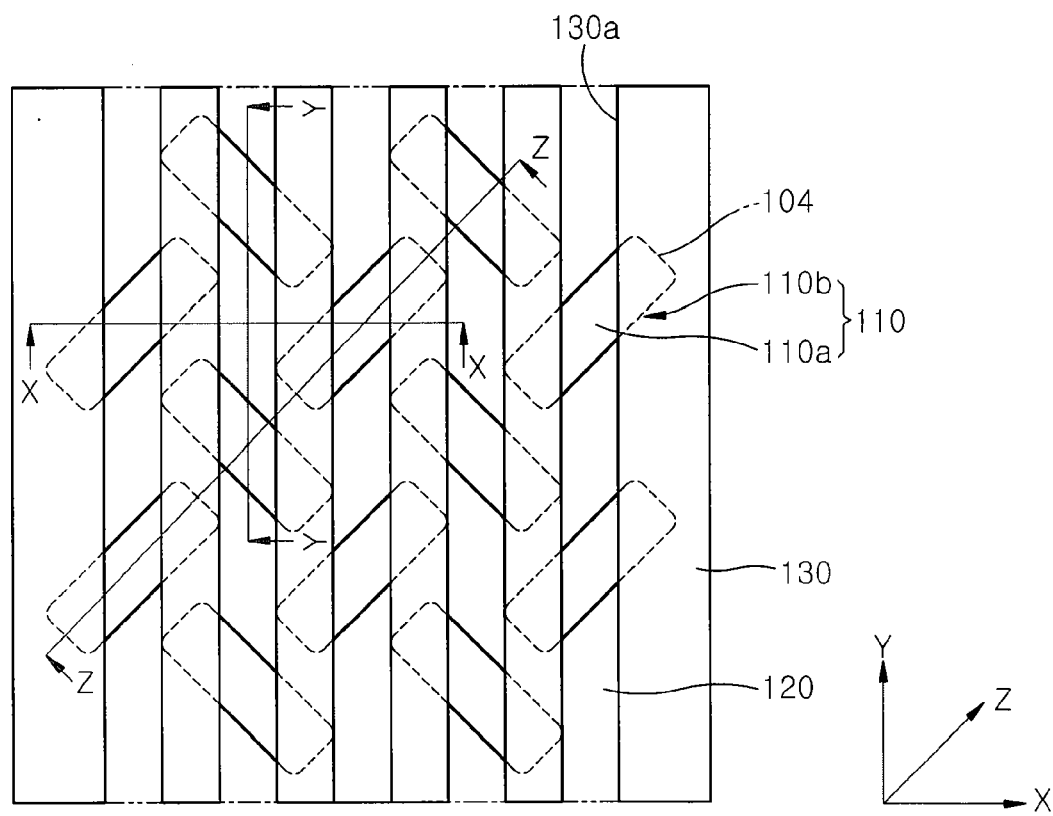
Figure 2E:
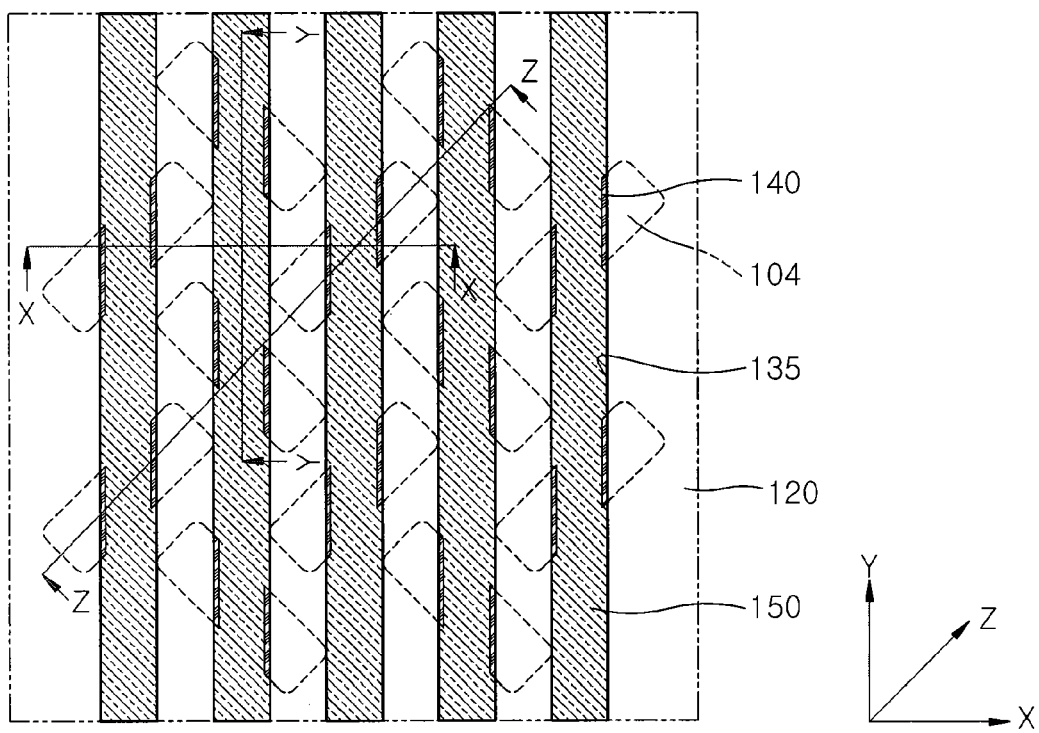
Figure 2F:
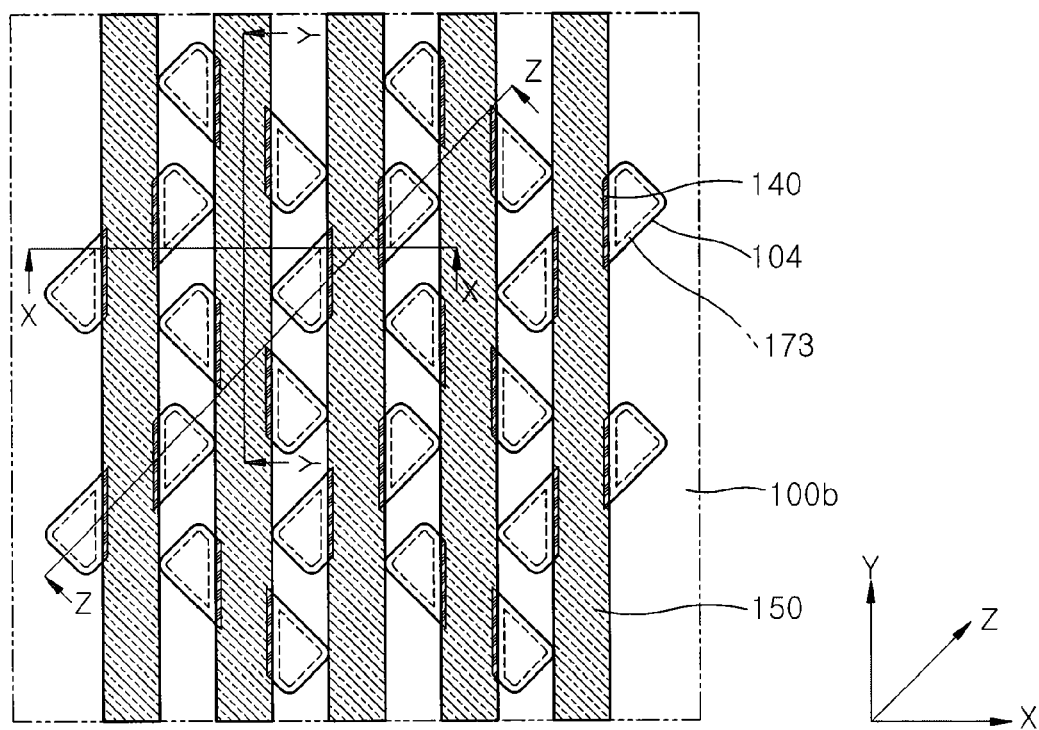
Figure 3C:
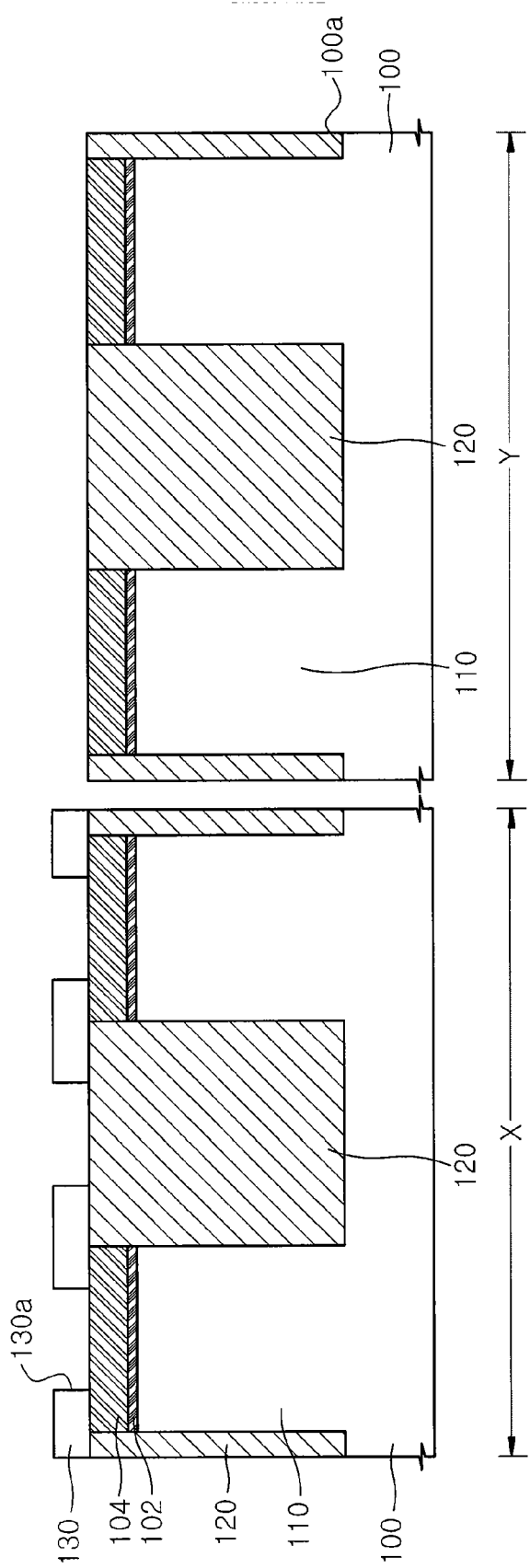
Figure 4C:
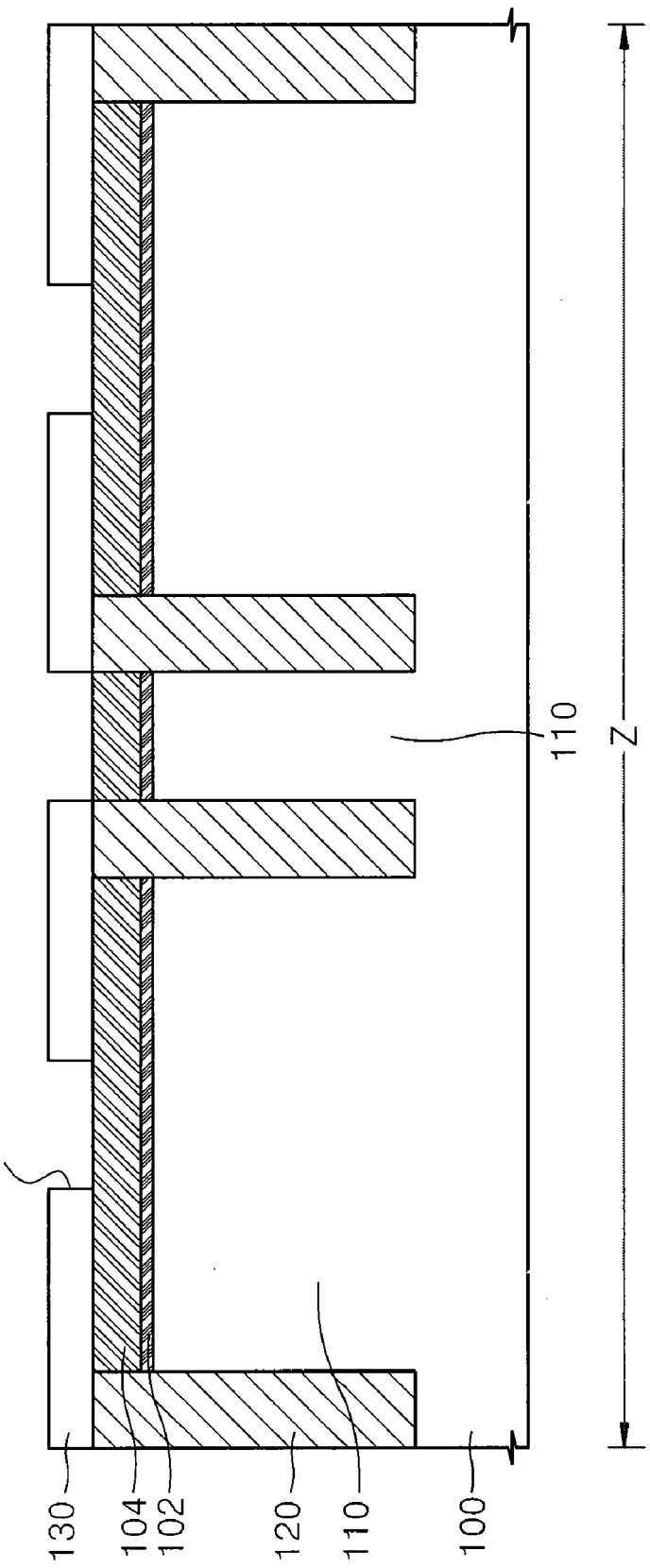
FIGS. 4A through 4O are sectional views taken along section line Z-Z of FIGS. 2A through 2G.

Referring to FIGS. 2D, 3C and 4C, mask patterns 130 are formed on the resulting structure including the first insulating layer 120. The mask patterns 130 serve to define a region where a bitline will be formed, and includes a window 130a exposing a region where a trench for the bitline will be formed. The window 130a has a stripe shape that is elongated in the Y direction. The mask patterns 130 for forming the bitline may include photoresist patterns or stacked patterns of a photoresist layer and a hard mask layer. The hard mask layer can include, for example, a material layer having an etch selectivity with respect to the pillar 110 and the first insulating layer 120. The material layer can comprise, for example, a nitride layer and an oxynitride oxide layer.

Referring to FIGS. 1B, 2E, 3D and 4D, using the mask patterns 130 as an etch mask, the hard mask patterns 104, the pad oxide layer 102 and the pillars 110, which are exposed by the window 130a, are etched to a second etching depth to form trenches 135. The trenches 135 are formed to penetrate the pillars 110 and are elongated in the Y direction. The pillar 110 includes a body portion 110a and pillar portions 110b that are separated by the formed trench 135. The second etching depth is smaller than the first etching depth, and the height "h" of the body portion 110a corresponds to the difference between the first etching depth and the second etching depth. The height of the body portion 110a is determined according to the length of a back gate of a gate electrode that will be formed later.

Figure 3D:
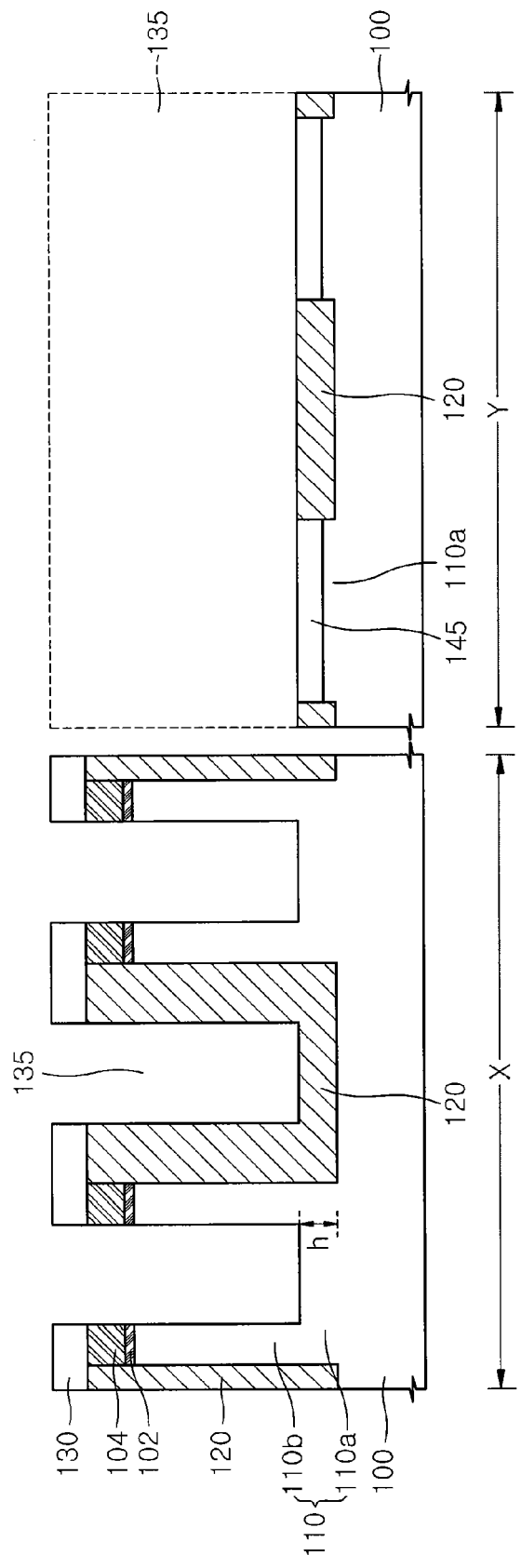
Figure 3E:
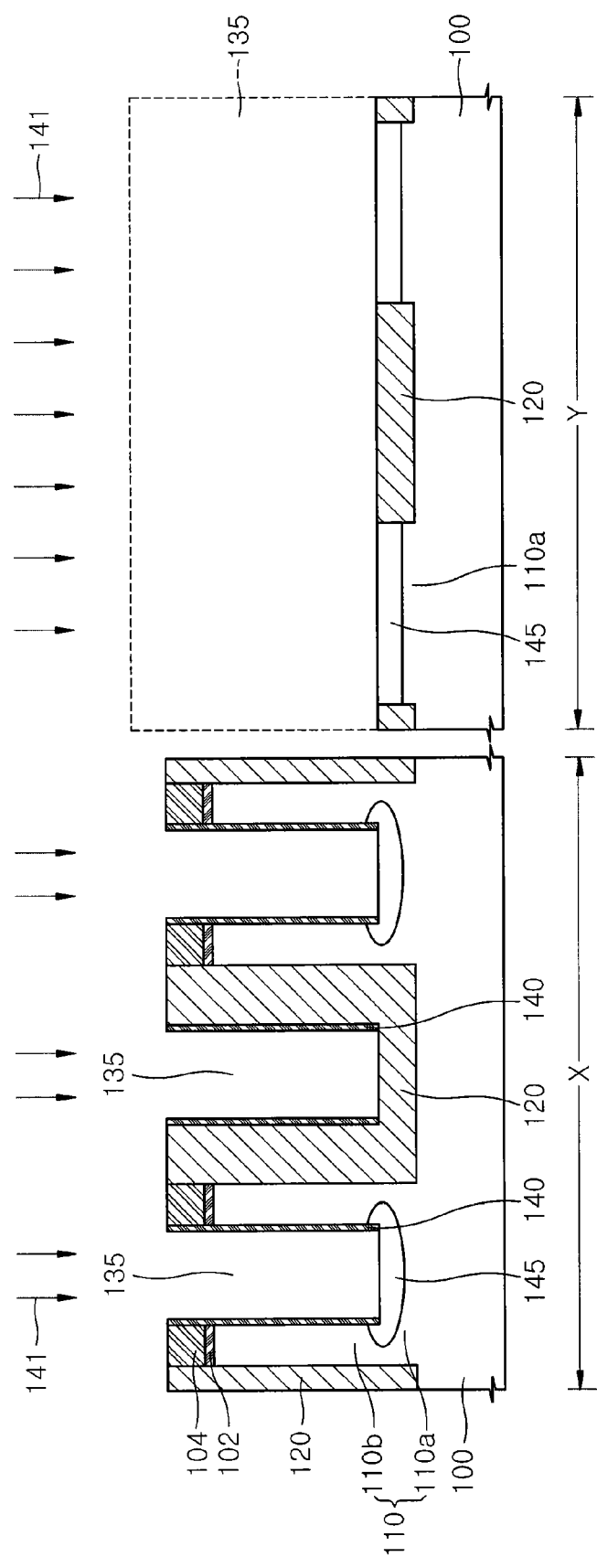
Figure 3F:
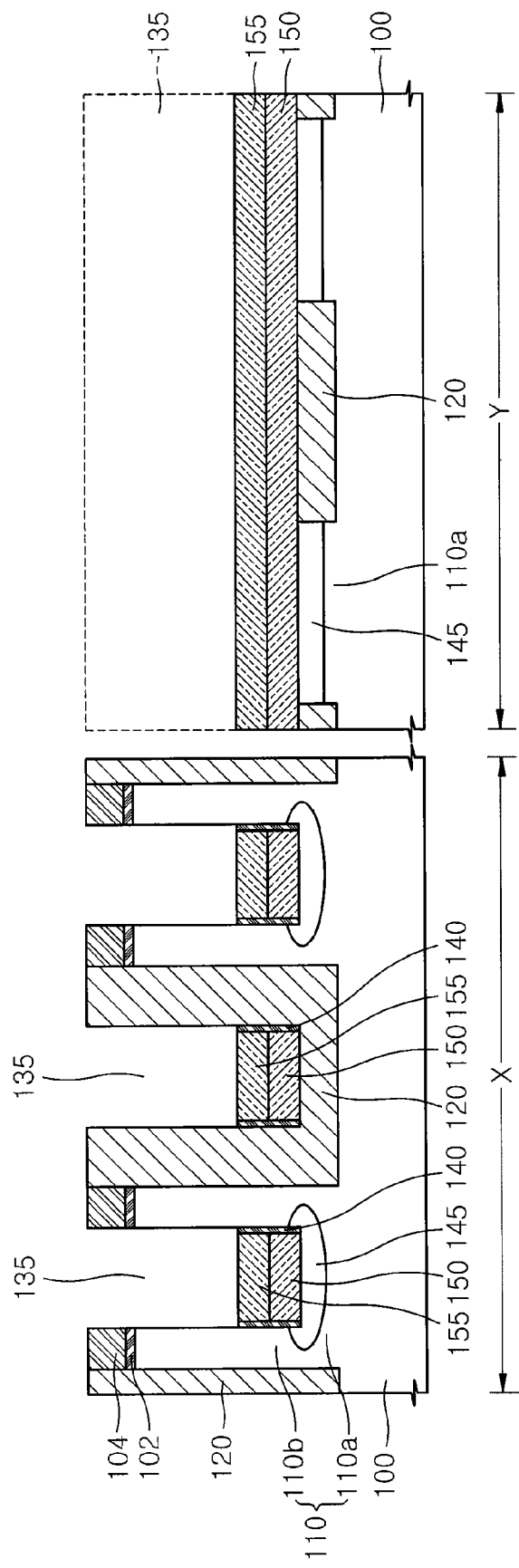

In FIG. 3D, a dotted portion denotes the position of the trench 135. The depth of the trench 135 is determined by the desired thicknesses of a bitline and a wordline that will be formed therein and the required insulating characteristics between the bitline and the wordline. The trenches 135 have the same structure as bitlines to be subsequently formed. The structure of the trenches 135 is not limited to the above striped structure, but may include any structure that is elongated to penetrate the pillars 110 aligned in the Y direction. From the plan view of FIG. 2E, the pillars 110b are positioned at acute angles relative to the extension axis of the trenches, and therefore are considered to have acute edges. These acute edges may be rounded by the subsequent etching or cleaning process for the pillars 110b.

Referring to FIGS. 1C, 2E, 3E and 4E, dopants with an opposite conductivity type to the semiconductor 100, for example, n-type dopants, are ion-implanted into the body portion 110a (of the pillars 110) exposed by the trenches 135, thereby forming a first doped region 145 for a drain (or source) region. The first doped region 145 is shared by a pair of memory cells that will be formed in the pillar portions 110b, and thus serves as a common drain (or source) region. An insulating layer is deposited on the resulting structure of the semiconductor substrate 100 and is then etched back to form spacers 140 on the sidewalls of the trenches 135. The spacer 140 may include an oxide layer or a nitride layer. The spacer 140 serves as an insulating layer for insulating the neighboring cells from each other, or serves as a bitline protection layer for preventing oxidation of bitlines that will be formed later. Alternatively, the first doped region 145 may be formed after the spacers 140 are formed on the sidewalls of the trenches 135.

Referring to FIGS. 1D, 2E, 3F and 4F, a conductive layer is deposited on the resulting structure of the semiconductor substrate 100. The conductive layer may include a conductive material for a bitline. The conductive layer may comprise, for example, a doped polysilicon layer, a tungsten (W) layer, a tungsten nitride (WN) layer, a W/WN layer, a metal silicide layer, and a TiSi$_x$/TiN layer. The metal silicide layer may include a tungsten silicide (WSi$_x$) layer, a cobalt silicide (CoSi$_x$) layer, a nickel silicide (NiSi$_x$) layer, and a titanium silicide (TiSi$_x$) layer. Using the mask patterns 130 as an etch stop layer, the conductive layer is etched back to form a bitline 150 in each trench 135. The bitline 150 is formed between the pillar portions 110b of the pillar 100 such that it penetrates the pillars 100 arranged in the Y direction.

Thereafter, an insulating layer is deposited on the resulting structure of the semiconductor substrate 100. The insulating layer serves as a bitline capping layer, and may include a material layer (e.g., a nitride layer) having an etch selectivity with respect to an oxide layer. The insulating layer is etched backed to form a bitline capping layer 155 on the bitlines 150 in the trenches 135. The bitline 150 is surrounded by the spacer 140 and the bitline capping layer 155. The spacers 140 are etched such that they remain only between the pillar portion 110b and the bitline 150 and between the pillar portion 110b and the bitline capping layer 155. The mask patterns 130 are also removed because the insulating layer is etched back using the first insulating layer 120 as an etch stop layer. When the mask patterns 130 include a photoresist layer, it may be removed before the deposition of the conductive layer.

Alternatively, the spacers 140 may also be etched during the etch-back process for the conductive layer such that they remain only between the bitline 150 and the pillar portion 110b. In this case, the bitline capping layer 155 is formed on the spacer 140 and the bitline 150 in the trench 135. Also, the mask pattern 130 may be removed during the formation of the bitline 150, because the conductive layer may be etched back using the first insulating layer 120 as an etch stop layer.

Figure 3G:
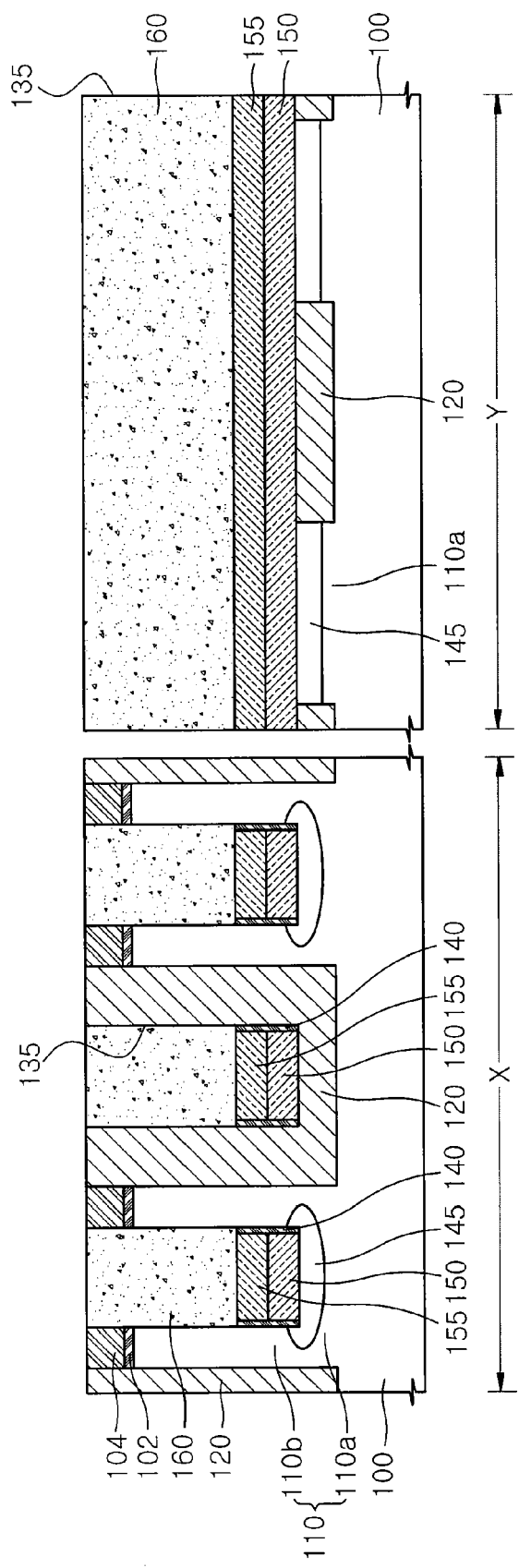

Referring to FIGS. 3G and 4G, a second insulating layer 160 is deposited on the resulting structure of the semiconductor substrate 100 to fill the trenches 135. The second insulating layer 160 may include, for example, an oxide-based insulating layer. Using the hard mask patterns 104 as an etch stop layer, a CMP process is performed on the second insulating layer 160 to fill the trenches with the second insulating layer 160.

Figure 3H:
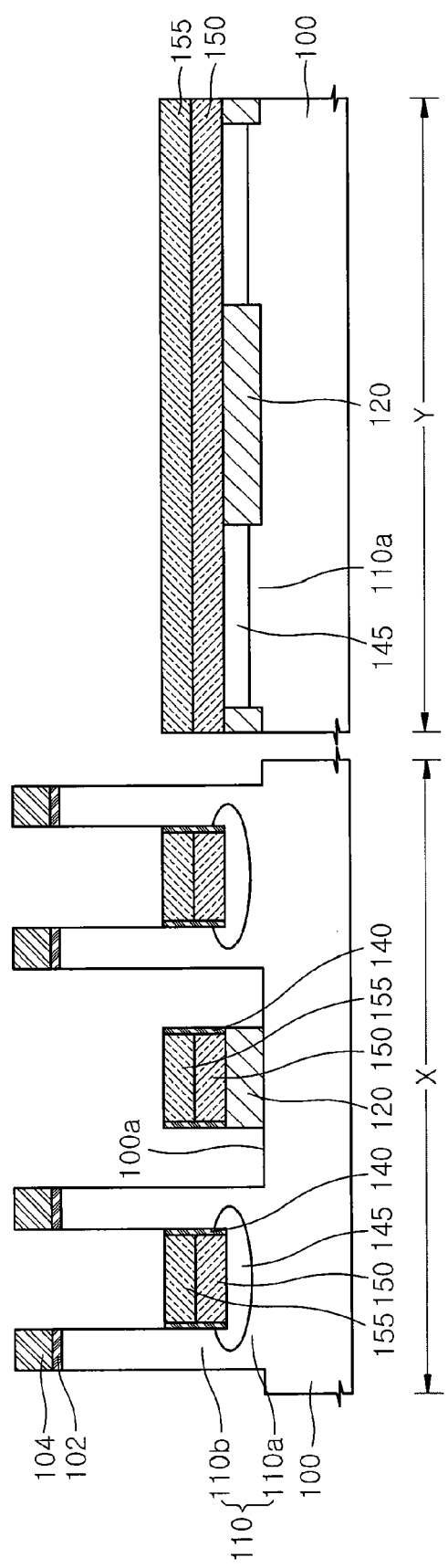

Referring to FIGS. 3H and 4H, the first and second insulating layers 120 and 160 are etched such that the first insulating layer 120 remains only below the bitline 150, thereby exposing a surface 100a of the semiconductor substrate 100 and the sidewalls of the pillar portion 110b.

Figure 3I:
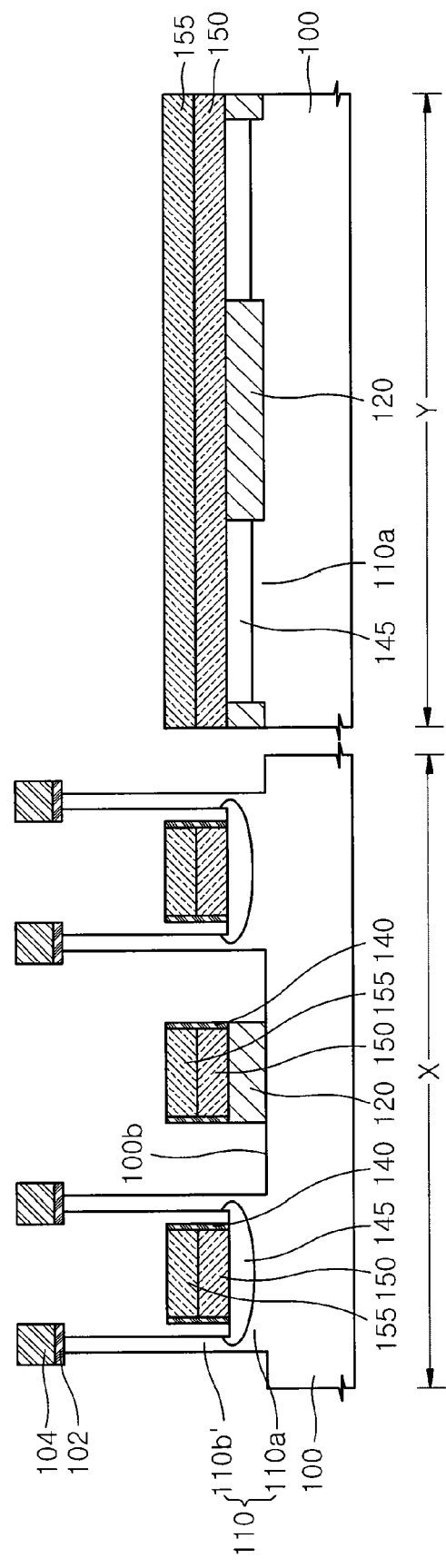
Figure 3J:
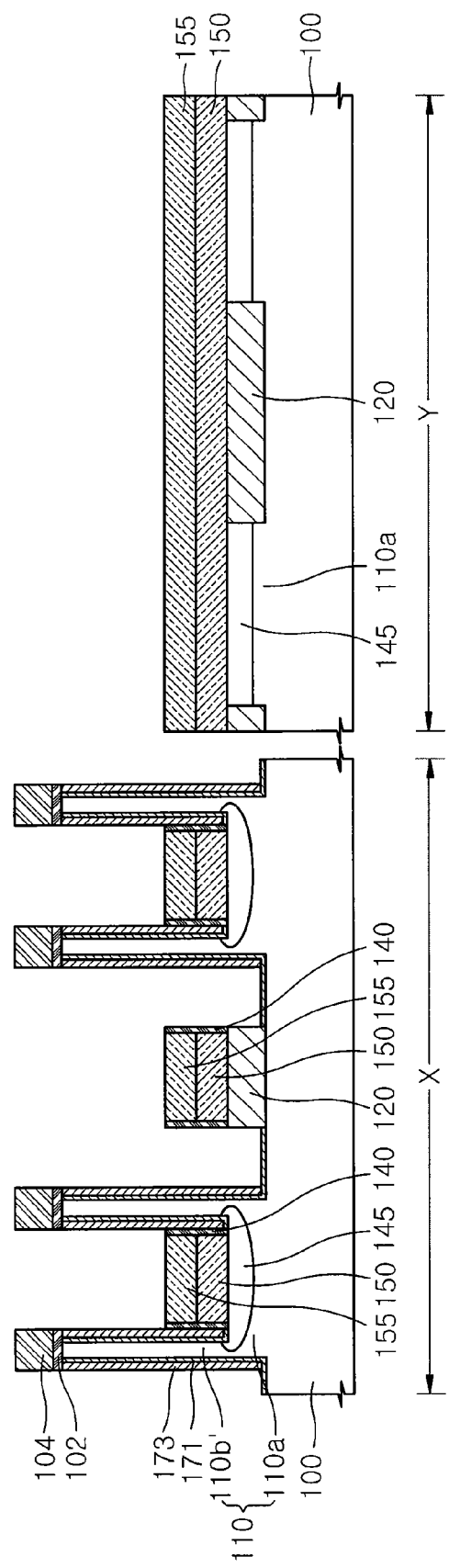

Referring to FIGS. 3I and 4I, the exposed sidewall of the pillar portion 110b is etched to a predetermined width from the edge of the hard mask pattern 104. Consequently, an interval between the etched pillar portion 110b' and the bitline 150 is maintained at the predetermined width, thereby exposing the sidewall of the pillar portion 110b' and the surface 100b of the semiconductor substrate 100. At this point, the predetermined width is determined in accordance with the desired thicknesses of a gate insulating layer and a gate electrode that are to be subsequently formed.

Referring to FIGS. 1E, 2F, 3J and 4J, a gate insulating layer 171 is formed on the surface 100b of the semiconductor substrate 100 and the exposed surface of the pillar portion 110b'. The gate insulating layer 171 may be formed, for example, using a silicon oxide layer, hafnium oxide (HfO$_2$) layer, a tantalum oxide (Ta$_2$O$_5$) layer, or an oxide-nitride-oxide (ONO) layer. A conductive layer is then formed on the resulting structure of the semiconductor substrate 100. The conductive layer may be formed of a gate electrode material such as metal, metal silicide, metal nitride, and doped polysilicon. Using the gate insulating layer 171 as an etch stop layer, the conductive layer is etched back to form a gate electrode 173 on the sidewalls of the pillar portion 110b'. The gate electrode 173 is formed in the shape of a spacer surrounding the pillar portion 110b', and is perpendicular to the surface of the semiconductor substrate 110. Thereafter, the gate electrode 173 may be cleaned using HF or SC1. This cleaning process aims at reducing the contact resistance between the gate electrode 173 and a wordline to be subsequently formed, and thus improving the interface characteristics. As is well known in the art, the SC1 is a mixture solution of ammonia (NH$_5$OH), hydrogen peroxide (H$_2$O$_2$), and deionized water.

Figure 3K:
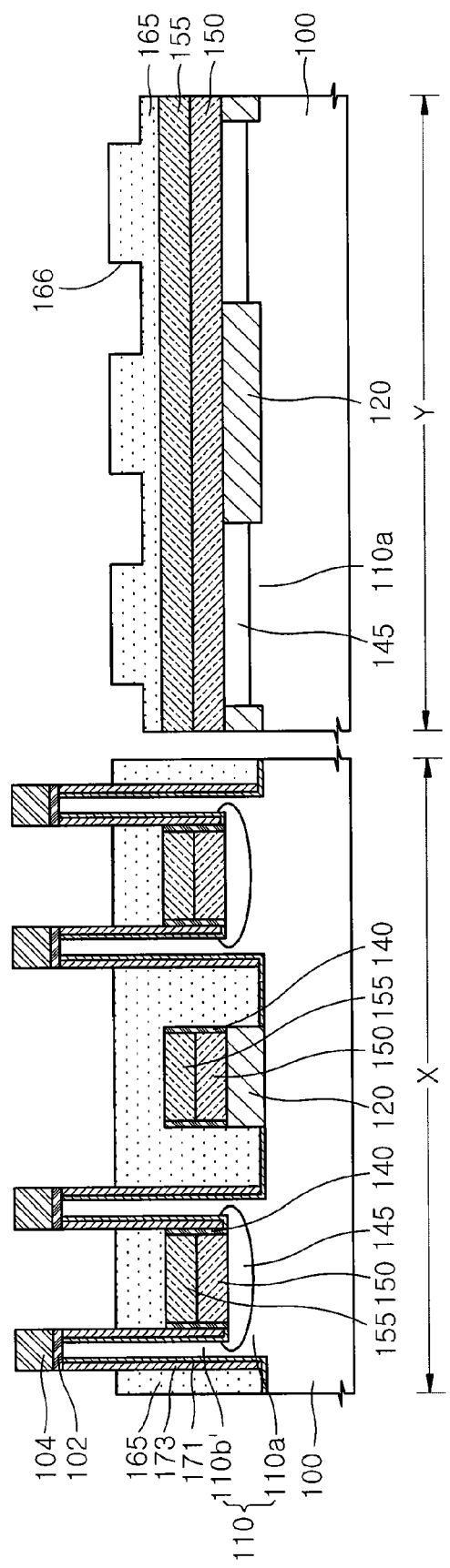
Figure 3L:
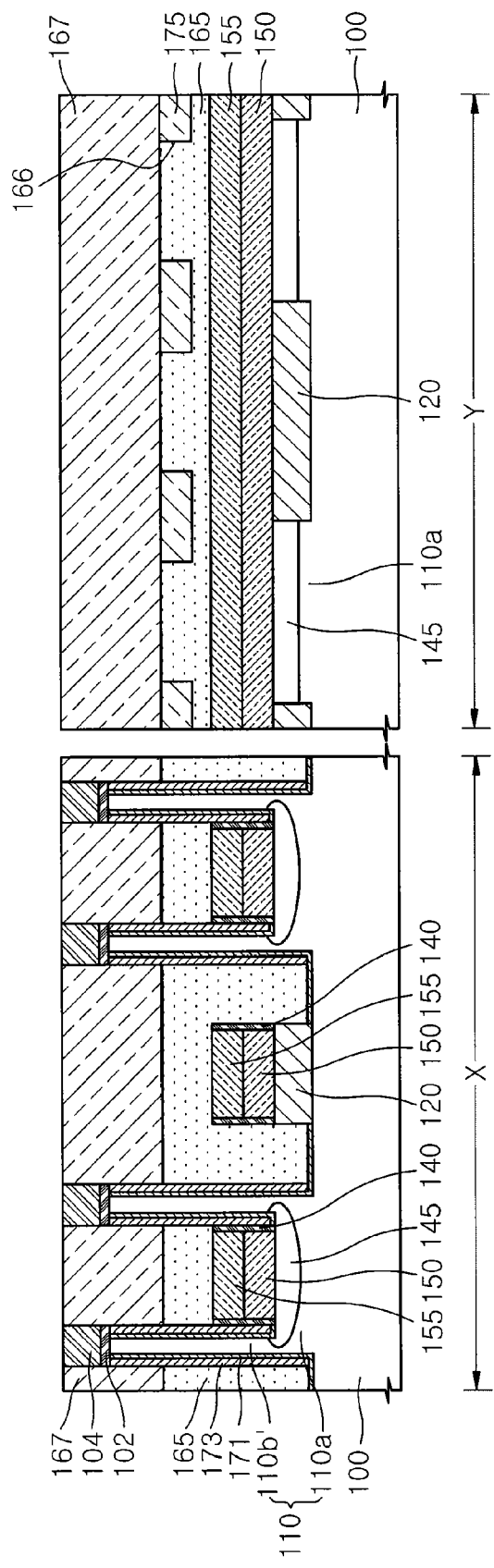

Referring to FIGS. 3K and 4K, a third insulating layer 165 is deposited on the resulting structure of the semiconductor substrate 100 to fully fill a space between the neighboring pillar portions 110b'. The third insulating layer 165 may comprise, for example, an oxide-base insulating material. Using the hard mask patterns 104 as an etch stop layer, a CMP process is performed to planarize the third insulating layer 165. Thereafter, an etch-back process is performed to etch the third insulating layer 165, thereby forming the third insulating layer 165 on the exposed surface 100b of the semiconductor substrate 100 and the bitline capping layer 155. At this point, the third insulating layer 165 may be formed to be spaced apart from the upper surface of the pillar 110 by a predetermined distance. This predetermined distance is determined in accordance with desired insulating properties of a storage node and a wordline that are to be subsequently formed.

Thereafter, photoresist patterns (not illustrated) are formed on the third insulating layer 165. Using the photoresist patterns, the exposed portions of the second insulating layer 165 are etched to form trenches 166. The trenches 166 are to be used for forming wordlines. The trenches 166 are elongated in the X direction, and the thickness of the trenches determines, in part, the resulting thickness of the wordline. The above formation of the trench 166 exposes the gate electrode formed on one of a pair of pillar portions 110b of each of the pillars 110 that are arranged in the X direction. At this time, the respective ones of pairs of pillar portions 110b of the pillars 110 arranged in the two neighboring row lines (i.e., the two neighboring X-direction lines) are alternately exposed.

Referring to FIGS. 1F, 2G, 3L and 4L, a conductive layer is deposited on the resulting structure of the semiconductor substrate 100 such that the trenches 166 are completely filled with the conductive layer. This conductive layer is used for forming wordlines. Like the conductive layer for the bitlines 150, the conductive layer for the wordlines may include a doped polysilicon layer, a tungsten (W) layer, a tungsten nitride (WN) layer, a W/WN layer, a metal silicide layer, and a TiSi$_x$/TiN layer. The metal silicide layer may include a tungsten silicide (WSi$_x$) layer, a cobalt silicide (CoSi$_x$) layer, a nickel silicide (NiSi$_x$) layer, and a titanium silicide (TiSi$_x$) layer. Using the third insulating layer 165 as an etch stop layer, the conductive layer is etched back to form a wordline 175 in each trench 166. At this point, the wordlines 175 are formed to be spaced apart from the upper surfaces of the pillars 110 by a predetermined distance, in order to facilitate its isolation from a storage node contact plug that will be subsequently formed. Thereafter, a fourth insulating layer 167 is deposited on the resulting structure of the semiconductor substrate 100 where the wordlines have been formed. The fourth insulating layer 167 includes an oxide-based insulating material. Using the hard mask patterns 104 as an etch stop layer, a CMP process is performed to planarize the fourth insulating layer 167.

Referring to FIG. 3P, the wordline 175 is elongated in the X direction, that is, a direction intersecting the bitline 150. The wordline 175 electrically contacts the side surface of the gate electrode 173. The wordlines 175 are formed corresponding to the pillars 110 that are arranged in the first X-direction line and elongated in the upward-diagonal direction and the pillars 110 that are arranged in the second X-direction line and elongated in the downward-diagonal direction. The respective ones of gate electrodes 173 formed on the sidewalls of one of a pair of pillar portions 110b' of the pillars 110 arranged in the two neighboring X direction lines are alternately connected electrically to the wordlines 175. Accordingly, the gate electrodes 173 formed respectively on a pair of pillar portion 110b' are electrically connected to the different wordlines 175, respectively.

Figure 2G:
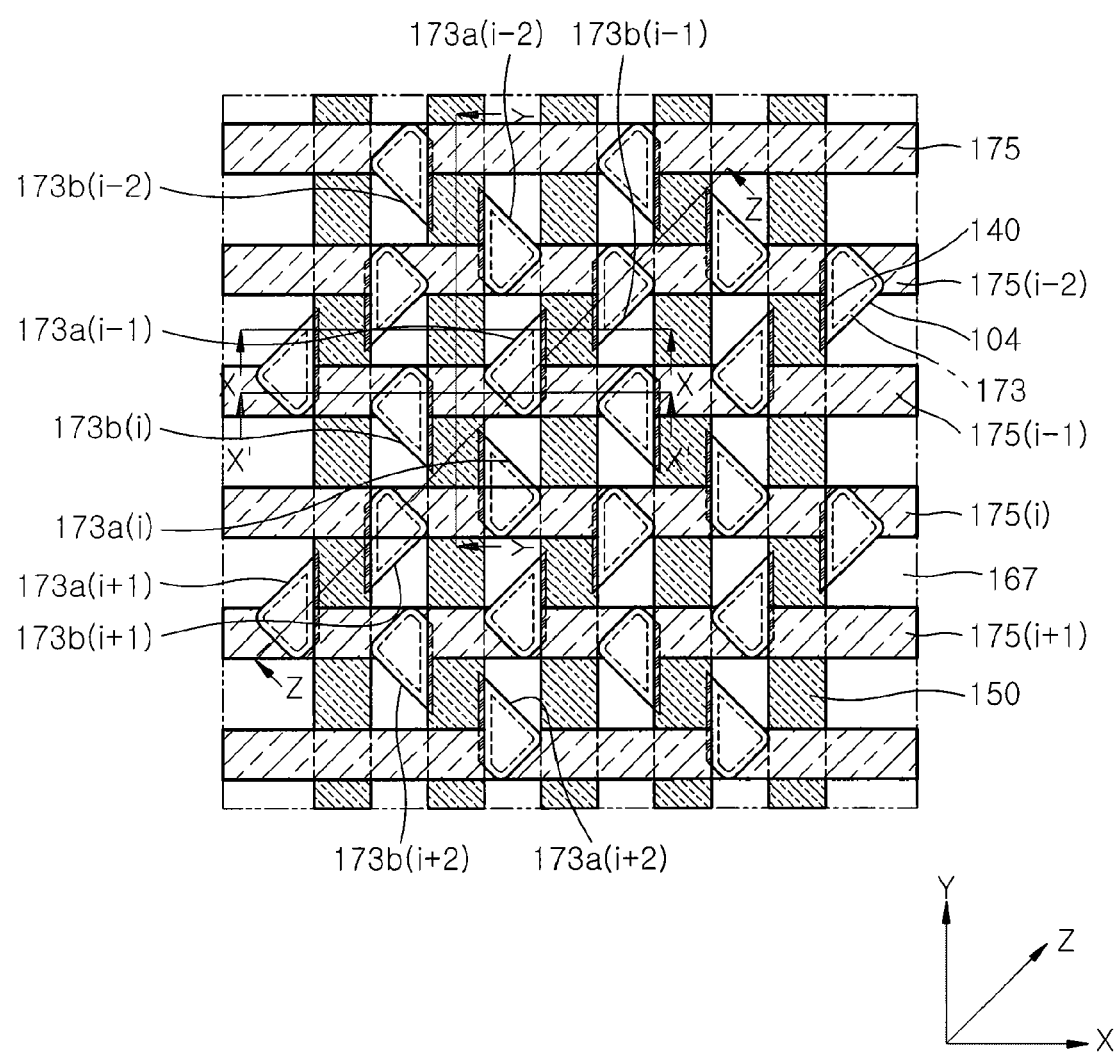

For example, referring particularly to FIG. 2G, one gate electrode 173a(i) among the gate electrodes 173 formed on a pair of pillar portions 110b' of the pillar 110 elongated in the downward-diagonal direction in the (i)th X-direction line is electrically connected to the (i)th wordline 175(i), together with one 173b(i+1) of the gate electrodes 173 formed on a pair of pillar portions 110b' of the pillar 110 elongated in the upward-diagonal direction in the (i+1)th X-direction line. On the other hand, another gate electrode 173b(i) among the gate electrodes 173 formed on a pair of pillar portions 110b' of the pillar 110 in the (i)th X-direction line is electrically connected to the (i−1)th wordline 175(i−1), together with one gate electrode 173a(i−1) among the gate electrodes 173 formed on a pair of pillar portions 110b' of the pillar 110 elongated in the upward-diagonal direction in the (i−1)th X-direction line.

Figure 3M:
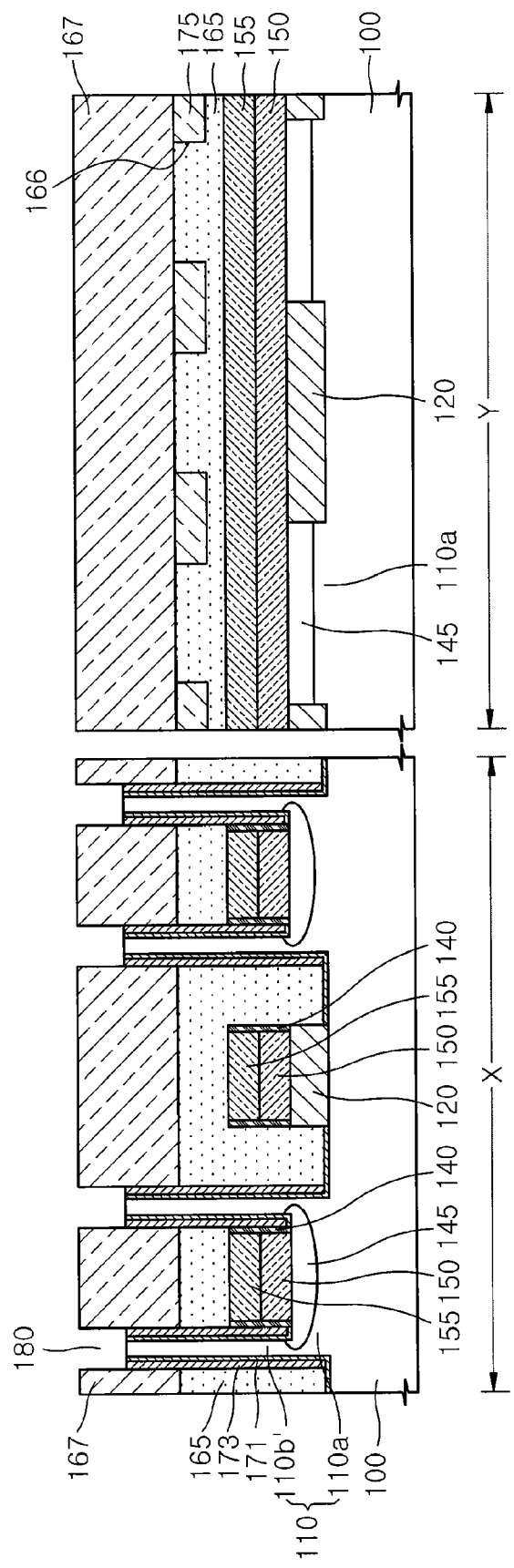
Figure 30:
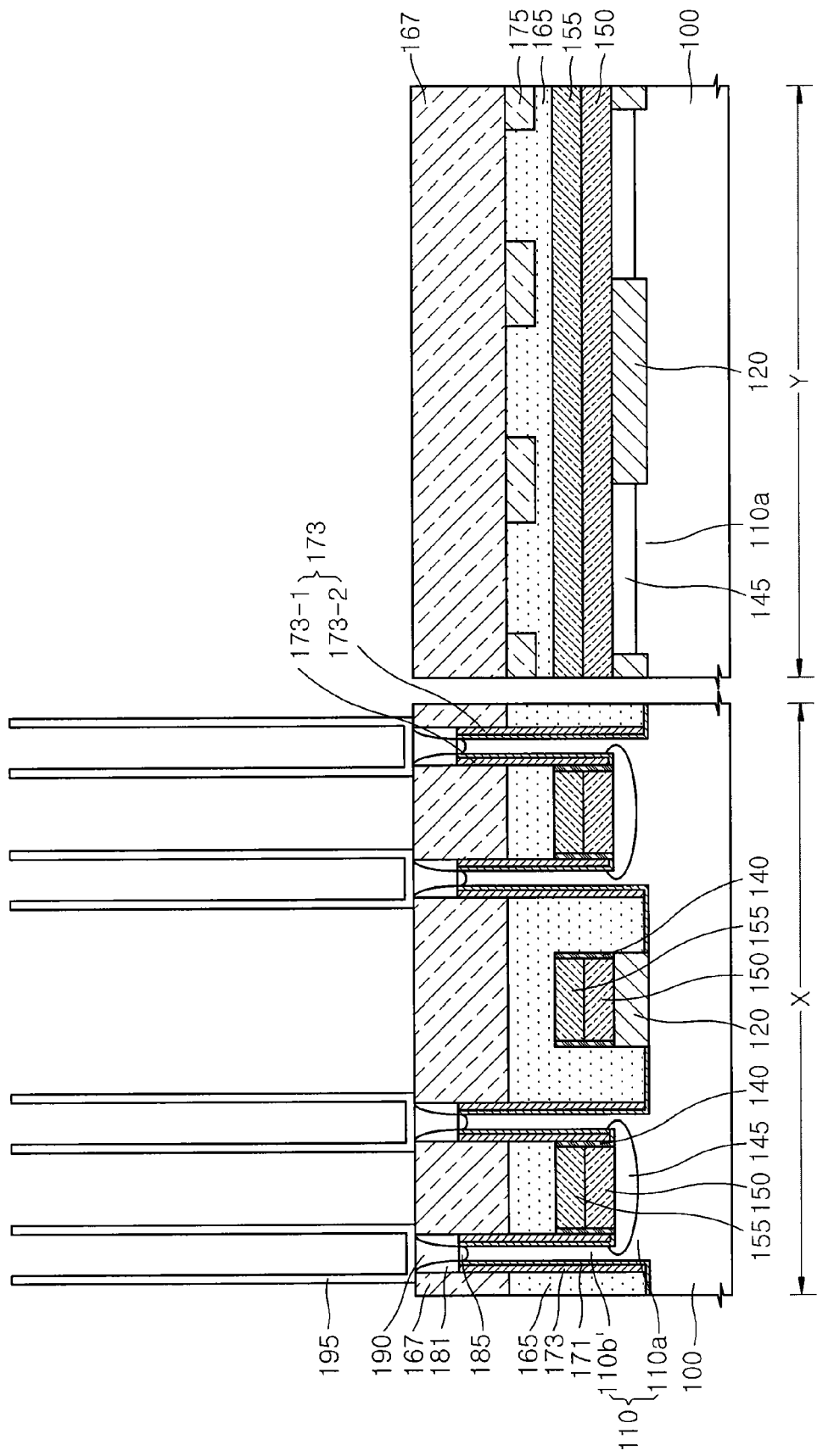
Figure 3P:
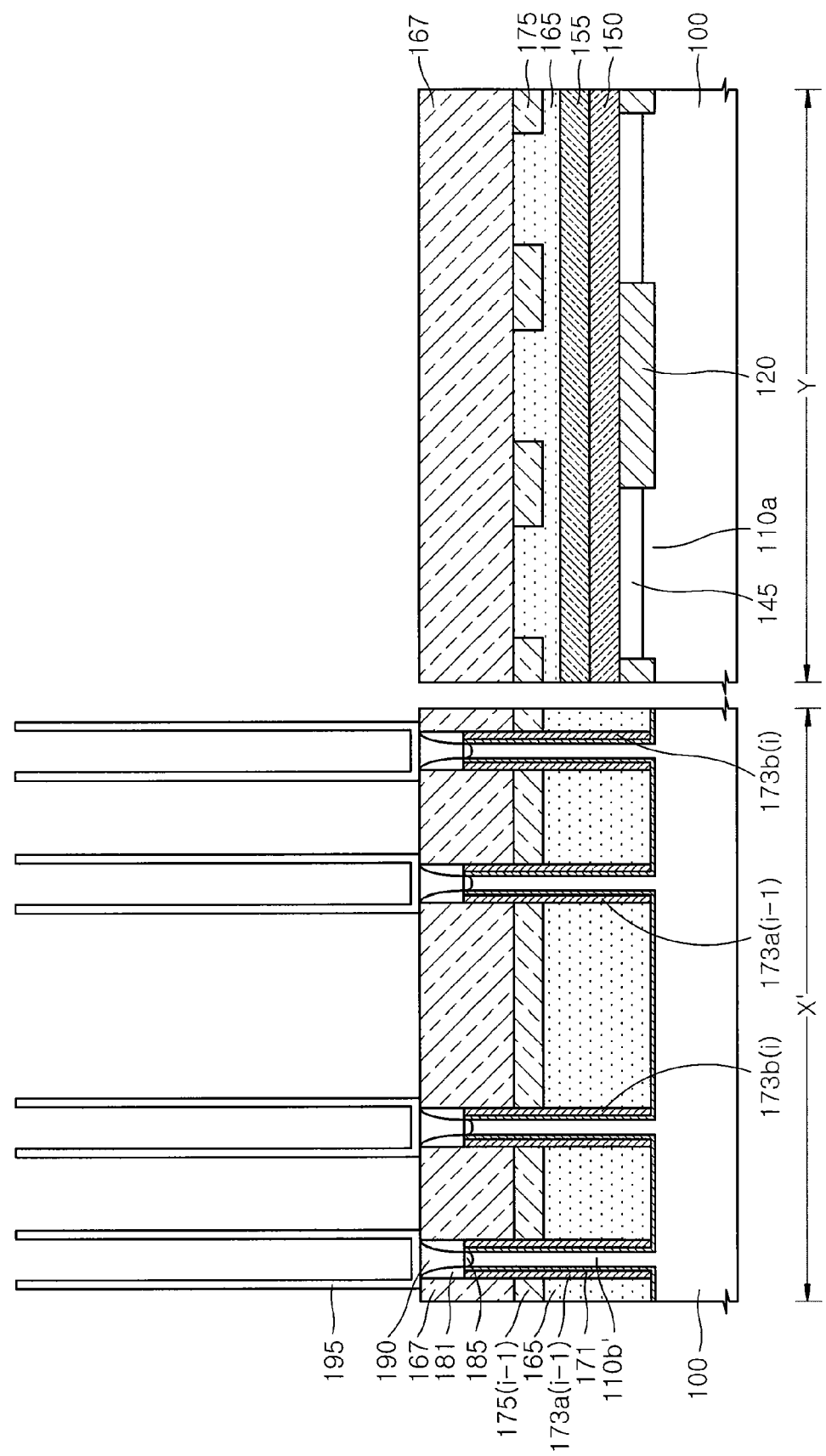
Figure 4M:
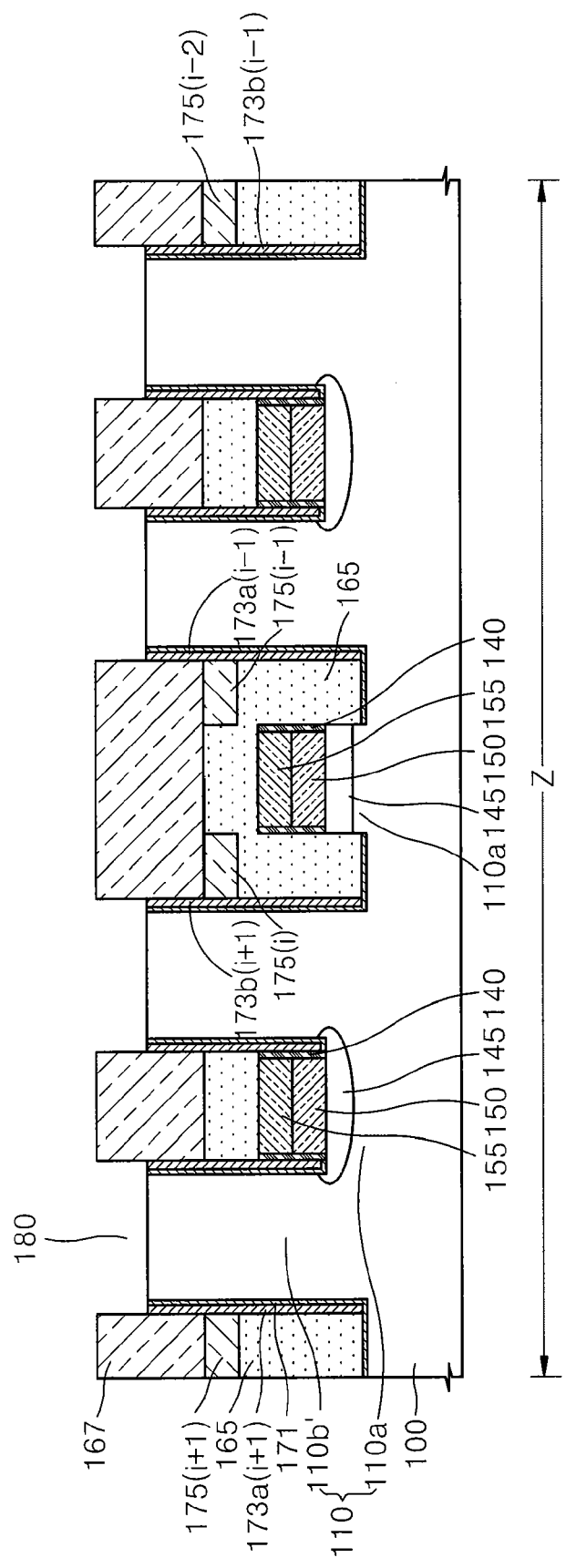

Referring to FIGS. 3M and 4M, a wet etching process is performed to remove the hard mask patterns 104 and the pad oxide layer 102, thereby forming grooves 180 exposing the upper surfaces of the pillar portions 110b' of the pillars 110. Alternatively, a subsequent process may be performed after removing only the hard mask patterns 104 with the pad oxide layer 102 remaining in the grooves 180.

Figure 4N:
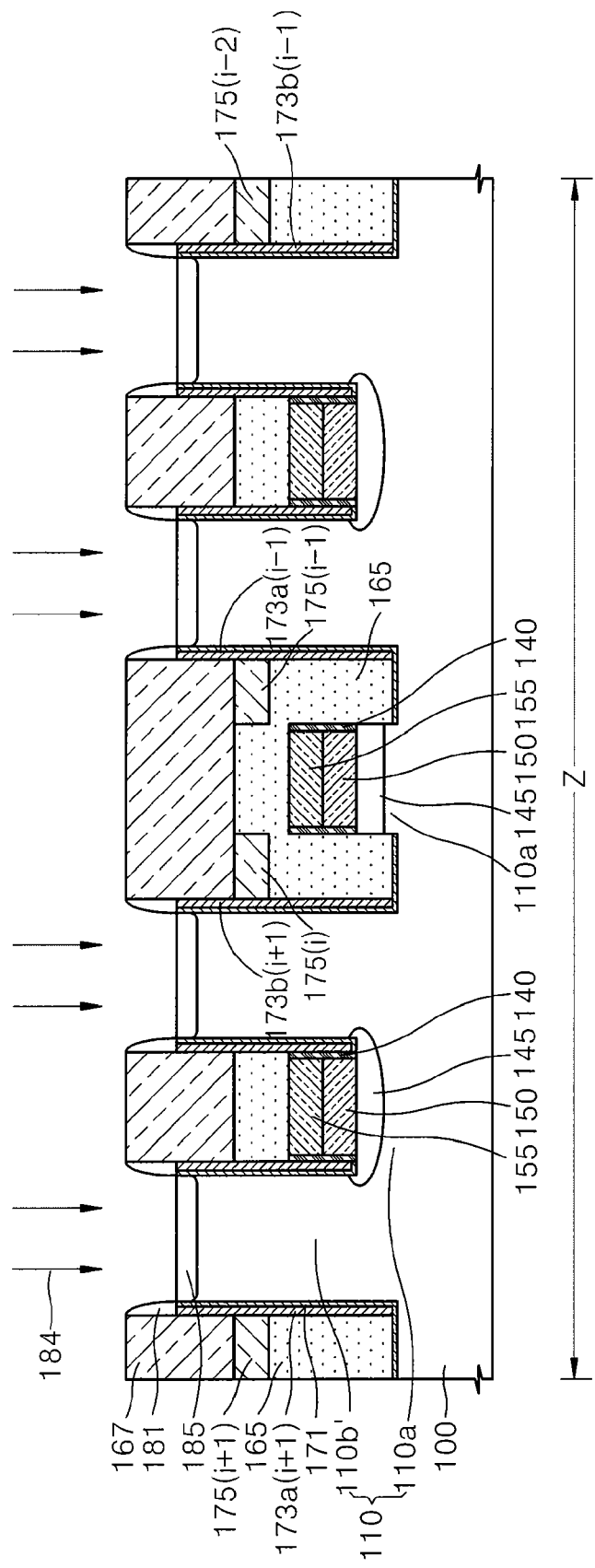
Figure 40:
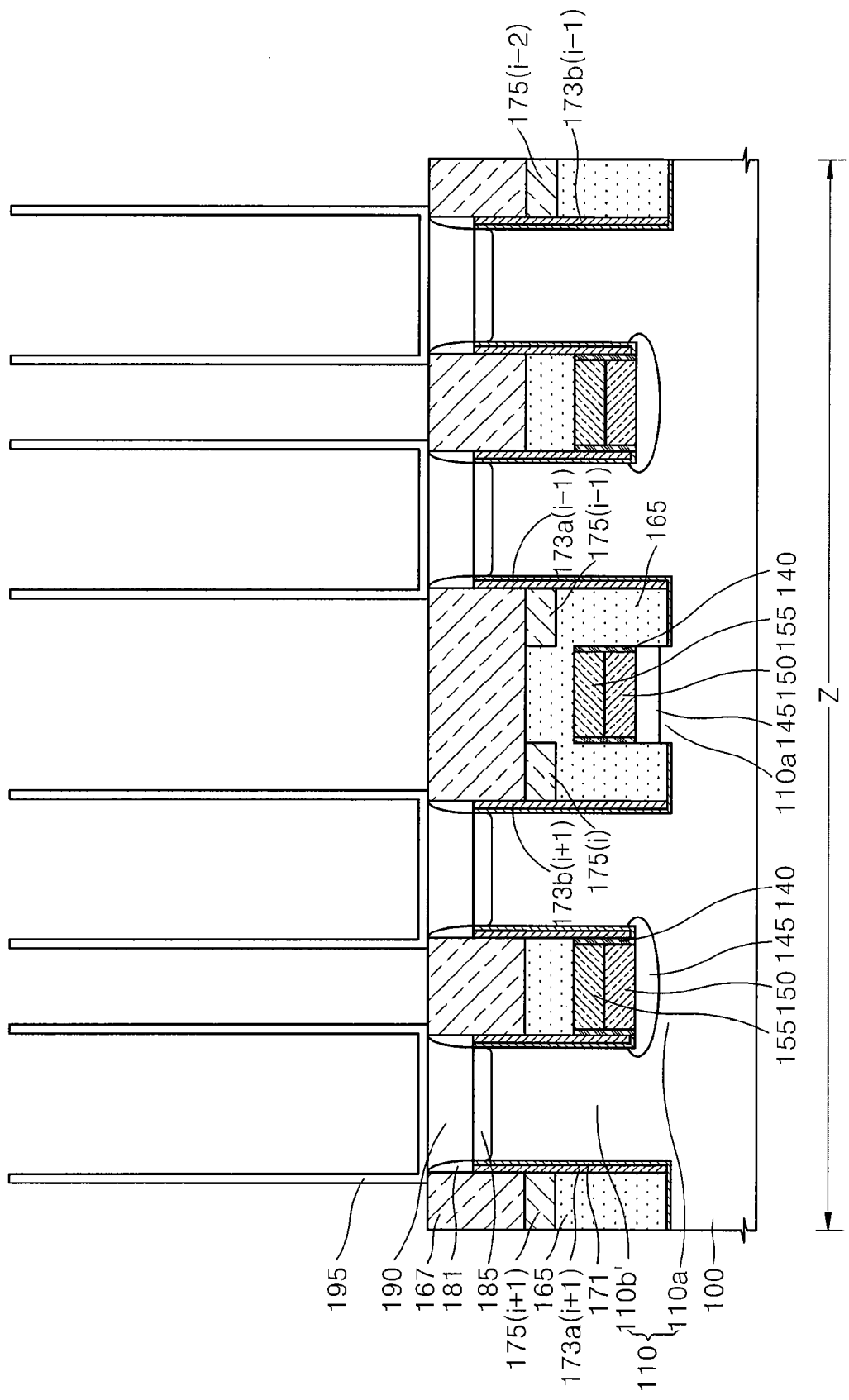
Figure 5A:
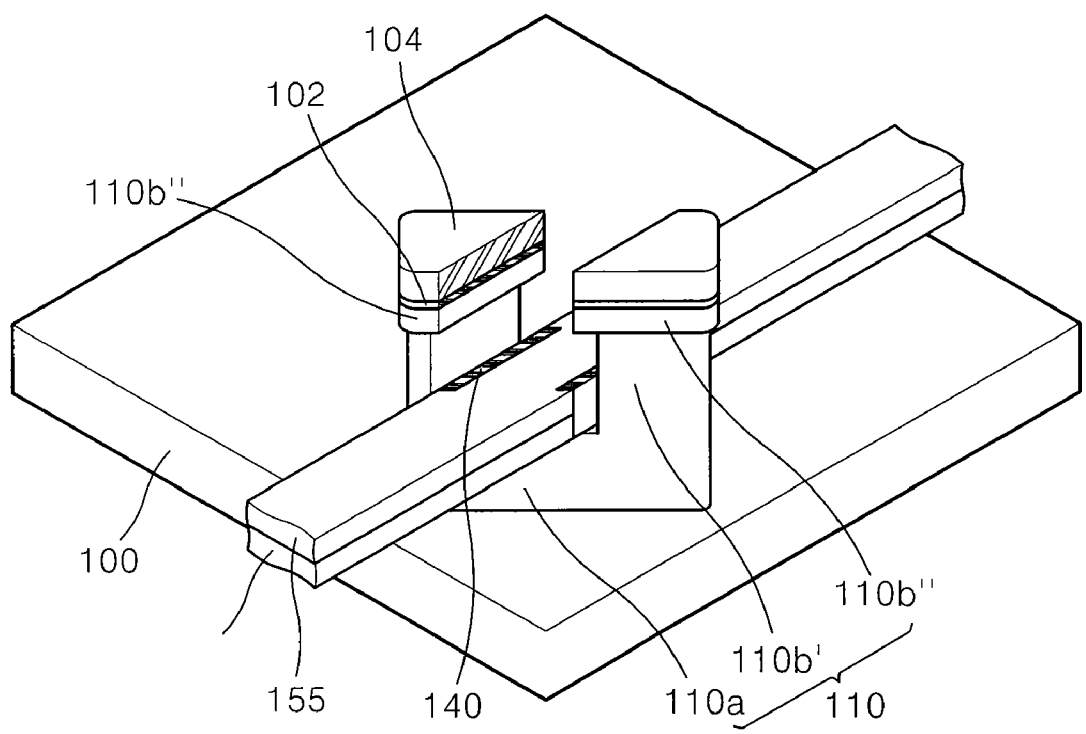
FIGS. 5A through 5D are perspective views illustrating a method of fabricating a semiconductor memory device with a vertical channel transistor according to another embodiment of the present invention.
Figure 5B:
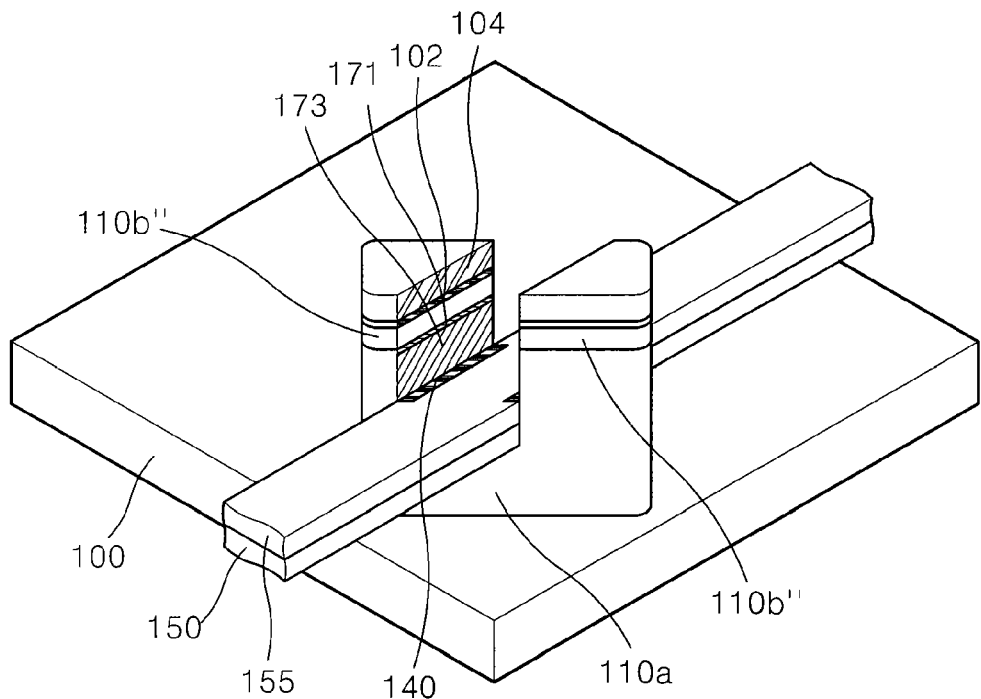
Figure 5C:
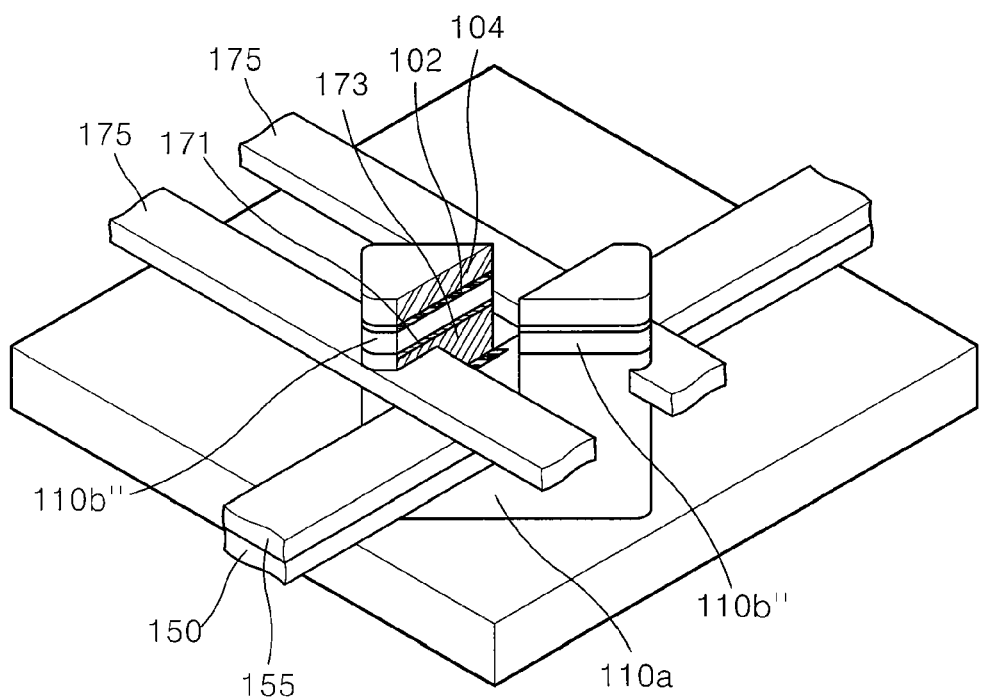
Figure 5D:
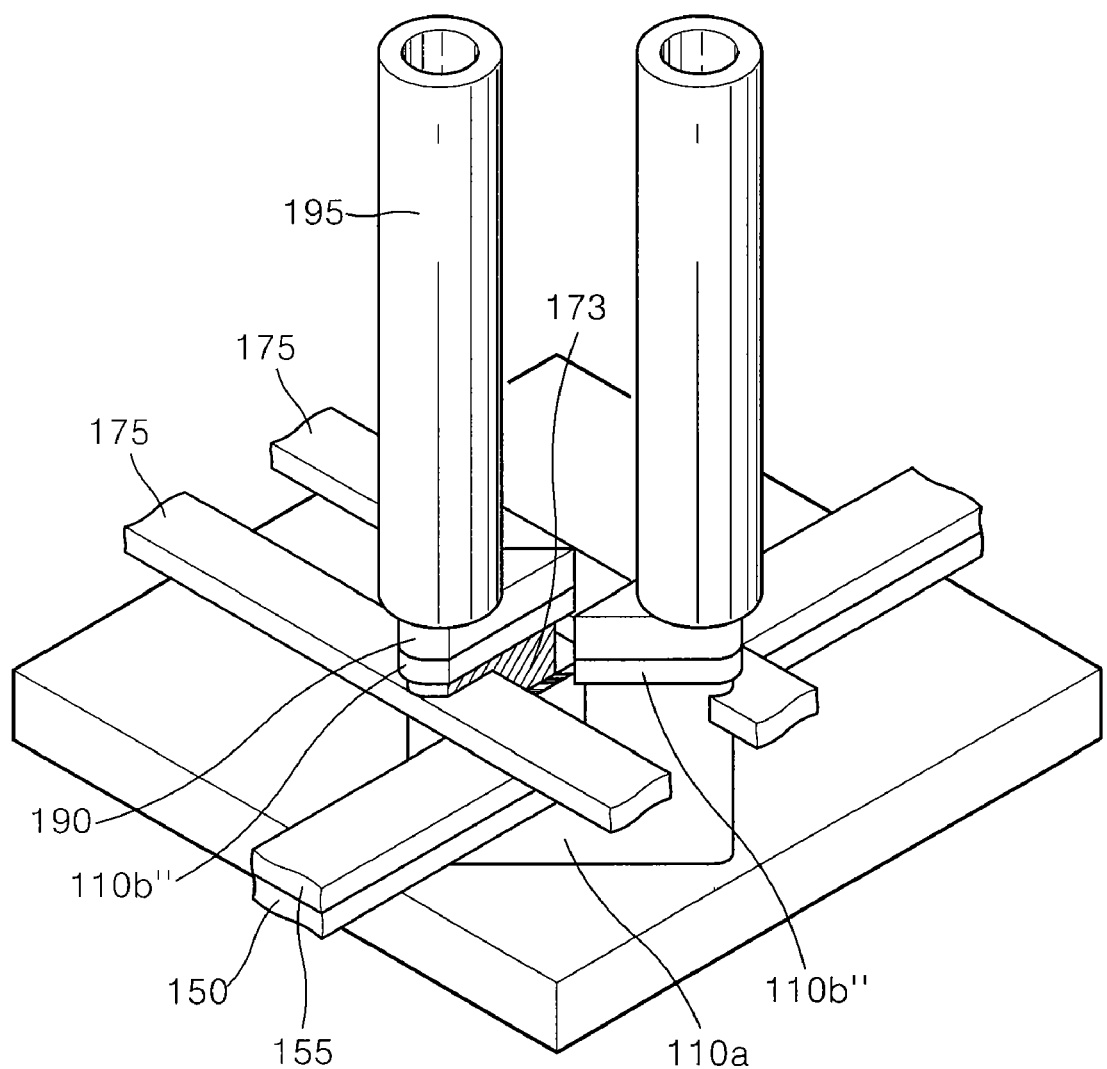

Referring to FIGS. 3N and 4N, an insulating layer is deposited on the resulting structure of the semiconductor substrate 100. The insulating layer is etched to expose the upper surface of the pillar portions 110b', thereby forming spacers 181 on the inner surfaces of the grooves 180. The spacer 181 may include a nitride layer. The spacer 181 isolates the gate electrode 173 from a storage node contact plug that will be subsequently formed. Dopants 184 with a predetermined conductivity type (i.e., the same conductivity type as the first doped region 145) are ion-implanted into the exposed upper surface of the pillar portion 110b', thereby forming a second doped region 185 in the upper surface of the pillar portion 110b'. The second doped region 185 is used as a source (or drain) region.

Figure 1G:
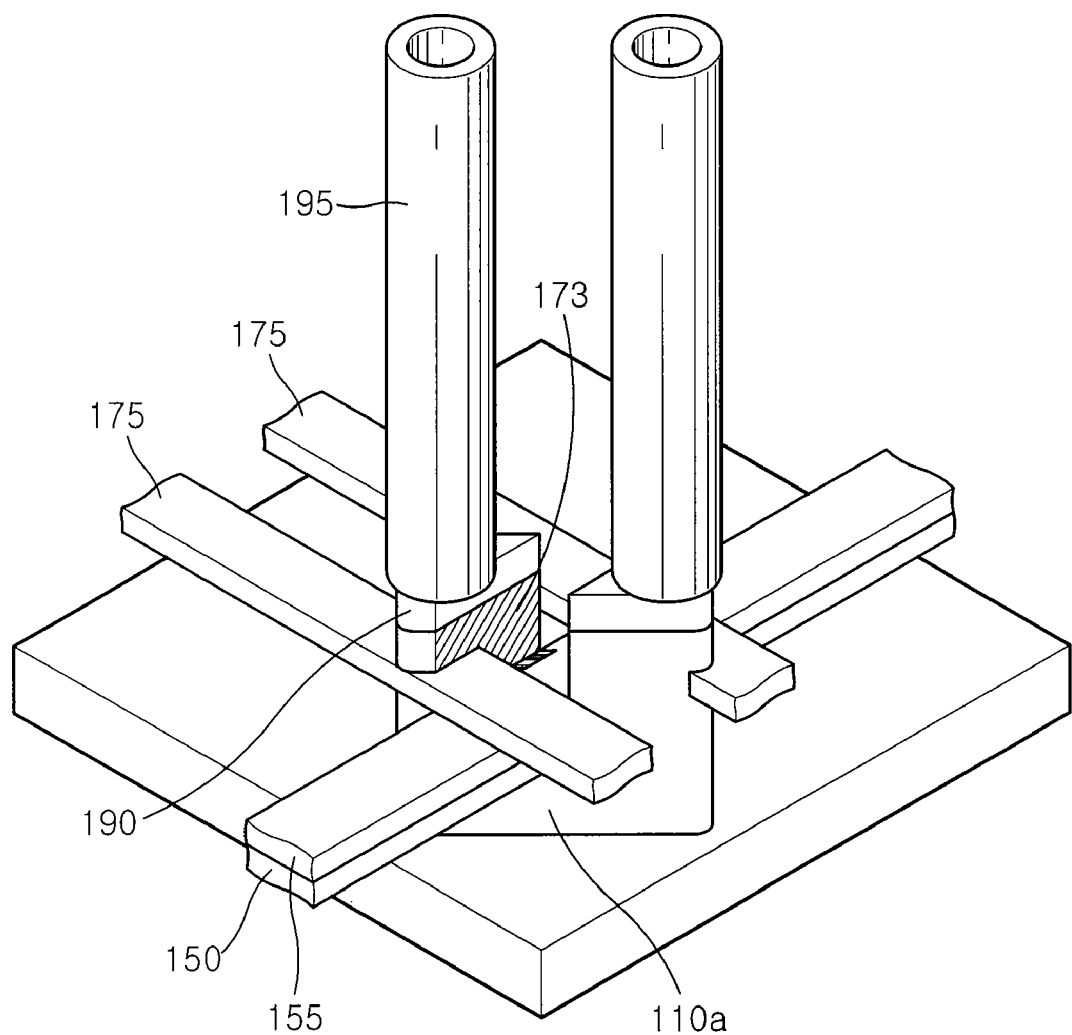

Referring to FIGS. 1G, 3O and 4O, a conductive layer is deposited on the fourth insulating layer 167 to completely fill the grooves 180. Thereafter, the conductive layer is etched back until the fourth insulating layer 167 is exposed, thereby forming storage node contact plugs 190 in the grooves 180. The contact plug 190 may include a polysilicon layer doped with dopants or a metal layer. Thereafter, a general capacitor process is performed to form a storage node electrode 195 connected to the storage node contact plug 190. The storage node electrode 195 may be a doped polysilicon layer, a titanium layer, a nickel layer, a titanium nitride layer, or a ruthenium layer. Thereafter, although not illustrated, a capacitor dielectric layer and a plate node electrode are formed to form a capacitor.

In the present semiconductor memory device, each pillar 110 includes the body portion 110a and a pair of pillar portions 110b' that extend from the body portion 110a and are separated from each other, and each pillar portion 110b' comprises one of a pair of memory cells. Each memory cell includes a vertical channel transistor formed at the pillar portion 110b' and a capacitor connected to the vertical channel transistor. The vertical channel transistor includes a drain (or source) region 145, a source (or drain) region 185, and a gate electrode 173 surrounding the pillar portion 110b'. A pair of the vertical channel transistors formed at a pair of the pillar portions 110b' shares the drain/source region 145, and the bitline 150 is electrically connected commonly to the drain/source regions 145 of adjacent transistors. The gate electrodes 173 of a pair of the vertical channel transistor are electrically connected to the different wordlines 175. That is, the gate electrodes 173 formed on the respective pillar portions 110b' are connected respectively to the neighboring wordlines.

Referring to FIG. 3O, the gate electrode 173 that surrounds the pillar includes a first portion 173-1 adjacent to the bitline 150 and a second portion 173-2 opposite the bitline 150. The second portion 173-2 is formed to be longer than the first portion 173-1 by the height "h" (see FIG. 3D) of the body portion 110a of the pillar 110, and thus functions as a back gate of the resulting transistor. The first portion 173-1 and the second portion 173-2 are referred to as an inner gate and an outer gate, respectively. In the case of a conventional vertical channel transistor, the inner gate of which is equal in length to its outer gate, when the conventional vertical channel transistor is turned off, a body floating phenomenon occurs because a discharge path of accumulated holes is not created. However, in the present invention, the outer gate 173-2 functions as a back gate when the vertical channel transistor is turned off. Accordingly, a substrate and a body portion of the vertical channel transistor maintain a P-type conducting state and are thus connected by the back gate. Therefore, the body floating phenomenon does not occur.

Figure 6A:
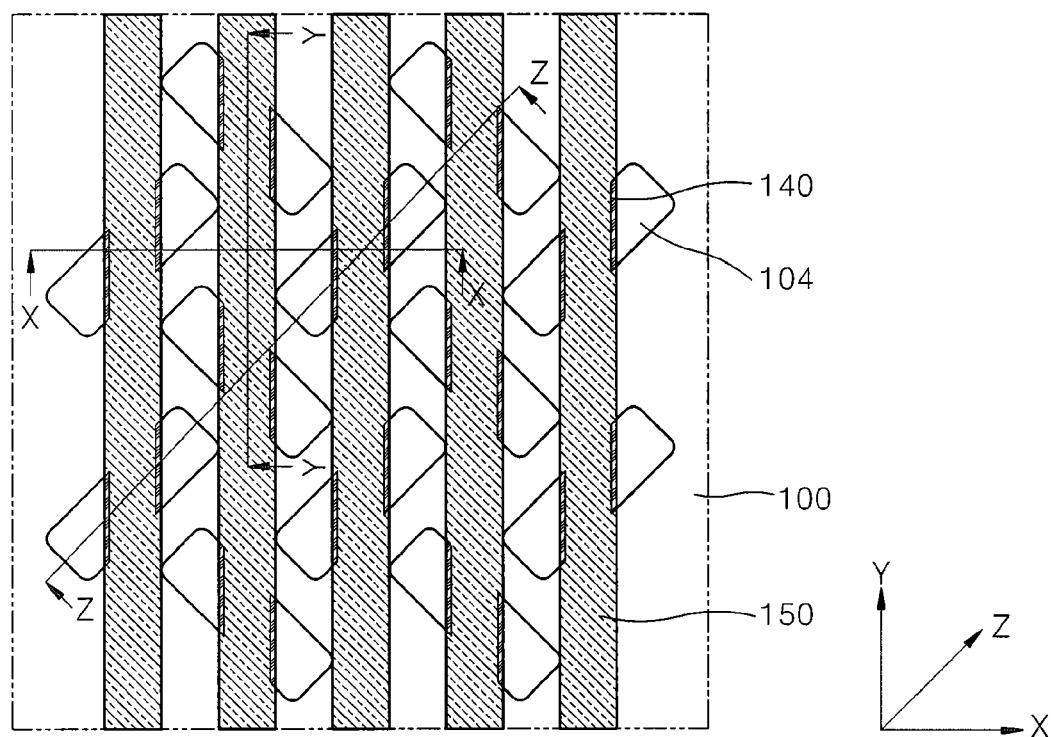
FIGS. 6A through 6C are plan views illustrating a method of fabricating a semiconductor memory device with a vertical channel transistor according to another embodiment of the present invention.
Figure 6B:
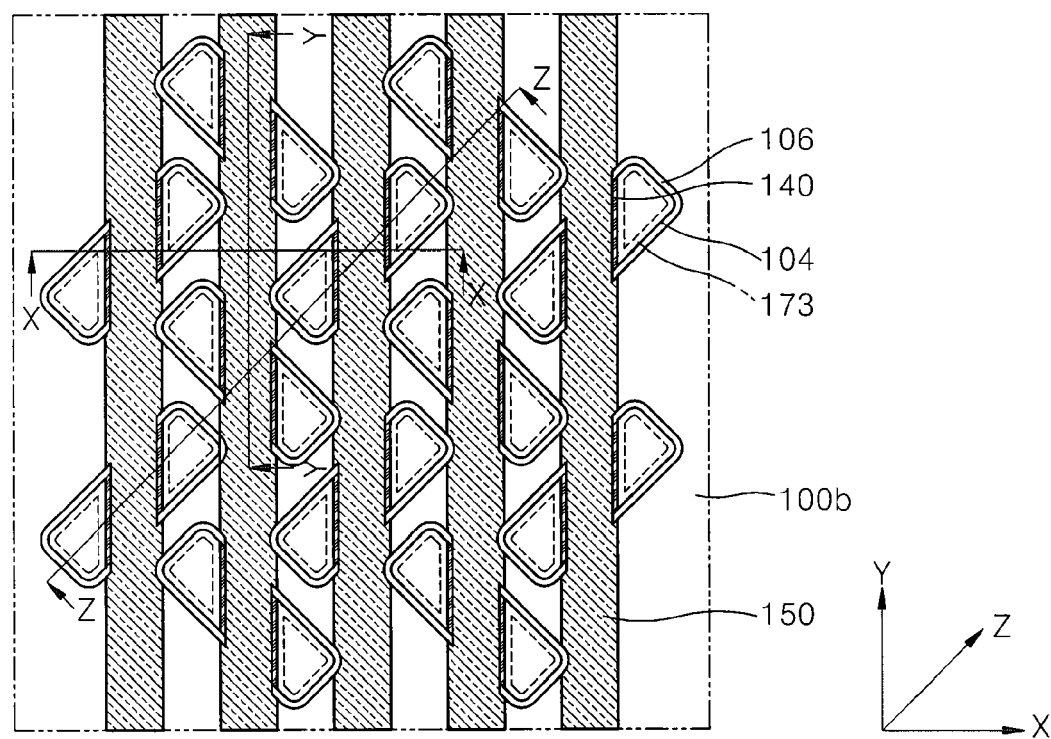
Figure 6C:
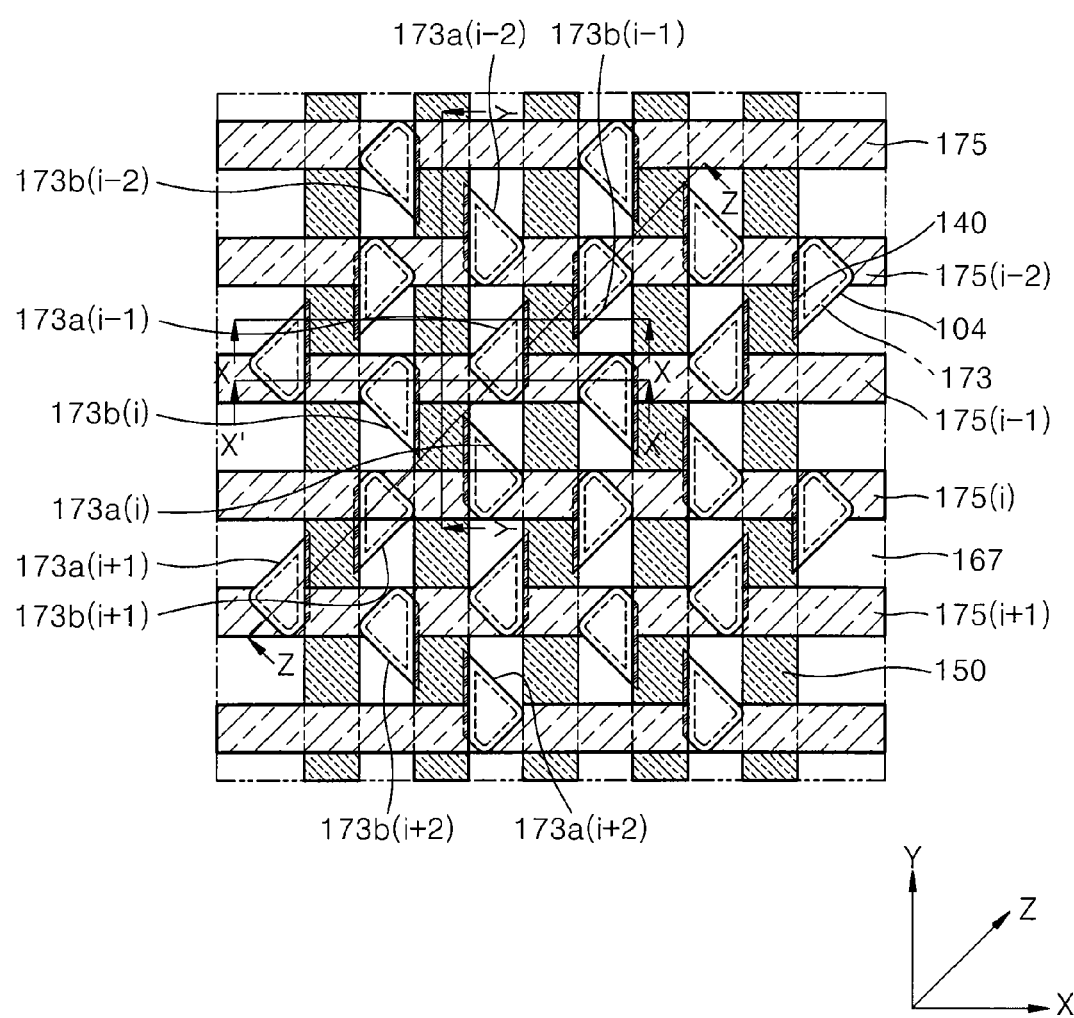
Figure 7B:
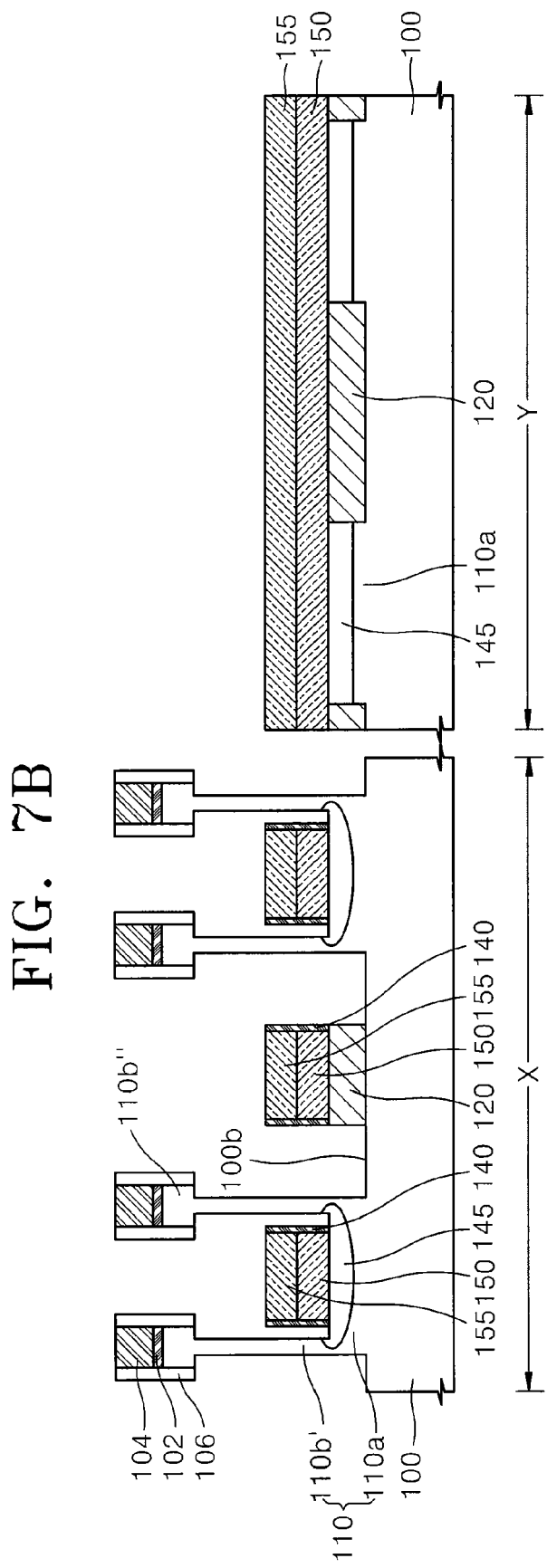
Figure 7F:
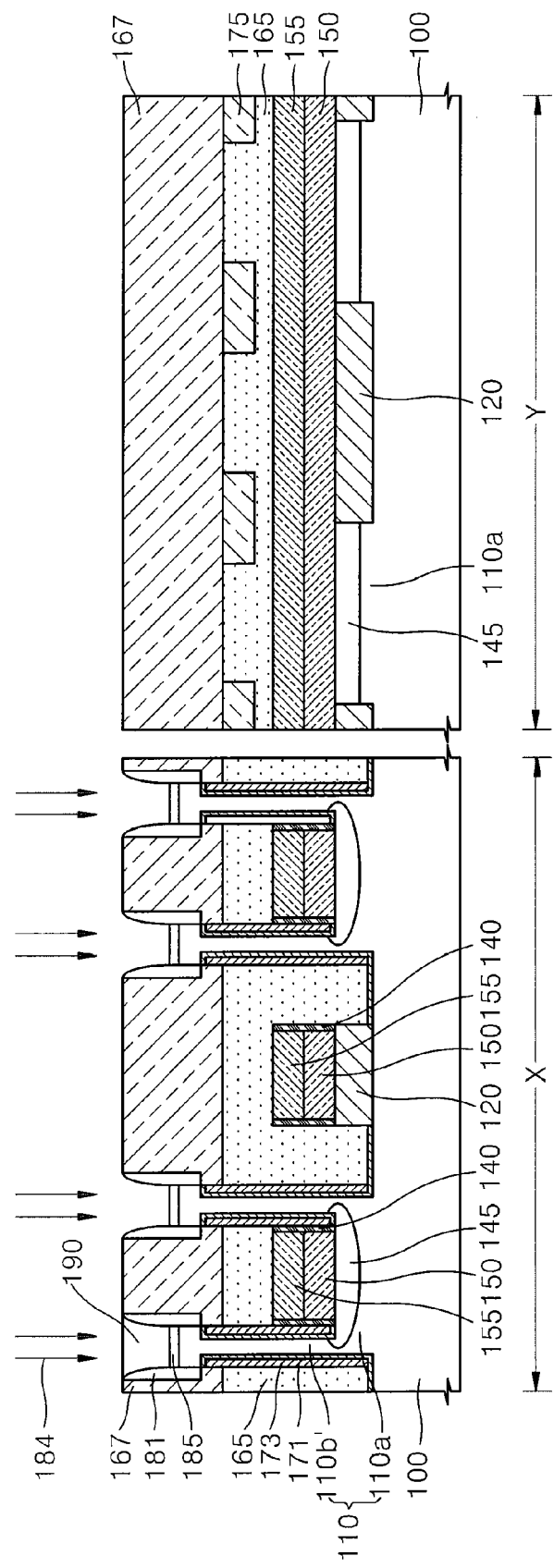
Figure 7G:
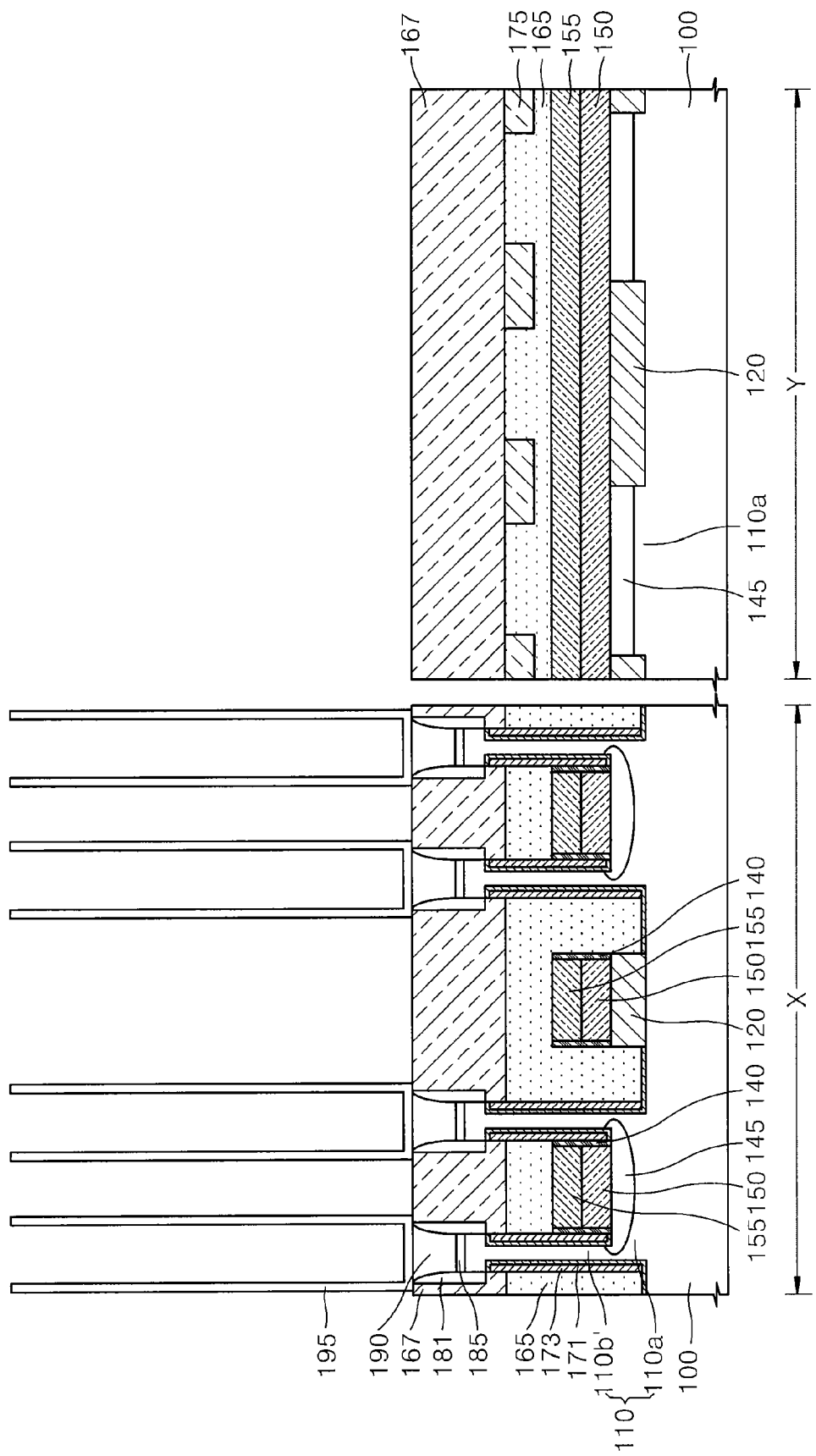
Figure 7H:
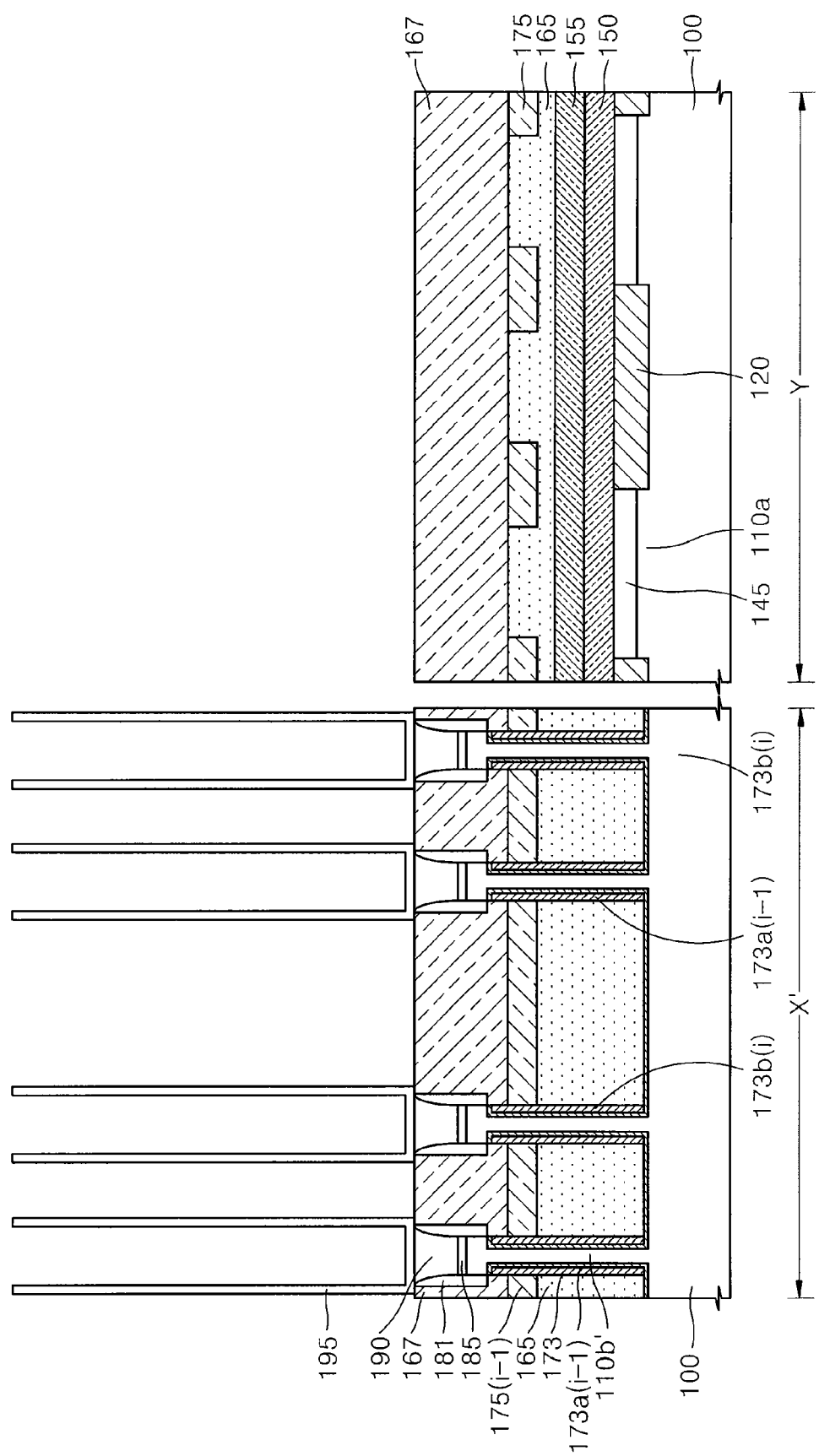
FIG. 7H is a sectional view taken along section lines X'-X' and Y-Y of FIG. 6C.
Figure 8E:
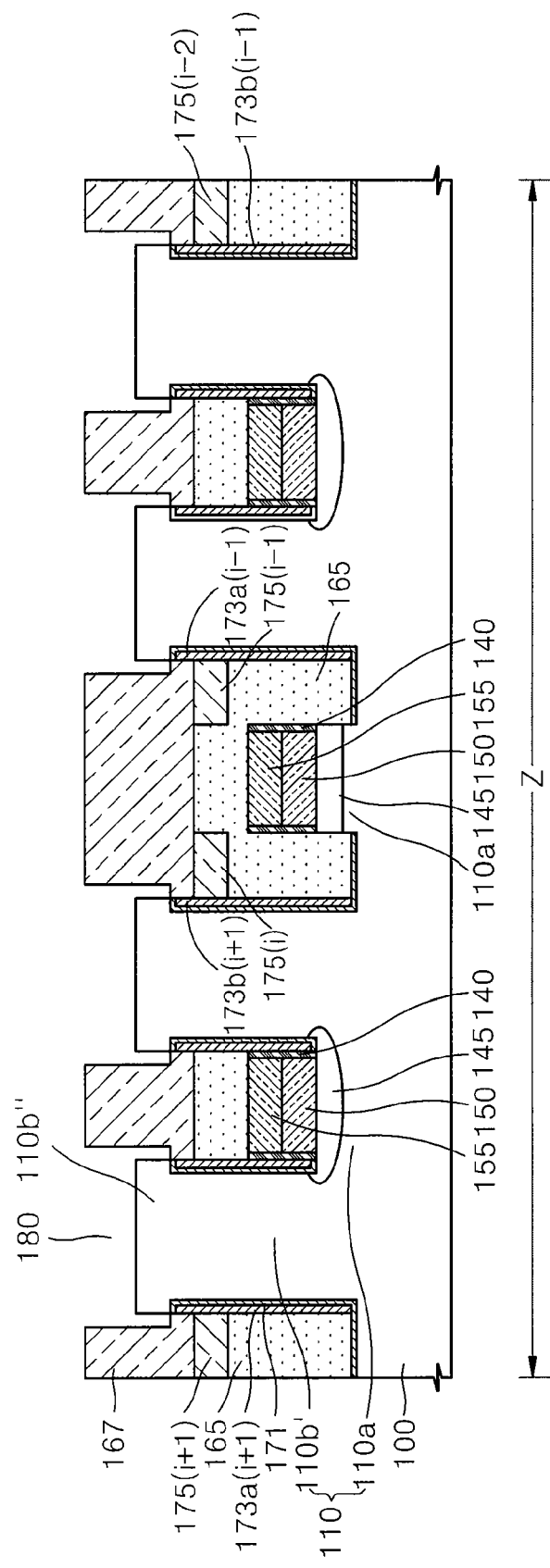
Figure 8F:
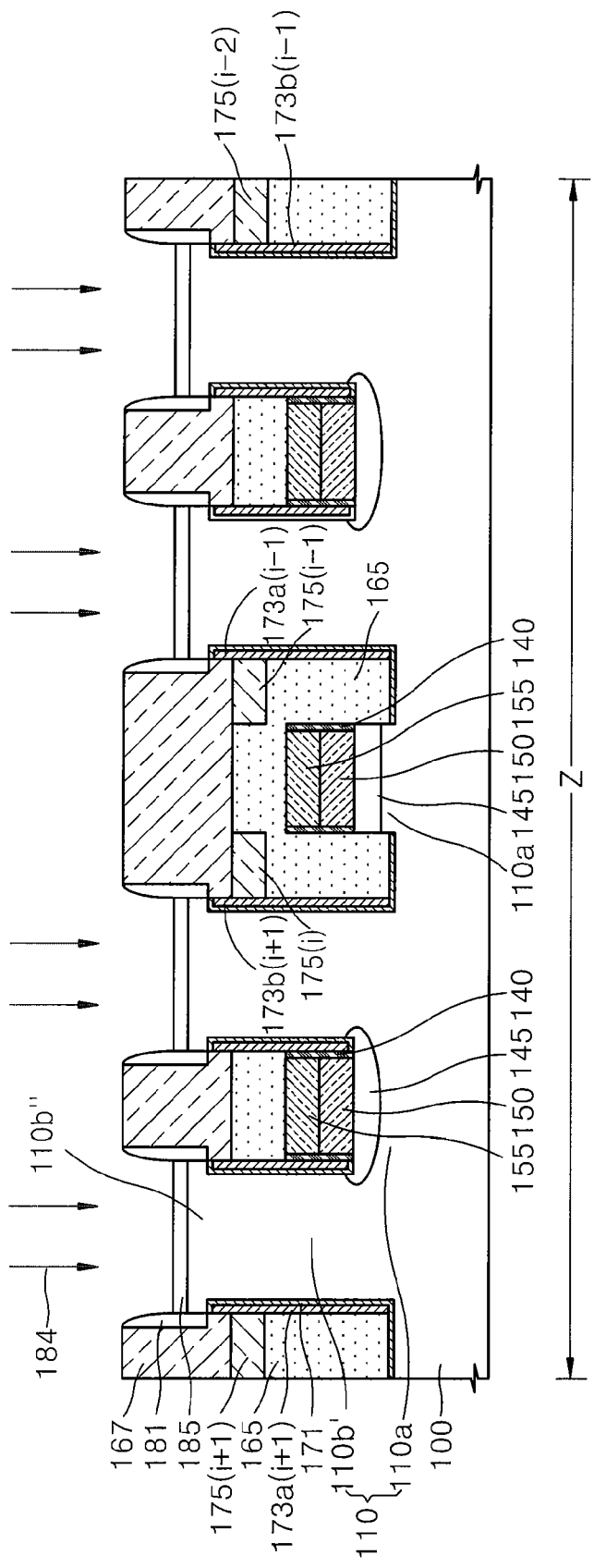
Figure 8G:
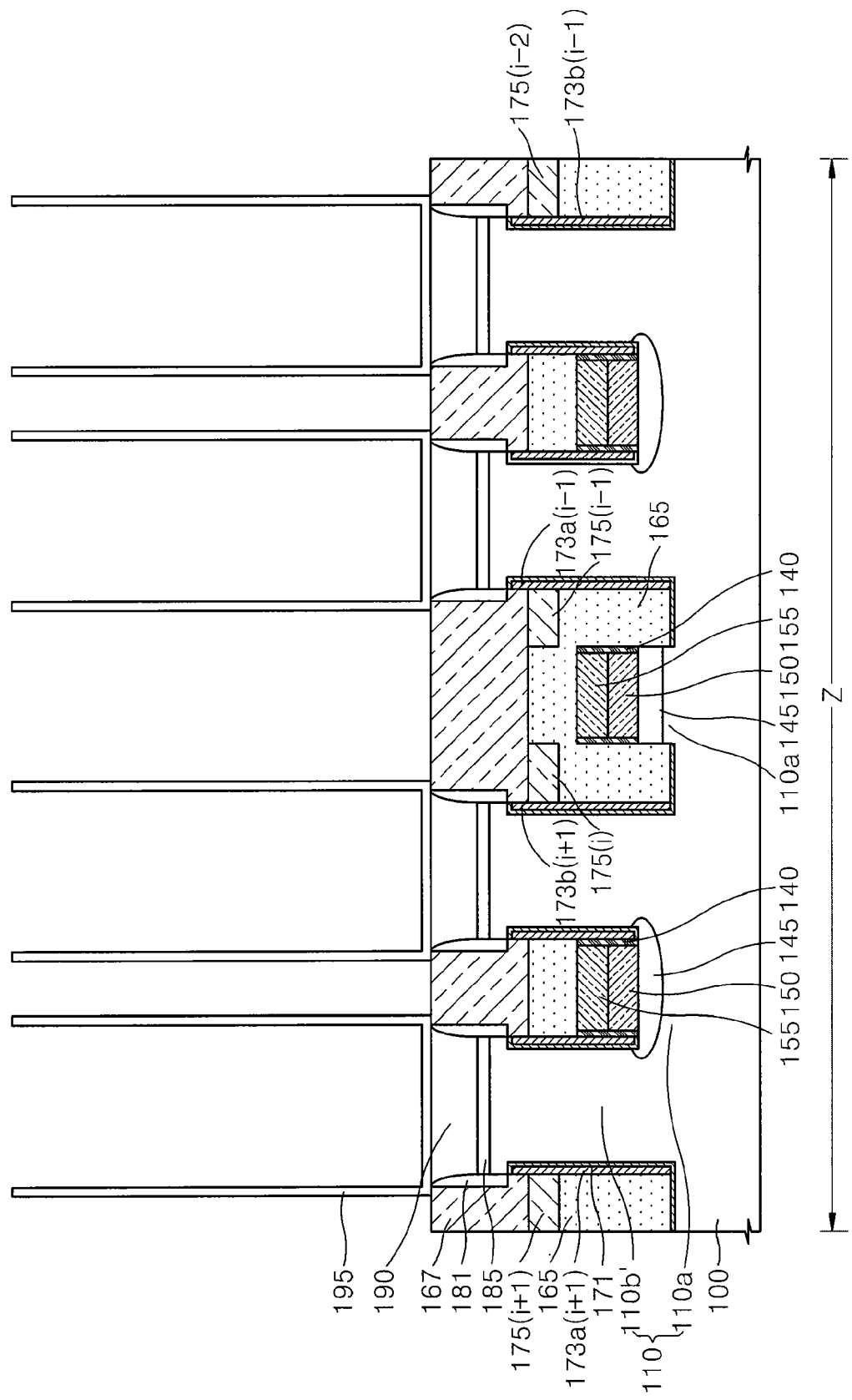

FIGS. 5A through 5D are perspective views illustrating a method of fabricating a semiconductor memory device with a vertical channel transistor according to another embodiment of the present invention. FIGS. 6A through 6C are plan views illustrating a method of fabricating a semiconductor memory device with a vertical channel transistor according to another embodiment of the present invention. FIGS. 7A through 7G are sectional views taken along section lines X-X and Y-Y of FIGS. 6A through 6C. Specifically, portions X and Y of FIGS. 7A through 7G are sectional views taken along section lines X-X and Y-Y of FIGS. 6A through 6C, respectively. FIG. 7H is a sectional view taken along section lines X'-X' and Y-Y of FIG. 6C. In FIG. 7H, a bitline structure is omitted. Specifically, portions X' and Y of FIG. 7H are sectional views taken along section lines X'-X' and Y-Y of FIG. 6C, respectively. FIGS. 8A through 8G are sectional views taken along a section line Z-Z of FIGS. 6A through 6C.

The present embodiment is substantially identical to the previous embodiment illustrated in FIGS. 1 through 4, with the exception that the pillar portion 110b' of the pillar 110 further includes a protrusion 110b". This difference will now be described in detail.

Referring to FIGS. 5A, 6A, 7A, 7B, 8A and 8B, like the previous embodiment, after formation of the second insulating layer 160, the first insulating layer 120 and the second insulating layer 160 are etched to predetermined thicknesses. These thicknesses are determined in accordance with the desired size of the protrusion 110b". Thereafter, an insulating layer is deposited on the resulting structure of the semiconductor substrate 100. The insulating layer is etched back to form spacers 106 on the sidewalls of the hard mask pattern 104, the pad oxide layer 102, and a portion of the pillar portion 110b'. The spacer 106 is formed of a material (e.g., a nitride) that has an etch selectivity with respect to the first and second insulating layers 120 and 160 but has no etch selectivity with respect to the hard mask pattern 104. The first and second insulating layers 120 and 160 are etched to expose the side surface of the pillar portion 110b'. The exposed side surface of the pillar portion 110b' is etched using the spacer 106, thereby forming the protrusion 110b" on the pillar portion 110b'.

Referring to FIGS. 5B, 6B, 6C, 7C through 7H and 8C through 8G, like the previous embodiment, the gate insulating layer 171 and the gate electrode 173 surrounding the side surface of the pillar portion 110b' are formed, the third insulating layer 165 with the trench 166 is formed on the resulting structure of the semiconductor substrate 100, and the wordline 175 electrically connected to the side surface of the gate electrode 173 is formed in the trench 166. The fourth insulating layer 167 is formed, and then the spacer 106, the hard mask pattern 104 and the pad oxide layer 102 are removed to form the groove 180. The spacer 181 is formed in a region of the groove 180 from which the spacer 106 is removed, the second doped region 185 is formed on the protrusion 110b" of the pillar portion 110b', and the storage node contact plug 190 and the storage node 195 are formed. in this embodiment, since the pillar portion 110b' includes the protrusion 110b", its contact margin and resistance with respect to the storage node electrode 195 can be improved.

As described above, the pillar includes a pair of independent pillar portions, the bitline penetrates a region between the pillar portions, and a pair of memory cells sharing the common drain/source region and the bitline is formed at the pillar portions. Accordingly, the memory cells can operate independently and can be efficiently disposed. Also, since the gate electrode has the structure of the back gate, holes/electrons accumulated in the body portion of the vertical channel transistor can be discharged to prevent the body floating phenomenon from occurring. Therefore, it is possible to sufficiently obtain relatively long retention time characteristics of the semiconductor memory device.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A semiconductor memory device comprising:
   a semiconductor substrate including a plurality of pillars arranged to be spaced apart from one another, each of the pillars including a body portion and a pair of pillar portions extending from the body portion and spaced apart from each other;
   a gate electrode surrounding each of the pillar portions;
   a bitline disposed on the body portion to penetrate a region between the pair of pillar portions of each of the pillars arranged to extend in a first direction;
   a wordline disposed over the bitline, arranged to extend in a second direction intersecting the first direction, and configured to contact the side surface of the gate electrode;
   a first doped region in the upper surface of each of the pillar portions of the pillars;
   a second doped region in the body portion of the pillars, between the pair of pillar portions, the second doped region being connected electrically to the bitline; and
   storage node electrodes connected electrically to the first doped region and disposed on each of the pillar portions.

2. The semiconductor memory device of claim 1, further comprising a gate dielectric layer between the gate electrode and the pillars.

3. The semiconductor memory device of claim 1, wherein first pillars arranged along a first line of the first or second direction are elongated in an upward-diagonal direction, second pillars arranged along a second line neighboring the first line are elongated in a downward-diagonal direction, and the second pillars are perpendicular to the first pillars.

4. The semiconductor memory device of claim 1, wherein the gate electrode comprises:
   a first portion adjacent to the bitline penetrating a pair of the pillar portions; and
   a second portion opposite the first portion,
     wherein the second portion is longer than the first portion in a direction of extension of the pillar.

5. The semiconductor memory device of claim 4, wherein the second portion is longer than the first portion by up to a height of the body portion.

6. The semiconductor memory device of claim 1, further comprising a contact plug disposed between the storage node electrode and the first doped region.

7. The semiconductor memory device of claim 1, wherein the gate electrode formed at one of a pair of the pillar portions of the first pillars arranged along the first line of the first direction and the gate electrode formed at one of a pair of the pillar portions of the second pillars arranged along the second line of the first direction are alternately connected to the wordline.

8. The semiconductor memory device of claim 1, wherein the wordline is spaced apart from the upper surface of the pillar portion by a predetermined distance to prevent an electrical short with the storage node electrode.

9. The semiconductor memory device of claim 8, further comprising:
   a first insulating layer on the semiconductor substrate to fill a space between the pillars;
   a second insulating layer on the first insulating layer to insulate the wordline from the bitline, the second insulating layer including a trench extending in the first direction; and
   a third insulating layer on the wordline and the second insulating layer,
   wherein the wordline is formed in the trench of the second insulating layer.

10. The semiconductor memory device of claim 1, further comprising:
    a bitline capping layer on the bitline; and
    a bitline spacer on the sidewalls of the bitline and the bitline capping layer to electrically separate the gate electrode from the bitline.

11. The semiconductor memory device of claim 1, wherein a portion of the pillar portion where the first doped region is formed, protrudes in a horizontal direction and thus each of the pillar portions of the pillar has a T-shaped cross-section.

12. A semiconductor memory device comprising:
    a semiconductor substrate including a plurality of pillars arranged spaced apart from one another, each of the pillars including a body portion and a pair of pillar portions extending from the body portion and spaced apart from each other;
    a pair of memory cells formed at the pillar portions of each of the pillars, each of memory cells including:
       a gate electrode surrounding each of the pillar portions;
       a first doped region in the upper surface of each of the pillar portions of the pillar;
       a second doped region in the body portion of the pillar between the pair of pillar portions; and
       a storage node electrode connected electrically to the first doped region and disposed on each of the pillar portions;
    a plurality of bitlines arranged on the body portion to penetrate a region between the pair of pillar portions of each of the pillars arranged to extend in a first direction; and
    a plurality of wordlines arranged to extend over the bitlines in a second direction intersecting the first direction, and configured to contact the side surface of the gate electrode.

13. The semiconductor memory device of claim 12, wherein the bitline is connected electrically to the second doped region.

14. The semiconductor memory device of claim 12, further comprising a gate dielectric layer between the gate electrode and the pillars.

15. The semiconductor memory device of claim 12, wherein first pillars arranged along a first line of the first or second direction are elongated in an upward-diagonal direction, second pillars arranged along a second line neighboring the first line are elongated in a downward-diagonal direction, and the second pillars are perpendicular to the first pillars.

16. The semiconductor memory device of claim 12, wherein the gate electrode comprises:
    a first portion adjacent to the bitline penetrating a pair of the pillar portions; and
    a second portion opposite the first portion,
    wherein the second portion is longer than the first portion in a direction of extension of the pillar.

17. The semiconductor memory device of claim 16, wherein the second portion is longer than the first portion by up to a height of the body portion.

18. The semiconductor memory device of claim 12, wherein the wordline is spaced apart from the upper surface of the pillar portion by a predetermined distance to prevent an electrical short with the storage node electrode.

19. The semiconductor memory device of claim 12, further comprising a contact plug disposed between the storage node electrode and the first doped region.

20. The semiconductor memory device of claim 13, wherein the gate electrodes of a pair of the memory cells are connected to different wordlines.

21. The semiconductor memory device of claim 20, wherein the gate electrode formed at one of a pair of the pillar portions of the first pillars arranged in the first line of the first direction and the gate electrode formed at one of a pair of the pillar portions of the second pillars arranged in the second line of the first direction are alternately connected to the wordline.

22. The semiconductor memory device of claim 12, wherein the second doped region functions as a common drain region or a common source region of a pair of the memory cells, and the bitline electrically contacts the second doped region to function as a common bitline of a pair of the memory cells.

23. The semiconductor memory device of claim 12, wherein a portion of the pillar portion where the first doped region is formed, protrudes in a horizontal direction and thus each of the pillar portions of the pillar has a T-shaped cross-section.

* * * * *